United States Patent
Steege

(10) Patent No.: US 11,241,827 B2
(45) Date of Patent: Feb. 8, 2022

(54) METHOD AND APPARATUS FOR SOLID FREEFORM FABRICATION OF OBJECTS WITH IMPROVED RESOLUTION

(71) Applicant: Trio Labs, Inc., Research Triangle Park, NC (US)

(72) Inventor: Adam T. C. Steege, Durham, NC (US)

(73) Assignee: TRIO LABS, INC., Morrisville, NC (US)

(*) Notice: Subject to any disclaimer, the term of this patent is extended or adjusted under 35 U.S.C. 154(b) by 144 days.

(21) Appl. No.: 15/568,738

(22) PCT Filed: Apr. 7, 2016

(86) PCT No.: PCT/US2016/026510
§ 371 (c)(1),
(2) Date: Oct. 23, 2017

(87) PCT Pub. No.: WO2016/164629
PCT Pub. Date: Oct. 13, 2016

(65) Prior Publication Data
US 2018/0141270 A1      May 24, 2018

Related U.S. Application Data

(60) Provisional application No. 62/144,016, filed on Apr. 7, 2015.

(51) Int. Cl.
*B29C 64/165* (2017.01)
*B29C 64/277* (2017.01)
(Continued)

(52) U.S. Cl.
CPC .......... *B29C 64/165* (2017.08); *B29C 64/214* (2017.08); *B29C 64/218* (2017.08);
(Continued)

(58) Field of Classification Search
CPC ..... B29C 64/214; F26B 17/286; B33Y 40/00; B22F 10/16
See application file for complete search history.

(56) References Cited

U.S. PATENT DOCUMENTS

| 4,844,144 A | 7/1989 | Murphy et al. |
| 4,938,816 A | 7/1990 | Beaman et al. |

(Continued)

FOREIGN PATENT DOCUMENTS

| CN | 101024307 | * 1/2007 | ............. B29C 67/00 |
| CN | 101024307 A | 8/2007 | |

(Continued)

OTHER PUBLICATIONS

CN101024307 (Zhao) Jan. 2007 (online machine translation), [Retrieved on Dec. 3, 2019]. Retrieved from: Espacenet (Year: 2007).*

(Continued)

*Primary Examiner* — Alison L Hindenlang
*Assistant Examiner* — Andrés E. Behrens, Jr.
(74) *Attorney, Agent, or Firm* — Orrick, Herrington & Sutcliffe LLP

(57) ABSTRACT

A fabrication device includes a build surface for production of a 3-dimensional solid component, a material delivery system configured to deposit one or more build materials on the build surface, at least one of the one or more build materials being a photocurable material, a first imaging component having a first resolution, and a second imaging component having a second resolution different from the first resolution. In this configuration, the first imaging component and the second imaging component are operable individually and in combination together to selectively irradiate the photocurable material to at least partially solidify successive layers of the 3-dimensional solid component In one example, the lower resolution imaging component (Continued)

solidifies bulk interior regions and the higher resolution component solidifies detailed borders.

13 Claims, 60 Drawing Sheets

(51) Int. Cl.

| | | |
|---|---|---|
| *B29C 64/214* | (2017.01) | |
| *B29C 64/218* | (2017.01) | |
| *B29C 64/329* | (2017.01) | |
| *B33Y 10/00* | (2015.01) | |
| *B33Y 30/00* | (2015.01) | |
| *G03F 7/037* | (2006.01) | |
| *G03F 7/00* | (2006.01) | |
| *B29C 35/08* | (2006.01) | |

(52) U.S. Cl.
CPC .......... *B29C 64/277* (2017.08); *B29C 64/329* (2017.08); *B33Y 10/00* (2014.12); *B33Y 30/00* (2014.12); *G03F 7/0037* (2013.01); *B29C 2035/0838* (2013.01)

(56) References Cited

U.S. PATENT DOCUMENTS

| | | | |
|---|---|---|---|
| 5,121,329 A | 6/1992 | Crump | |
| 5,184,307 A | 2/1993 | Hull et al. | |
| 5,204,055 A * | 4/1993 | Sachs ...................... | B05C 19/04 419/2 |
| 5,238,614 A * | 8/1993 | Uchinono ............. | B29C 64/135 264/401 |
| 5,262,887 A | 11/1993 | Feinberg | |
| 5,352,405 A | 10/1994 | Beaman et al. | |
| 5,503,785 A | 4/1996 | Crump et al. | |
| 5,626,919 A * | 5/1997 | Chapman ............... | B33Y 40/00 427/510 |
| 5,807,437 A * | 9/1998 | Sachs ...................... | B05C 19/04 118/688 |
| 5,900,207 A | 5/1999 | Danforth et al. | |
| 5,923,359 A | 7/1999 | Montgomery | |
| 6,117,612 A | 9/2000 | Halloran et al. | |
| 6,238,614 B1 | 5/2001 | Yang et al. | |
| 6,596,224 B1 * | 7/2003 | Sachs ................... | B29C 41/003 419/6 |
| 7,120,512 B2 * | 10/2006 | Kramer ................. | B29C 64/165 700/119 |
| 7,758,329 B2 | 7/2010 | Kihara et al. | |
| 8,094,355 B2 | 1/2012 | Gollier | |
| 9,566,601 B2 * | 2/2017 | Fuerst ....................... | B05C 3/18 |
| 10,695,954 B2 * | 6/2020 | Hochsmann .......... | B29C 64/236 |
| 2001/0050448 A1 | 12/2001 | Kubo ...................... | B33Y 30/00 264/308 |
| 2002/0020945 A1 * | 2/2002 | Cho ...................... | B29C 64/165 264/460 |
| 2002/0093115 A1 | 7/2002 | Jang et al. | |
| 2002/0149137 A1 | 10/2002 | Jang et al. | |
| 2003/0173713 A1 * | 9/2003 | Huang ................... | G03F 7/0037 264/401 |
| 2005/0079086 A1 | 4/2005 | Farr et al. | |
| 2005/0263934 A1 * | 12/2005 | Chung .................. | B29C 64/153 264/113 |
| 2009/0148813 A1 | 6/2009 | Sun et al. | |
| 2010/0125356 A1 * | 5/2010 | Shkolnik .................. | G06T 1/00 700/98 |
| 2013/0329257 A1 | 12/2013 | Pettis et al. | |
| 2014/0154629 A1 | 6/2014 | Kinebuchi | |
| 2014/0255666 A1 | 9/2014 | Stucker et al. | |
| 2015/0190965 A1 * | 7/2015 | Okamoto ............. | C09D 11/101 428/195.1 |
| 2015/0273766 A1 * | 10/2015 | Denda ................... | B29C 64/165 264/483 |
| 2015/0343760 A1 * | 12/2015 | Byrne ....................... | B41F 7/00 101/483 |
| 2016/0325496 A1 * | 11/2016 | De Pena ................. | B29C 64/40 |

FOREIGN PATENT DOCUMENTS

| | | | | |
|---|---|---|---|---|
| CN | 107614229 A | | 1/2018 | |
| DE | 19853834 A1 * | | 5/2000 | .............. B22C 9/00 |
| EP | 0354637 A2 | | 2/1990 | |
| EP | 3280579 A | | 2/2018 | |
| JP | 2005-120475 A | | 4/2005 | |
| WO | WO 1998/006560 A1 | | 2/1998 | |
| WO | WO 1998/041944 A1 | | 9/1998 | |
| WO | WO 2012/140658 A2 | | 10/2012 | |

OTHER PUBLICATIONS

"Hybrid Film Applicator: Doctor Blade (100mm) + Slot Die (50mm) Heads—EQ-HDS-100." MTI Corp—Leading Provider of Lab Equipments and Advanced Crystal Substrates, Sep. 19, 2012, www.mtixtl.com/EQ-HDS-100.aspx. (Year: 2012).*
DE19853834 (Kudernatsch) Nov. 1998 (online machine translation), [Retrieved on May 3, 2021]. Retrieved from: Espacenet (Year: 1998).*
Vietnamese Office Action for Application No. 1-2017-04412 dated Jan. 13, 2018.
Notice of Publication for EP Application No. 16777308.4dated Jan. 1, 2017.
Notice of Publication for CN Application No. 201680026682.0 dated Jan. 31, 2018.
IPRP with International Search Report and Written Opinion for Application No. PCT/US2016/026510 dated Oct. 10, 2017.
Extended European Search Report for Application No. 16777308.4 dated Nov. 19, 2018.
First Chinese Office Action for Application No. 201680026682.0 dated Feb. 1, 2019.
Chinese Office Action for Application No. 201680026682.0 dated Sep. 17, 2019.
European Office Action for Application No. 16777308.4 dated Feb. 3, 2020.
Brazilian Office Action for Application No. BR112017021657-4 dated Feb. 10, 2020.
IN, Examination Report, Application No. 201717038913, dated Mar. 20, 2020.
JP, Office Action, Application No. 2018-503738, dated Apr. 21, 2020.
EP, Communication pursuant to Article 94(3) EPC, Application No. 16 777 308.4, dated Mar. 19, 2021.
VN, Substantive Examination Results, Application No. 1-2017-04412, dated Jul. 30, 2021.

* cited by examiner

METHOD AND APPARATUS FOR SOLID FREEFORM FABRICATION OF OBJECTS WITH IMPROVED RESOLUTION

PRIORITY CLAIM

The present application claims the benefit of U.S. Provisional Patent Application Ser. No. 62/144,016, filed Apr. 7, 2015, the disclosure of which is incorporated herein by reference in its entirety.

TECHNICAL FIELD

The subject matter described herein generally relates to devices and methods for the solid freeform fabrication of objects from metal, plastic, ceramic, and composite materials comprising combinations of one or more types of material.

BACKGROUND

Additive manufacturing (AM), also known as solid freeform fabrication (SFF), 3D printing (3DP), direct digital manufacturing (DDM), and solid imaging, has increasingly become a widely adopted method of prototyping both visually demonstrative and functional parts. In some instances, this has become a cost effective means for production manufacturing as well. A wide variety of means for producing components based on digital models exist, and all have reduced the time and cost required for a complete design cycle, which has improved the pace of innovation in many industries.

Generally, SFF is accomplished in a layerwise fashion, where a digital model is split into horizontal slices, and each slice is produced as a 2D image on a build surface. The sequential fabrication of these slices produces an aggregate collection of thin layers which collectively compose the 3 dimensional object represented by the digital model. In contrast to traditional fabrication techniques, such as Computer Numerically Controlled (CNC) machining, injection molding, and other means, SFF has markedly reduced production time and cost, and as such has been widely adopted for research and development purposes where low volume production with traditional means would be exceedingly expensive. Additionally, SFF devices generally require less expertise to operate when compared to CNC machines. The cost of individual parts produced from CNC machines is generally higher, owing to longer setup times and higher costs of machine operation. CNC-produced parts will often have stronger and more detailed features than SFF-produced parts, which may make them desirable for some applications. Until SFF techniques can produce parts with the resolution and functionality of CNC-produced parts, the usage of SFF in part production will remain constrained.

Some of the most common techniques for SFF include stereolithography (SLA), selective deposition modeling (SDM), fused deposition modeling (FDM), and selective laser sintering (SLS). These approaches vary in the type of materials they can use, the manner in which layers are created, and the subsequent resolution and quality of parts produced. Typically, layers are produced in a bulk material deposition method, or in a selective material deposition method. In techniques that employ a bulk deposition method for layer production, layer imaging is typically accomplished by a thermal, chemical, or an optical process.

SUMMARY OF THE INVENTION

Embodiments of a device for solid freeform fabrication and associated methods are herein disclosed for the production of plastic, metal, and ceramic parts for a variety of applications.

The SFF device disclosed herein may include a surface for receiving layers of material for production of a 3-dimensional solid representation of a digital model, a component or components for depositing the required layers of build material, and a component or components for imaging the build material into cross sections representative of data contained in a digital model. In particular, in some embodiments, the build material is composed of a particulate material and a photocurable resin material, deposited sequentially in any order. The combination of these materials at the build surface overcomes the rheological constraints of aforementioned devices which have been used to produce powder composite parts. Furthermore, in some embodiments, imaging techniques utilized for layer imaging may involve a combination of coarse bulk imaging and higher resolution detailed imaging techniques to improve imaging speed while maintaining image resolution.

The device described below may utilize any of a variety of particulate materials, including but not limited to ceramics, plastics, or metals, as one of the build materials. Parts produced from this device may be treated after the build process is complete to facilitate bonding between adjacent particles. Such treatment includes but is not limited to thermal, chemical, and pressure treatment, and combinations of these. The results of this fabrication and treatment process include but are not limited to solid metal parts, solid ceramic parts, porous metal parts, porous ceramic parts, solid composite plastic parts, and composite parts comprising one or more types of material.

Material deposition of particulate material may be achieved through several means, including but not limited to spreading via a blade mechanism, electrostatic deposition on a transfer surface followed by deposition to a build surface, and electrostatic deposition to a compressing roller followed by deposition to the build surface. Likewise, material deposition of photocurable resin may be achieved through several means, including but not limited to droplet deposition from an inkjet printhead, ejection of resin onto a blade device used for leveling particulate material and infusion of particulate material with resin material, ejection of resin onto a roller device used for infusion of resin into particulate material, and transfer of resin from a reservoir onto a transfer mechanism, such as a brush, sponge, or film, which subsequently deposits resin onto a deposition mechanism, such as a roller or blade device, followed by deposition of the resin material at the build surface. Material deposition and combination may occur at the build surface, or within any of the aforementioned material deposition devices, such as rollers and blades, such that the net result is the production of a layer of particulate material infused with a photocurable resin.

Layer imaging may be achieved through several means, including but not limited to bulk imaging with a programmable planar light source, such as a DLP projector, possibly coupled with the vectoring motion of a high resolution laser light source for imaging details, and bulk imaging with a rastering laser source with a larger beam diameter than a secondary laser light source used for detailed imaging. Such imaging techniques may generally follow the processing of data representative of a three dimensional object by slicing the object into layers, deriving data representative of border portions of the layer data and data representative of the interior portions of the layer data, and using the interior portion data for bulk imaging, and using the border portion data for detailed imaging.

Further, in one aspect a solid freeform fabrication device is provided such that composite objects composed of particulate material and resin material may be produced from digital data representative of a given three dimensional object.

In another aspect, a SFF device is provided which utilizes bulk deposition techniques for production of layers of material.

In another aspect, a SFF device is provided which combines particulate material with photocurable resin material for production of composite layers of material.

In another aspect, a SFF device is provided which allows for interchangeability of material components to enable the use of a wide variety of material combinations.

In another aspect, a SFF device is provided which separately images large interior areas of an image and detailed borders of an image.

In another aspect, a SFF device is provided which cures regions of material exterior to regions specific to an object being built, such that some or all of these regions are not in direct contact with the object being built, but still serve to limit the effects of forces caused by the build process on the object being built in order to preserve the fidelity of the object being built to digital data representative of the object.

In another aspect, objects produced from an SFF device may be treated thermally, chemically, or mechanically to improve internal adhesion of material components.

In another aspect, treatment may include pressurization in a fluid chamber, exposure to a solvent, elevation of temperature to facilitate bonding of particulate material, elevation of temperature to relieve internal stresses derived from the build process, or partial sintering of particulate material followed by infusion with a tertiary material, which may include a ceramic and/or metal material with a lower melting point than the primary particulate material.

Although some of the aspects of the subject matter disclosed herein have been stated hereinabove, and which are achieved in whole or in part by the presently disclosed subject matter, further features will become more readily apparent from the following detailed description of the presently disclosed subject matter taken in conjunction with the accompanying drawings.

BRIEF DESCRIPTION OF THE DRAWINGS

Embodiments of the presently disclosed subject matter will be described hereinbelow with reference to the drawings, wherein.

DETAILED DESCRIPTION OF THE DRAWINGS

Figure 1:
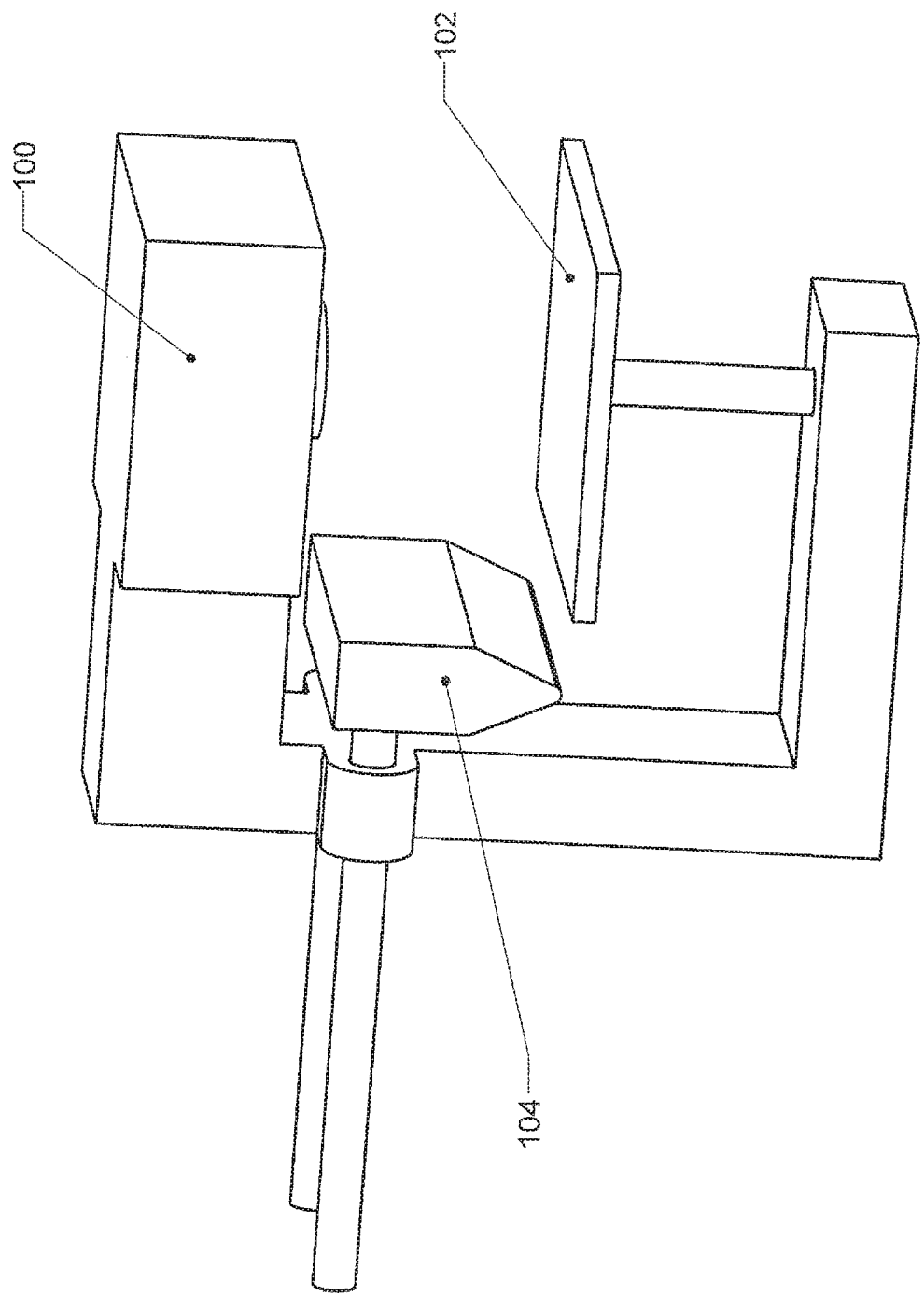
FIG. 1 is a left perspective view of a SFF device according to an embodiment of the presently disclosed subject matter in a first operating position.
Figure 2:
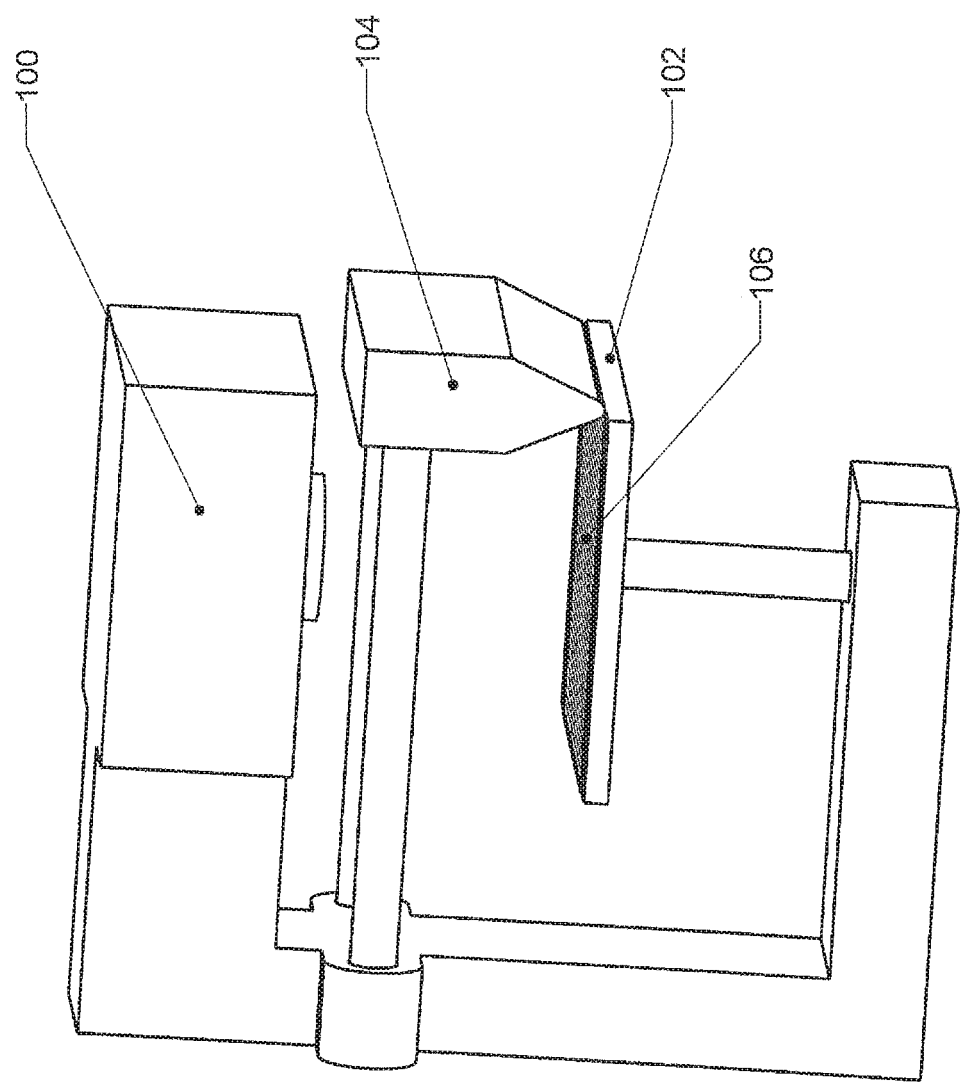
FIG. 2 is a left perspective view of the SFF device of FIG. 1 in a second operating position.
Figure 3:
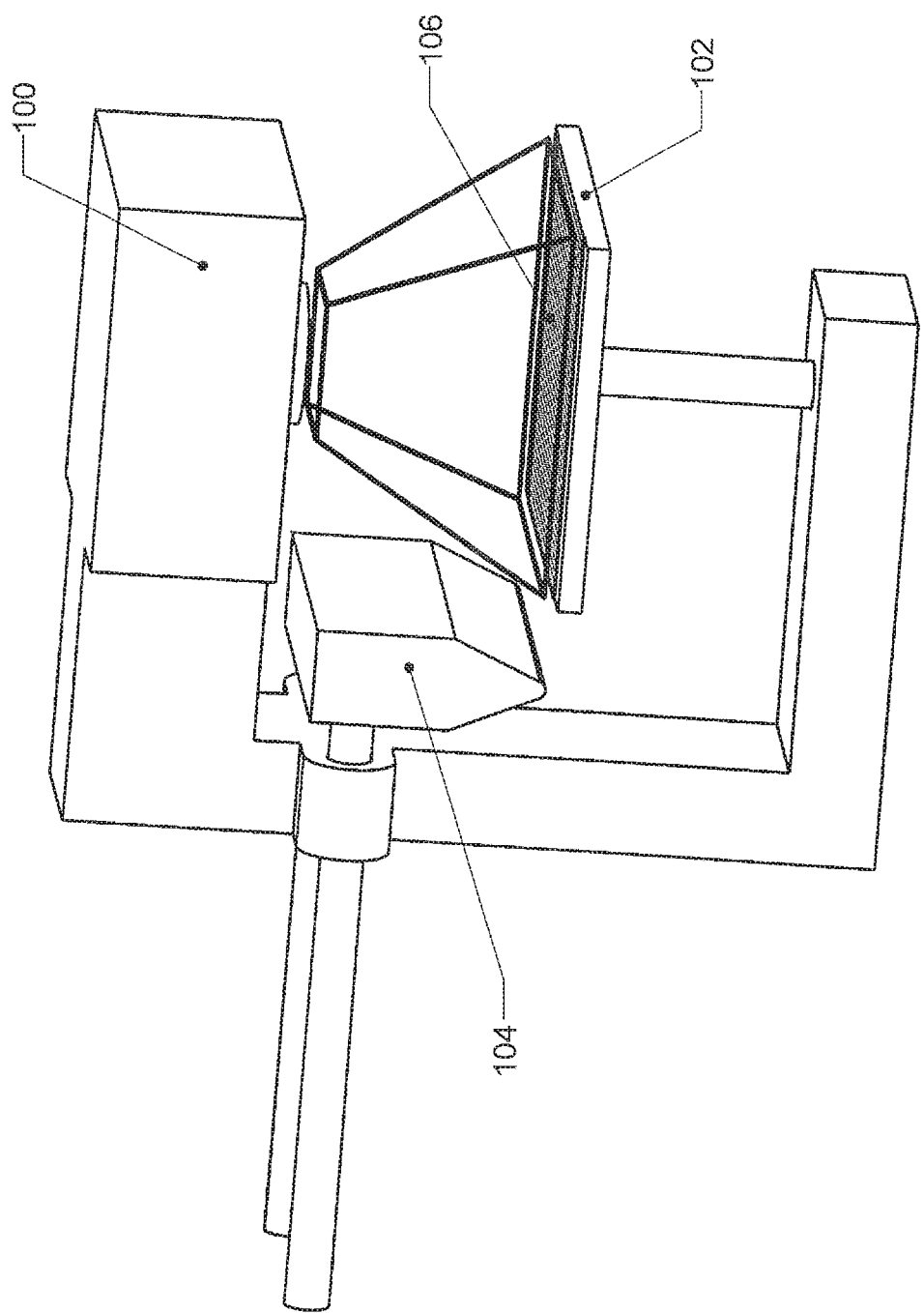
FIG. 3 is a left perspective view of the SFF device of FIG. 1 in a third operating position.

Many SFF devices include three basic components. FIGS. 1-3 show an SFF device that builds on structures and processes in the prior art. This device consists of a build surface (102), a material deposition module (104), and an imaging unit (100). The material deposition module (104) deposits photocurable material (106) onto the build platform (102) where an image is created by the imaging unit (100).

In this arrangement, the imaging unit (100) can be used to cure the material (106) in a pattern representative of a layer of an object to be built (e.g., as represented in CAD data). The build platform (102) is moved to allow room for another layer to be created, and the process repeats until an object is built, layer by layer. In this case, the material layer (106) is curable by light, which solidifies the material to build the object. It is the object of the presently disclosed subject matter to improve each of these processes.

Figure 4:
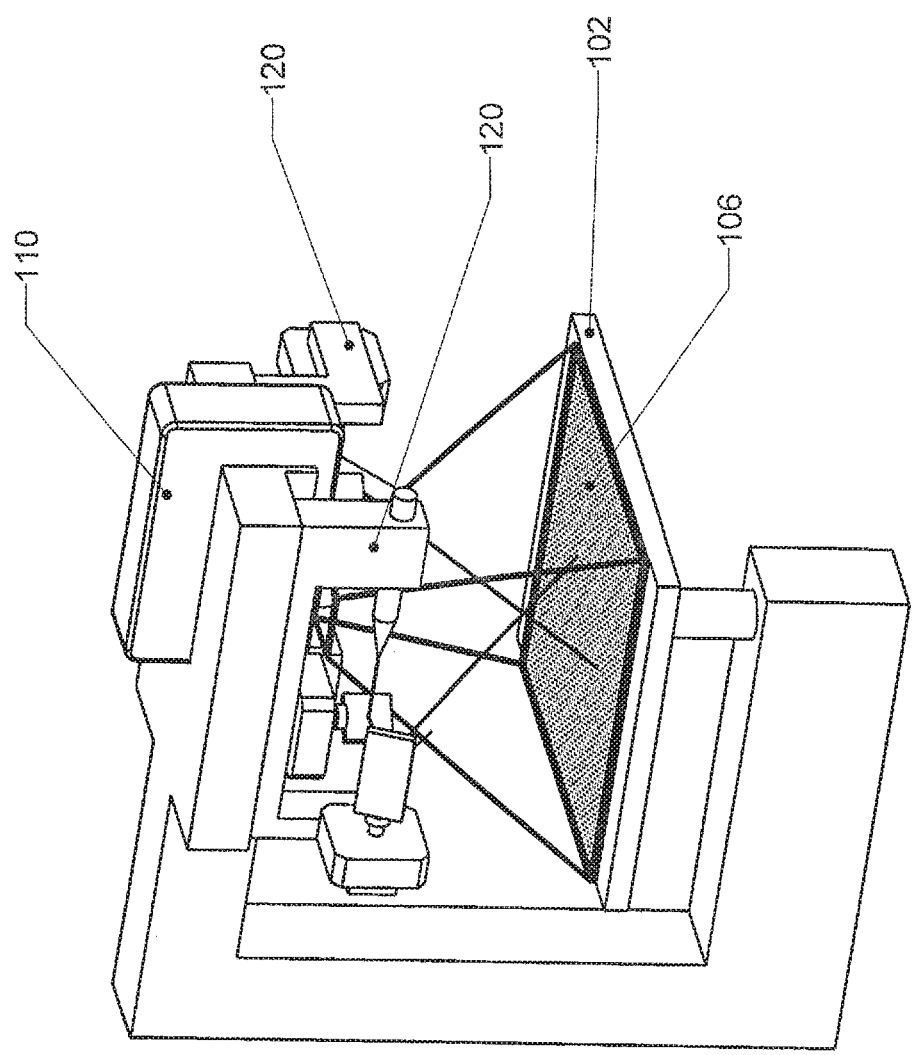
FIG. 4 is a left perspective view of a SFF device according to an embodiment of the presently disclosed subject matter.
Figure 5:
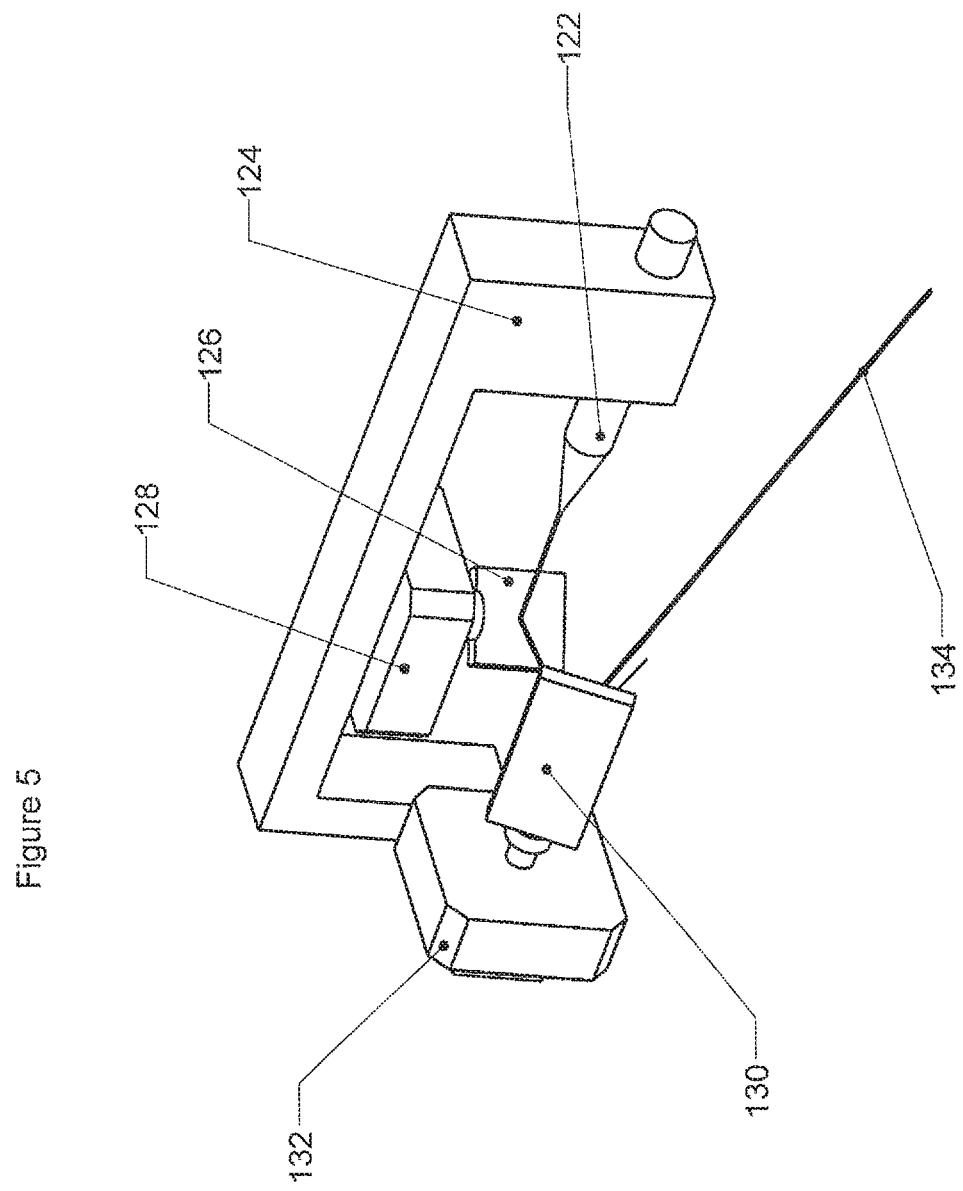
FIG. 5 is a left perspective view of a subassembly of the device in FIG. 4 according to an embodiment of the presently disclosed subject matter.
Figure 6:
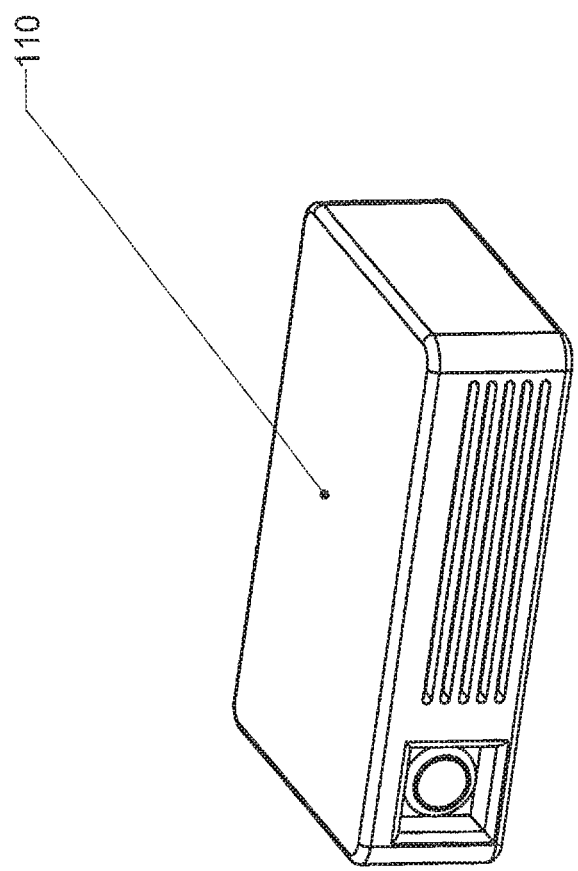
FIG. 6 is a perspective view of an imaging unit for use with a SFF device according to an embodiment of the presently disclosed subject matter.

Accordingly, in one aspect, the presently disclosed subject matter provides a device for solid freeform fabrication. FIGS. 4-6 depict a novel imaging arrangement and relevant components. Many current SFF devices utilize an imaging unit (100) comprising a programmable planar light source, such as a DLP projector (110), as shown in FIG. 6, to cure the material layer (106). The advantage of this technique, in contrast to methods that use a single laser, is that layers are cured in an imagewise fashion, which can improve build speed. However, part resolution can be limited in such a configuration by pixel resolution. Specifically, the physical size of a pixel increases as the image size increases, as it does when larger objects are being created. This scaling of the pixel size can in some circumstances puts a significant constraint on the size of objects that can be printed at high resolution by a projector (110) alone.

In the configuration of the imaging unit (100) of the device illustrated in FIG. 4, however, a projector (110) is used in combination with a precision imaging device (120). In this regard, the SFF devices described herein can comprise a build surface (102) for production of a 3-dimensional solid component, a material delivery system configured to deposit one or more material layers (106) on the build surface (102), at least one of the material layers (106) being a photocurable material, a first imaging component (e.g., projector (110)) having a first resolution, and a second imaging component (e.g., precision imaging device (120)) having a second resolution that is different than the first resolution. In this configuration, the first imaging component and the second imaging component are operable individually and in combination together to selectively irradiate the photocurable material to at least partially solidify successive layers of the 3-dimensional solid component. In particular, for example, a beam diameter of the second imaging component can be designed to be smaller than an equivalent beam diameter (e.g., pixel size) of the first imaging component (e.g., projector (110)). With this combination, the projector (110) is capable of quickly imaging the interior region of a cross section, while the precision imaging device (120) can rapidly image the border(s) of a cross section (i.e., the edges of the cross section that, when layered together, form the exterior surfaces of the component). Thus, resolution and imaging speed are maintained regardless of part size.

In some embodiments, for example, the precision imaging device (120) comprises of a collimated light source (122) that can be positioned to direct a beam of light (134) towards the build surface (102) (e.g., mounted in a bracket (124) above the build surface (102)). In some embodiments, for example, the collimated light source (122) can comprise at least one laser, an LED collimated via one of a set of mirrors and/or lenses, or any of a variety of other such sources known in the art. In any configuration, the direction at which the beam of light (134) is directed towards the build surface can be selectively moved to enable detailed images to be generated. In the embodiment of the precision imaging device (120) shown in FIG. 5, for example, the beam of light (134) is reflected off of a primary mirror (126), which can be selectively movable to change the direction of the beam of light (134). In particular, for example, the position of the primary mirror (126) can be selectively pivoted about a first axis (e.g., controlled by a rotary actuator (128)) such that the beam of light (134) can be scanned in a first dimension across the build platform (102). In addition, in some embodiments, the light beam (134) can further be reflected off of a secondary mirror (130) to further adjust the direction of the beam of light (134). In the illustrated embodiment, for example, the position of the secondary mirror (130) is selectively pivotable about a second axis (e.g., controlled by a second rotary actuator (132)) such that the beam of light (134) can be scanned in a second dimension (e.g., substantially perpendicular to the first dimension) across the build platform (102). As a result, by altering the position of these mirrors (126,130), the position of the spot created by the beam of light (134) on the material layer (106) may be controlled such that a two-dimensional cross section is imaged. By using this precision imaging device (120) in tandem with a projector (110), the issues with respect to the resolution of a projector-based imaging system can be addressed by using the comparatively finer focus of the precision imaging device (120) to "smooth" the edges of the image irradiated by the projector (110). In this regard, the precision of a given layer is determined by the positional precision of the precision imaging device (120), but the imaging time can be essentially the same as for a projector-based SFF device.

Although the above discussion of a multiple source imaging unit (100) makes particular reference to the embodiment illustrated in FIGS. 4 and 5, those having ordinary skill in the art will appreciate that the previously described technique may be generalized such that any of a variety of other embodiments of SFF devices may use a similar dual imaging technique to improve resolution and speed. In general, "bulk imaging" may be utilized to cure the interior regions of a cross section, and "precision imaging" may be utilized to cure the border regions of a cross section. This type of dual imaging arrangement may be accomplished in a variety of ways.

Figure 7:
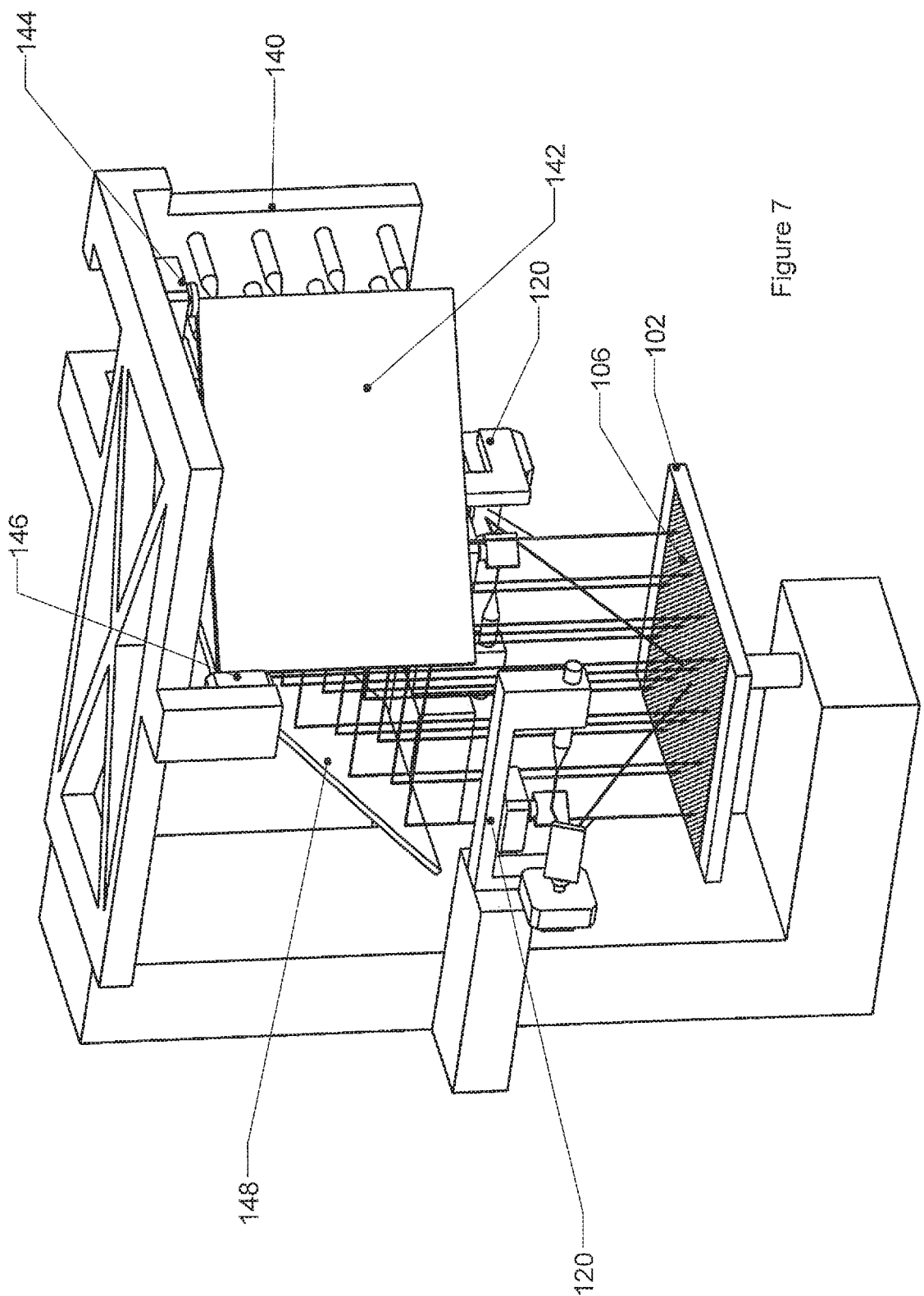
FIG. 7 is a left front perspective view of a SFF device according to a second embodiment of the presently disclosed subject matter.
Figure 8:
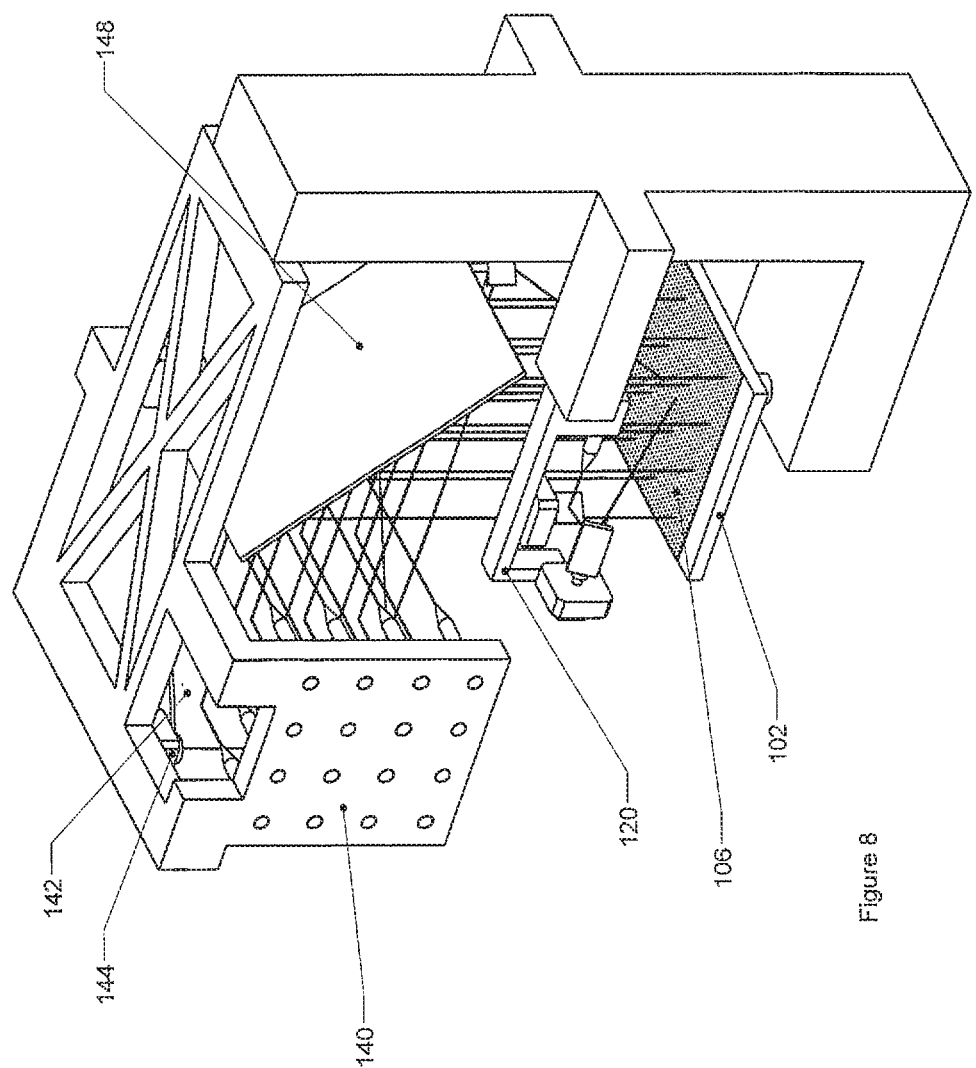
FIG. 8 is a right rear perspective view of the device in FIG. 7.
Figure 9:
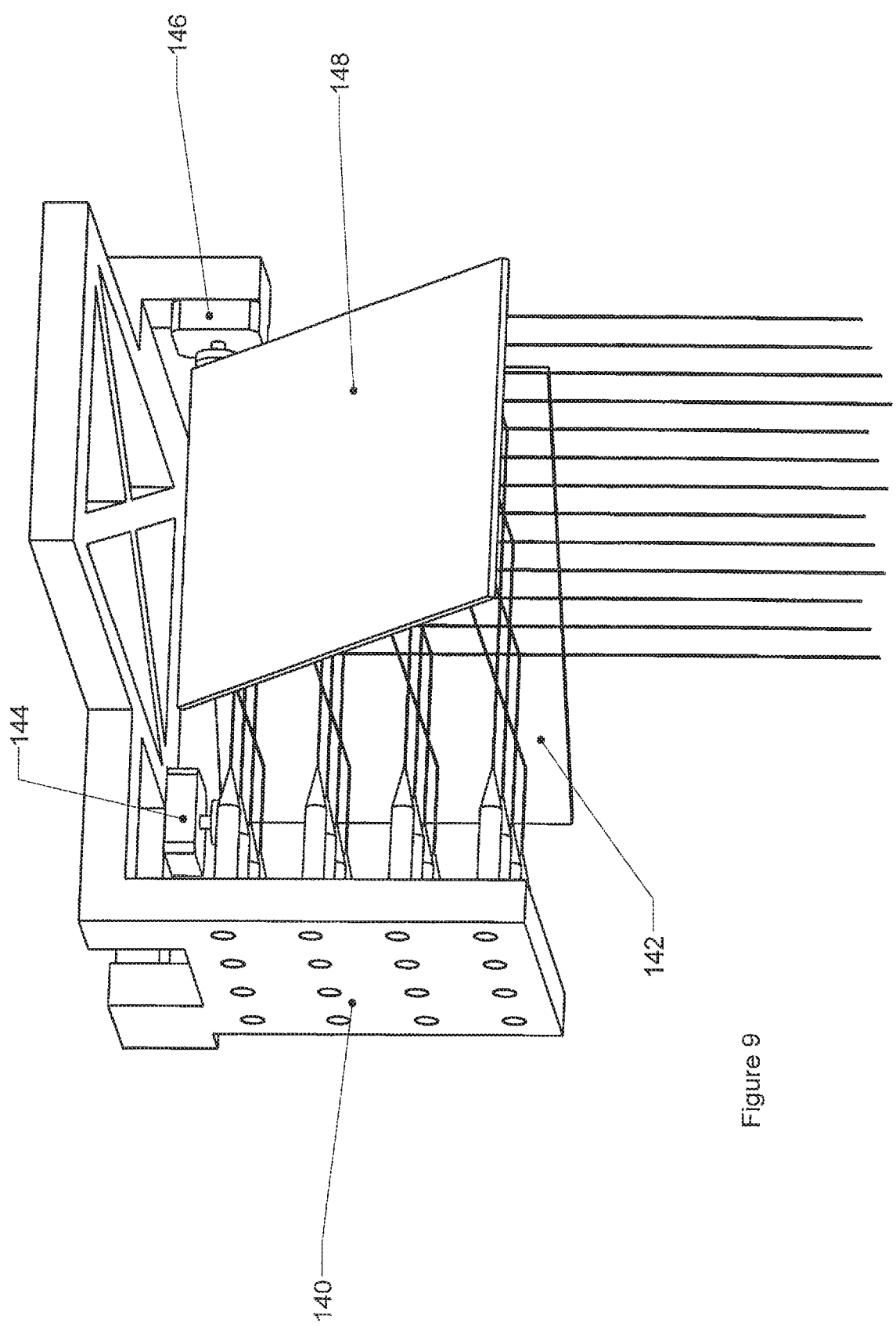
FIG. 9 is a right rear perspective view of an imaging unit for use with the device in FIG. 7 according to an embodiment of the presently disclosed subject matter.
Figure 10:
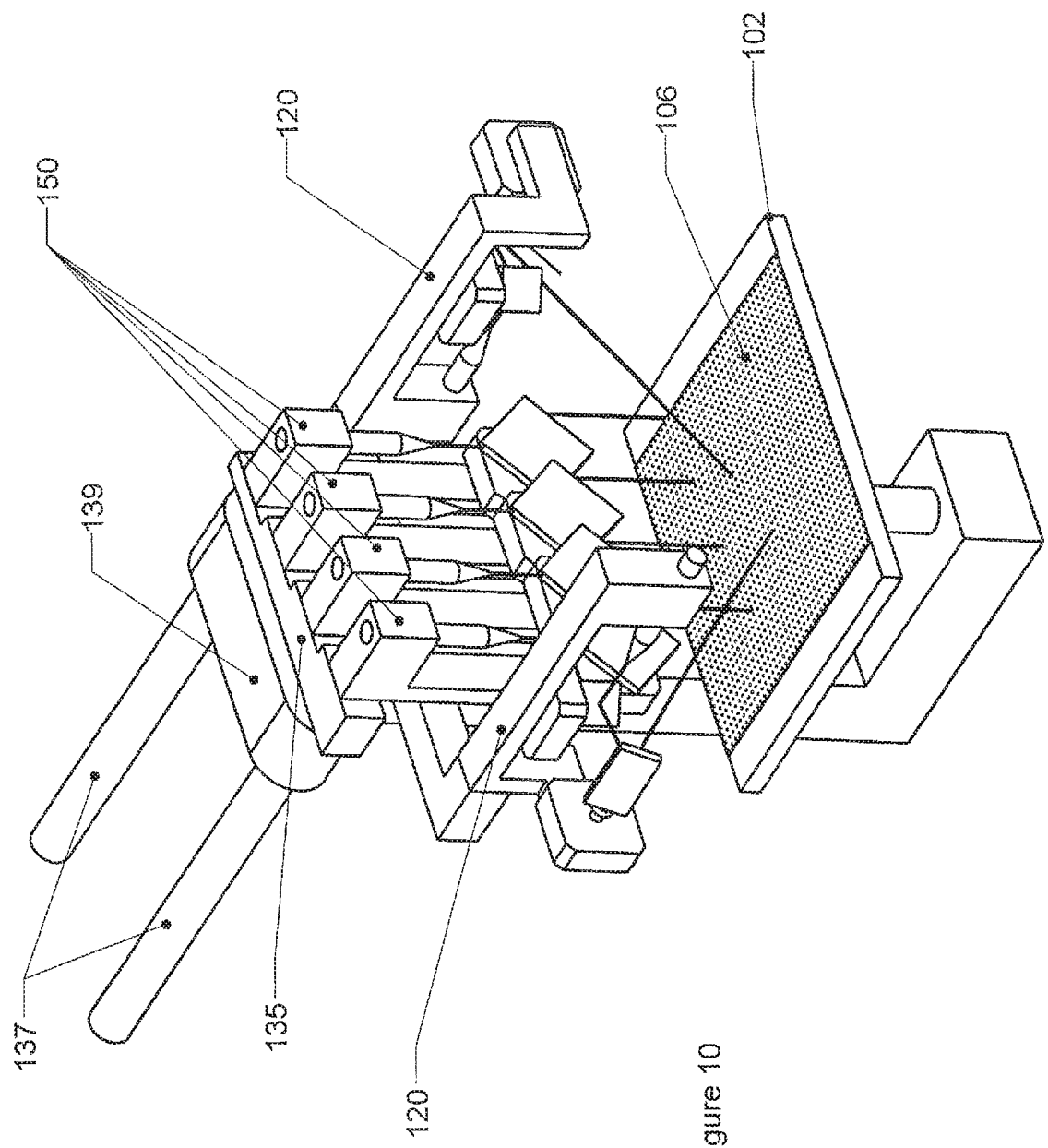
FIG. 10 is a left front perspective view of a SFF device according to a third embodiment of the presently disclosed subject matter in a first operating position.

In particular, for example, FIGS. 7-9 depict an alternate embodiment of a device employing this technique. In this embodiment, bulk imaging can be provided by an array of collimated radiation sources (140) that emits beams of radiation onto a primary mirror (142) controlled by a primary actuator (144). The beams are reflected onto a secondary mirror (148) controlled by a secondary actuator (146). In this configuration, the primary (142) and secondary (148) mirrors can be selectively moved to cause the beams to raster over the material layer (106) on the build surface (102). That is, the direction at which the beams are aimed towards the build surface (102) is moved in a line-by-line scanning pattern over the material layer (106) such that the entire area to be irradiated is scanned progressively, one line at a time. In some particular embodiments, for example, the direction of the beams sweep across an entire width of the area to be irradiated in a first dimension (e.g., by rotating primary mirror (142)), the beams are then advanced an incremental distance in a second dimension (e.g., by rotating secondary mirror (148)), and the process is repeated in a line-by-line manner until the entire area to be irradiated is covered. Beams may be controllably switched on and off during the raster scan in a manner corresponding to the cross sectional image being formed by the device. In this embodiment, detailed imaging is performed by two precision imaging modules (120), though in general there may be any other number of precision imaging modules.

Figure 11:
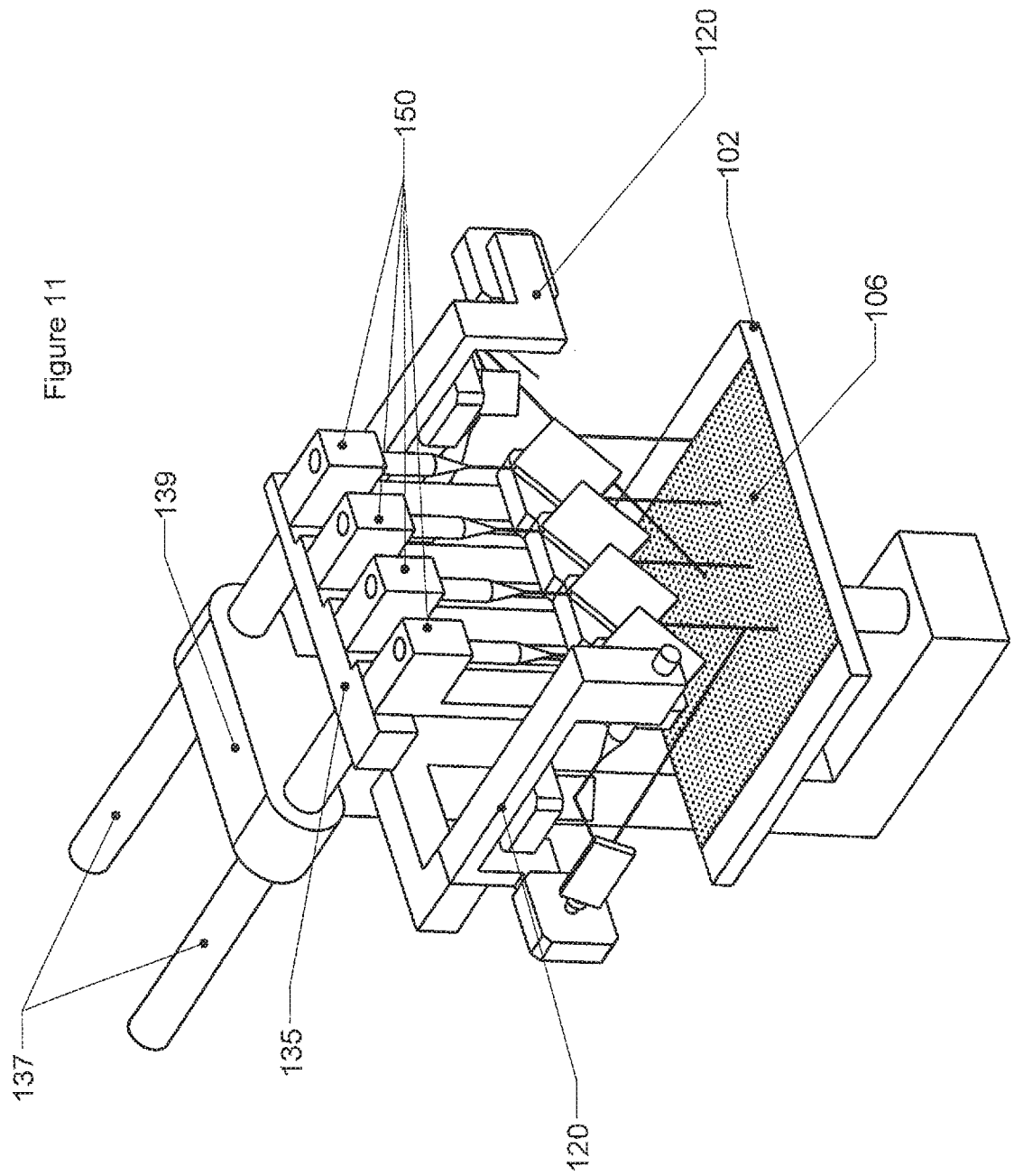
FIG. 11 is a left front perspective view of the device in FIG. 10 in a second operating position.
Figure 13:
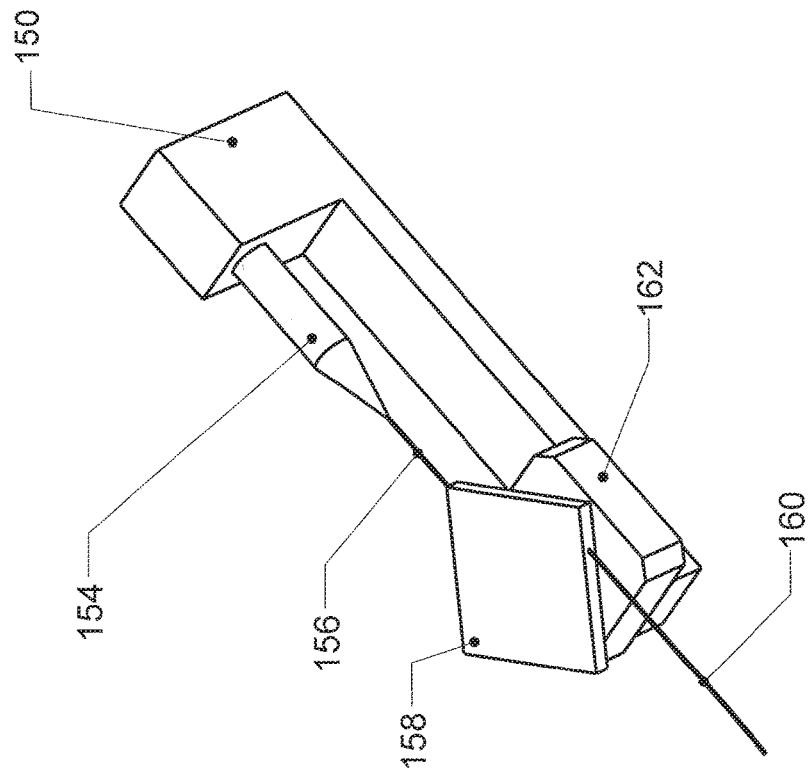
FIG. 13 is a perspective view of the imaging unit in FIG. 12.
Figure 12:
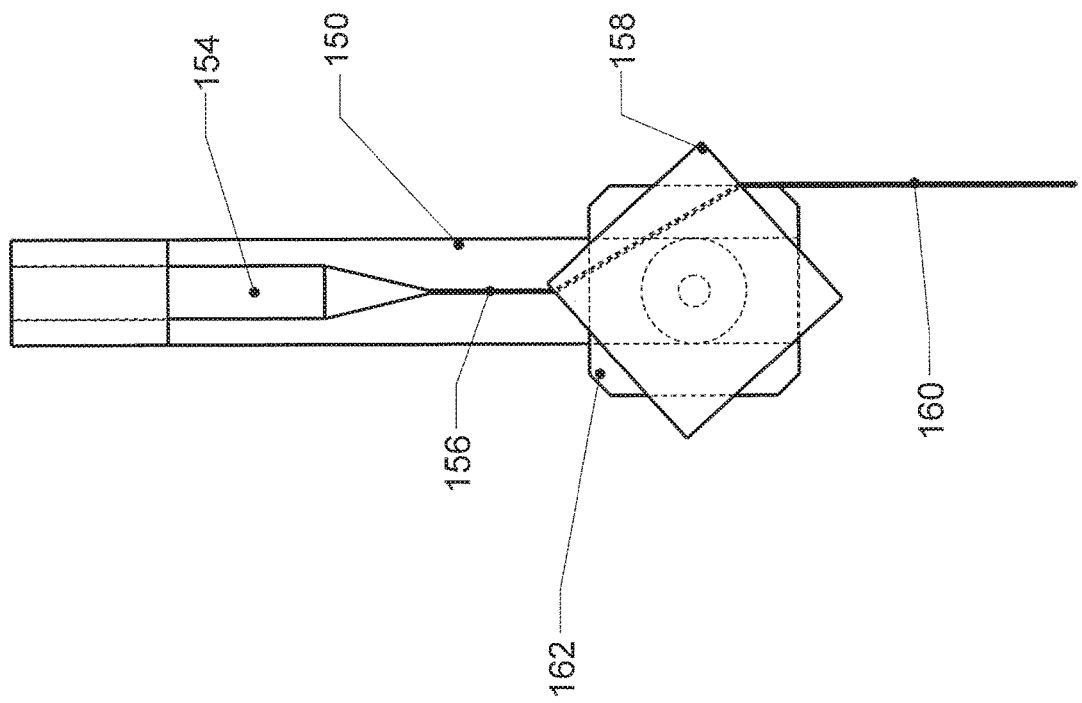
FIG. 12 is a front view of an imaging unit for use with a SFF device according to an embodiment of the presently disclosed subject matter.

In a further alternative embodiment, FIGS. 10-13 also depict a configuration employing the same concept of bulk imaging and precision imaging. In this embodiment, bulk imaging is accomplished with an array of prism rastering modules (150). As shown in FIGS. 12 and 13, each prism rastering module (150) can comprise a source (154) configured to emit a beam (156) of collimated radiation. The beam (156) enters a rotating refractive material, such as a prism (158), and is refracted. Upon exiting the prism (158), a second refraction occurs, and the result is a displaced beam (160). As illustrated in FIGS. 12 and 13, in some embodiments, the prism (158) has a substantially square section with a thickness exceeding a diameter of the beam (156). Those having ordinary skill in the art will appreciate, however, that the prism (158) may in general be a polygon with an even number of faces. In some instances, opposing faces of the prism (158) may or may not be parallel, depending on the desired refraction and displacement behavior.

Referring again to the particular embodiment shown in FIGS. 10-13, the prism (158) of each prism rastering module (150) is rotated by an actuator (162) which causes the displaced beam (160) to raster across the build surface (102). An array of these prism rastering modules (150), mounted on a bracket (135), which in turn is free to move while guided by rails (137) engaging the base (139) of the SFF device, can be translated across the build surface (102) as shown in FIG. 11. Alternatively, as discussed above, rather than the prism rastering modules (150) being physically translated relative to the build surface (102), the prism rastering modules (150) can be mounted in a fixed relative position with respect to the build surface (102), and one or more mirrors, lenses, or other refractive material (e.g., a secondary mirror (148) as discussed above with respect to the embodiment of FIGS. 7-9) positioned between the prism (158) and the build surface (102) can be controlled to pan the direction at which the displaced beams (160) are aimed towards the build surface. Regardless of the particular mechanism by which the raster scan is incrementally panned along the build surface (102), bulk imaging is achieved while the sources (154) are switched on and off according to the cross section being imaged.

Figure 14:
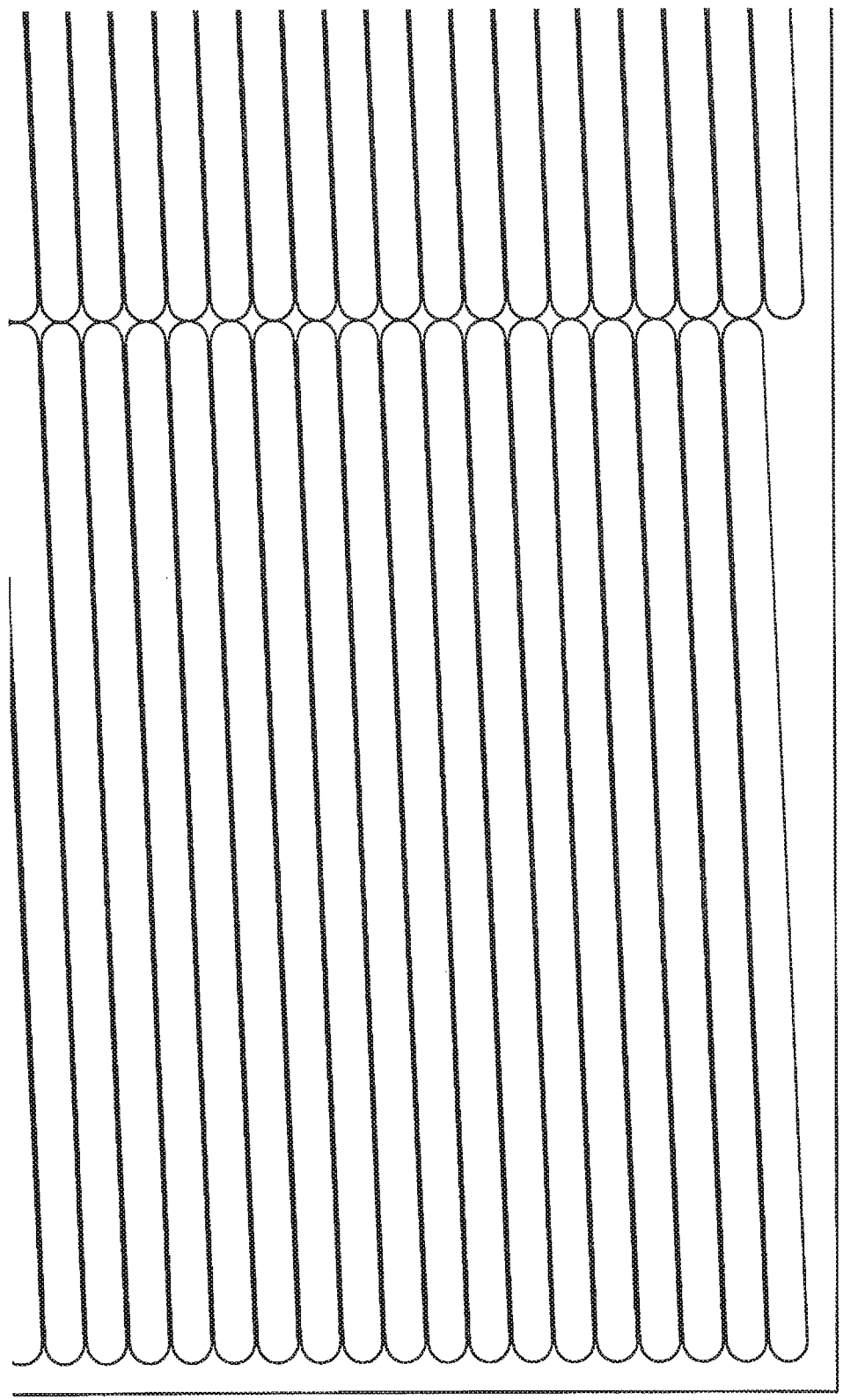
FIG. 14 is a top view of a SFF trace pattern according to an embodiment of the presently disclosed subject matter.
Figure 15:
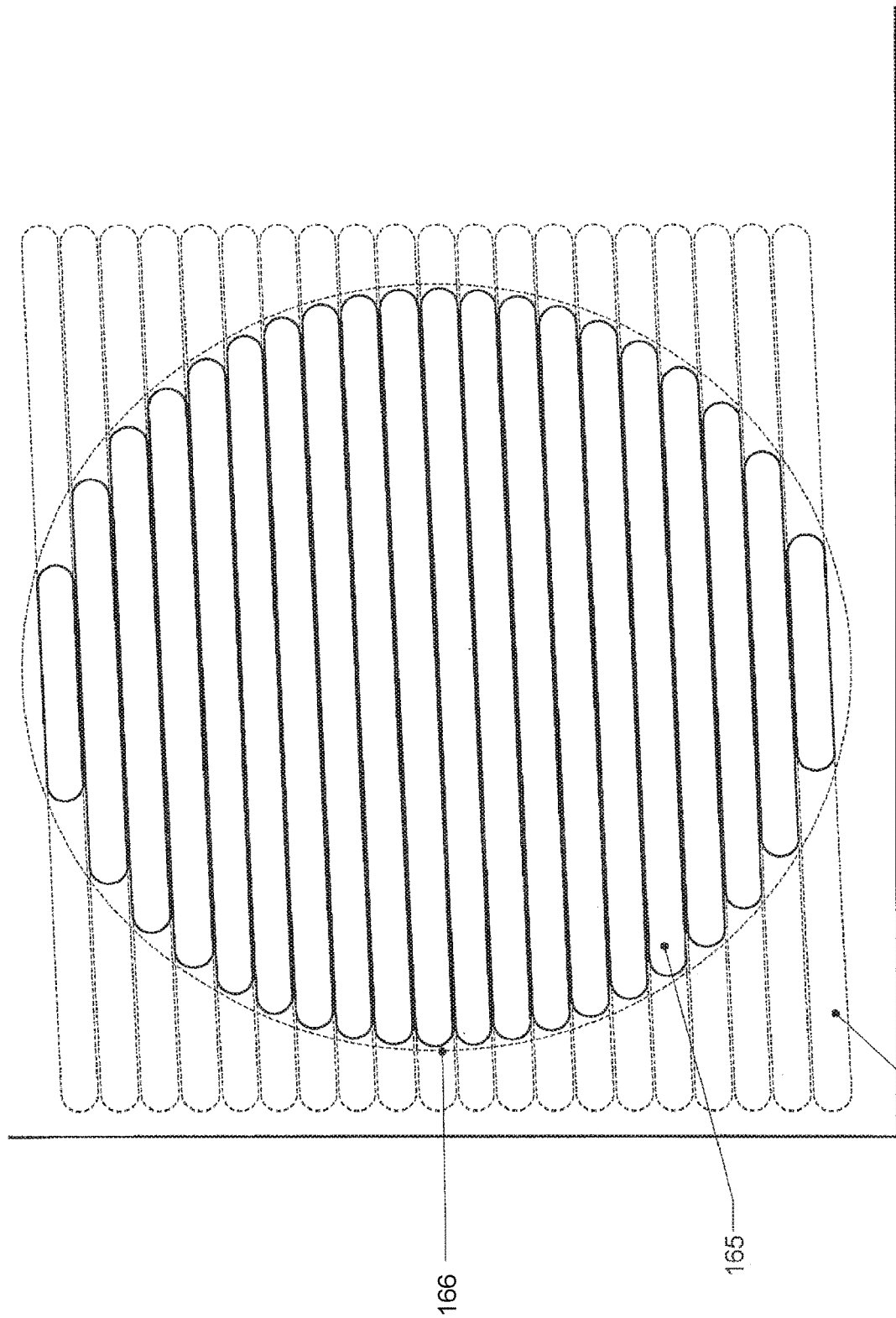
FIG. 15 is a top view of a SFF trace and raster pattern according to an embodiment of the presently disclosed subject matter.

In this regard, for example, FIG. 14 shows a trace pattern, which can be imaged by an array of prism rastering modules (150) as discussed above. FIG. 15 shows the trace pattern (164) overlaid with a raster pattern (165) for a circular cross section (166). As the prism raster modules (150) are translated and the prisms (158) are rotated to follow the trace pattern (164), the sources (154) can be selectively activated such that the displaced beams (160) only irradiate the build surface (102) within the raster pattern (165). In this way, bulk imaging is restricted to the interior of the cross section (166) being imaged.

Figure 16:
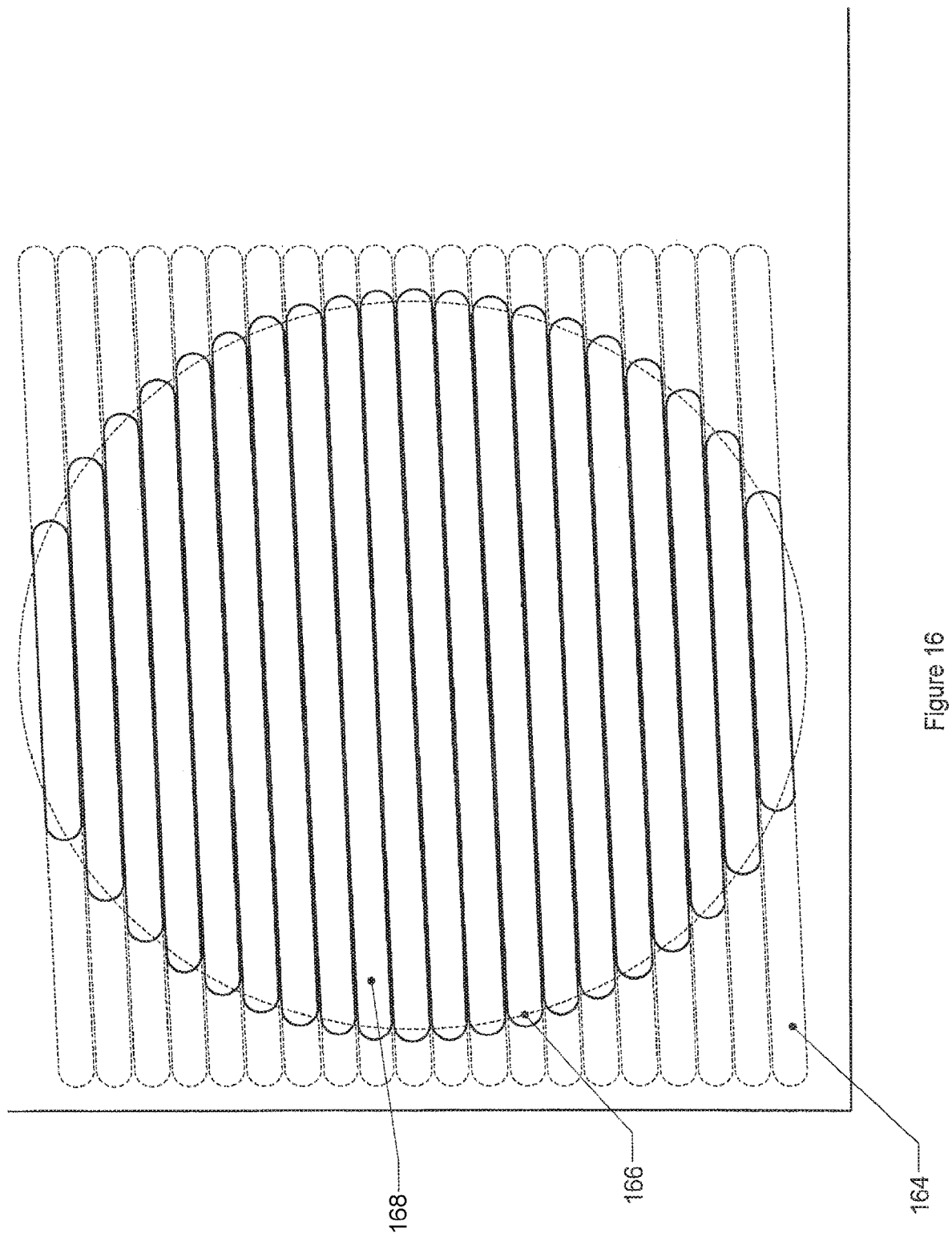
FIG. 16 is a top view of an alternate SFF trace and raster pattern according to an embodiment of the presently disclosed subject matter.
Figure 17:
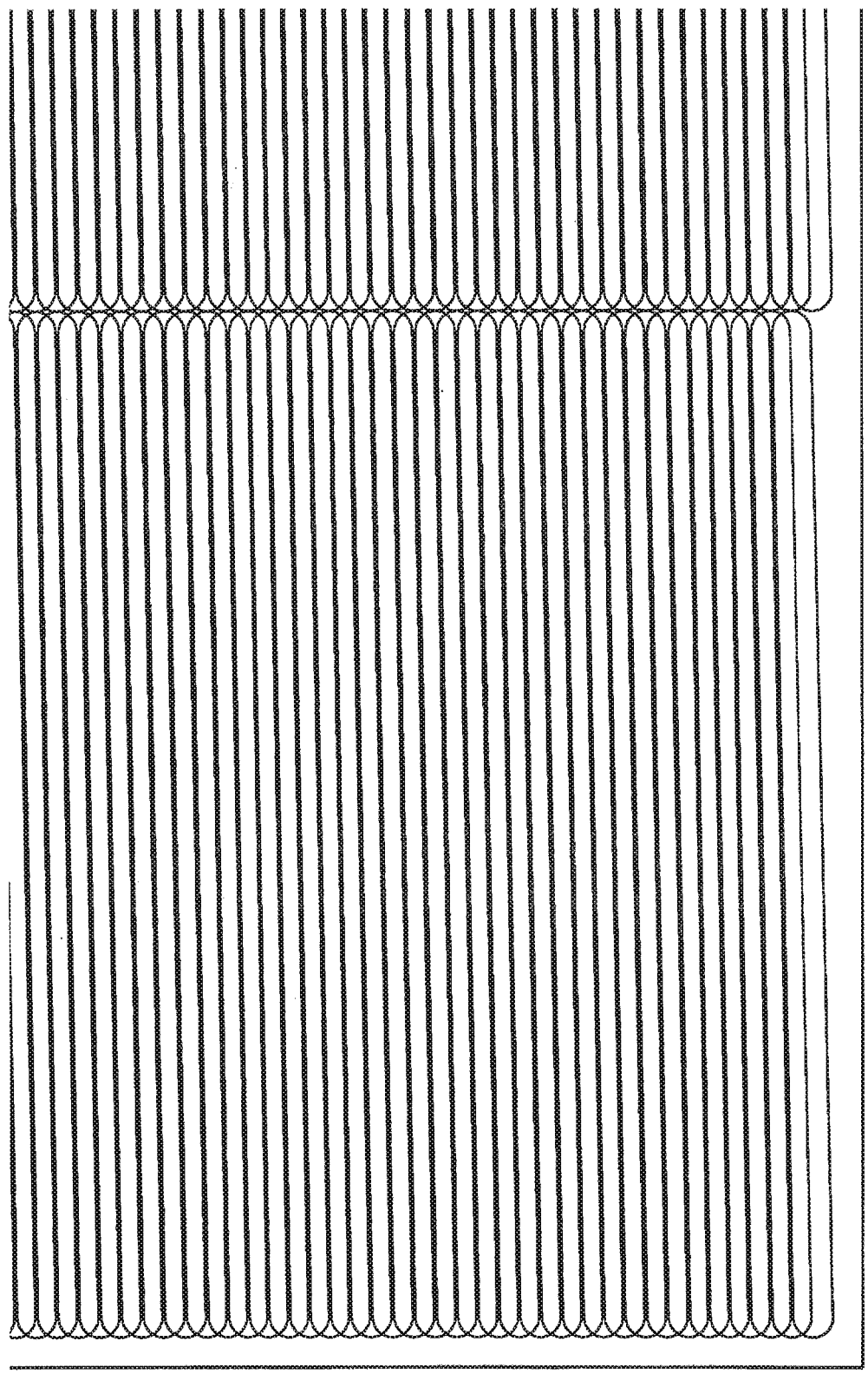
FIG. 17 is a top view of an alternate SFF trace pattern according to an embodiment of the presently disclosed subject matter.

As depicted in FIG. 16, however, those having ordinary skill in the art will appreciate that this need not always be the case. As shown in FIG. 16, an alternative raster pattern (168) that extends at least to the edge of the cross section (166) may be desirable depending on the properties of the radiation source (154) and/or the properties of the material layer being cured (106). If a particular radiation source is highly focused, and/or the material layer being cured has a low penetration depth coefficient, or the material tends to shrink during the curing process, this pattern (or one similar to it), which cures beyond the strict boundaries of the target cross sectional image, may be desirable. Additionally, if the raster speed and speed of lateral translation are coordinated appropriately, an overlapping raster pattern may be achieved, as in FIG. 17. Specifically, for example, the lateral translation may be controlled such that the modules are translated a distance equivalent to the nominal diameter of the laser beam while the raster module rotates to produce one raster line. In this embodiment, the radiation source (154) can be configured such that the resin to be irradiated would require two passes in order to be fully cured. In this way, the overlapping pattern may allow for resin to be partially cured in a first pass and fully cured in a second pass. Thus, by controlling the radiation source (154) appropriately, a resolution finer than the width of a single rastered line may be achieved.

Figure 18:
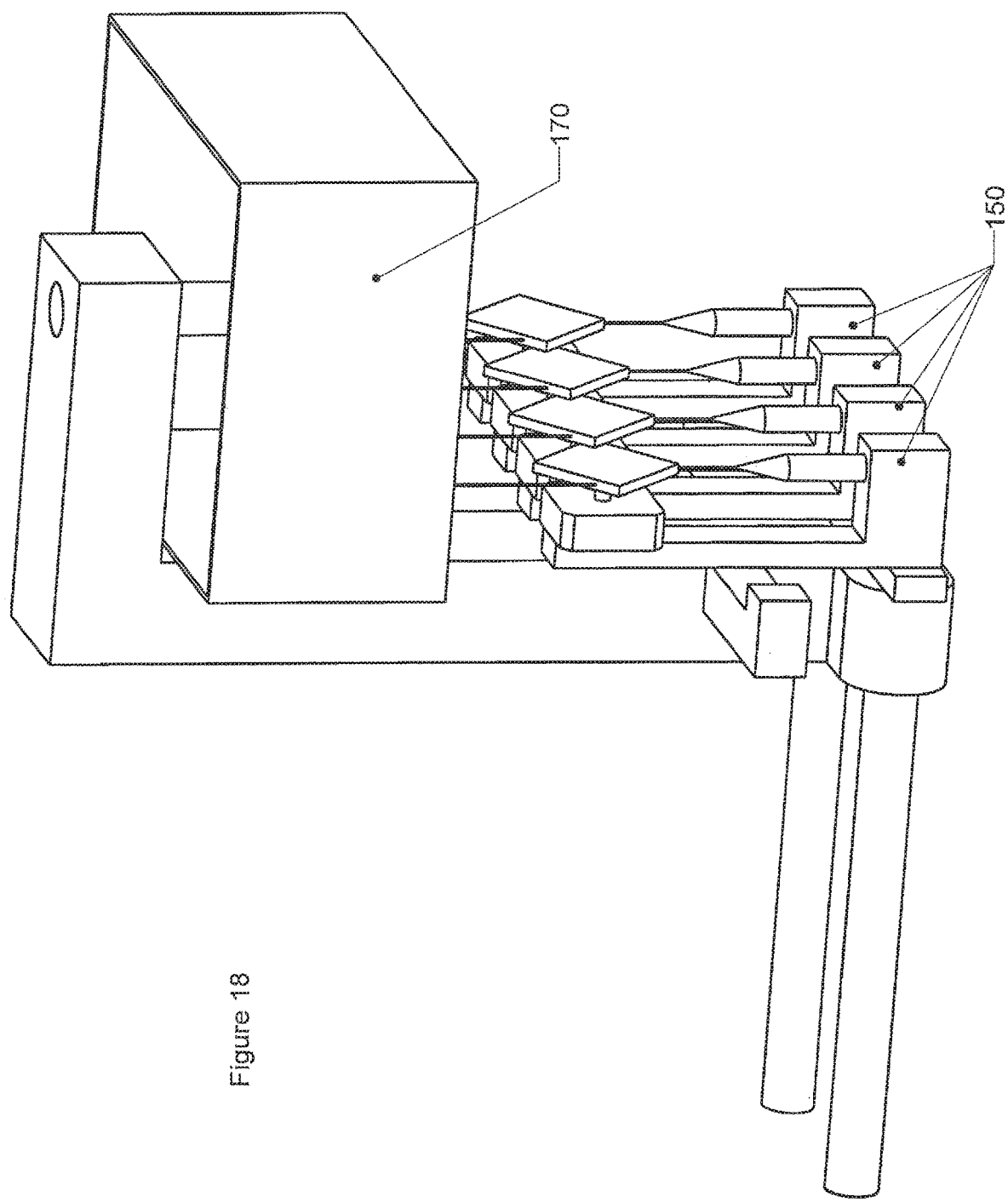
FIG. 18 is a left front perspective view of a SFF device according to a fourth embodiment of the presently disclosed subject matter.
Figure 19:
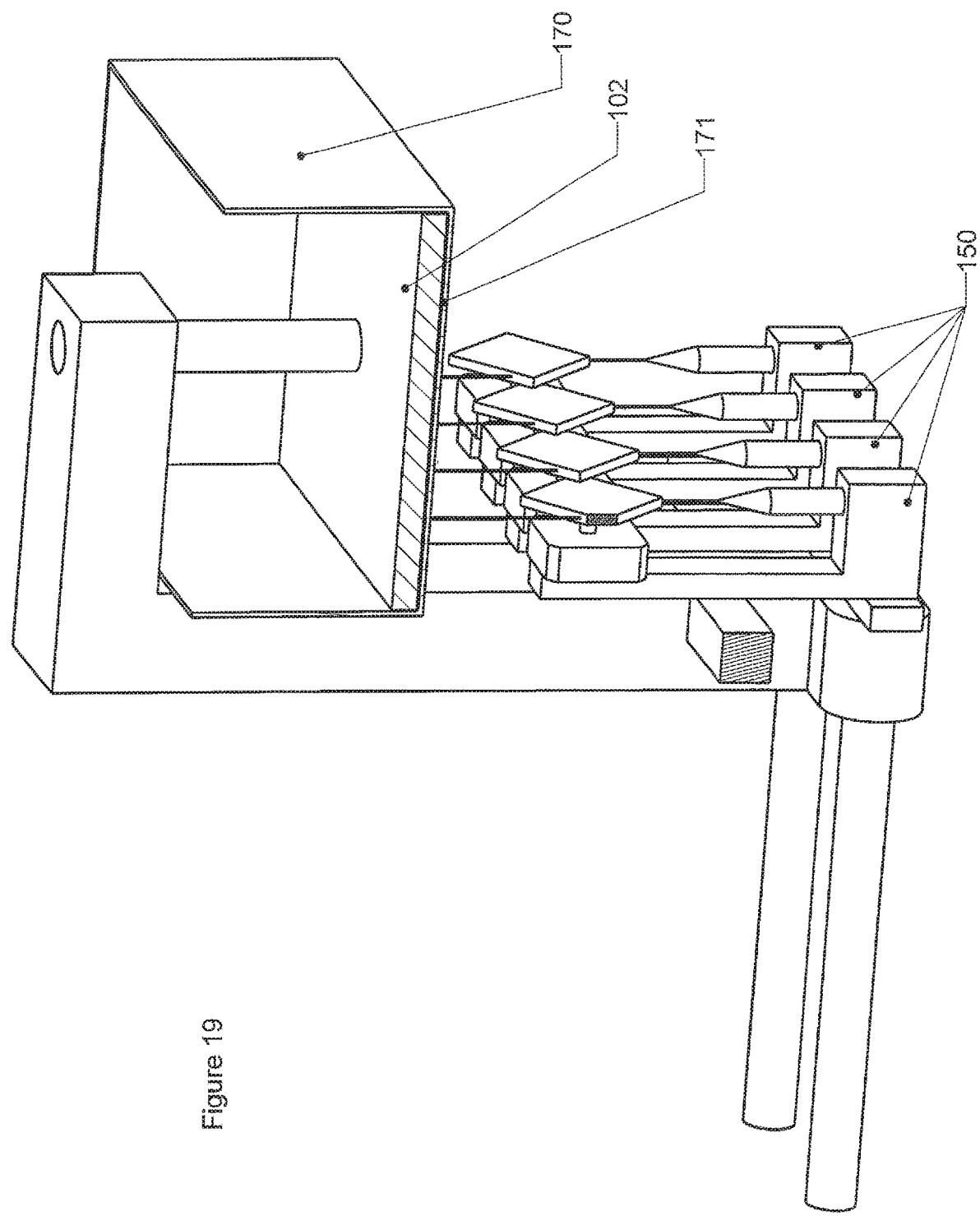
FIG. 19 is a left front cross sectional perspective view of the device in FIG. 18.

FIGS. 18 and 19 depict an embodiment of the presently disclosed subject matter which utilizes prism raster modules (150) in an alternative orientation with respect to the build surface. In this instance, material is not deposited on top of a build platform (102). Instead, the build platform (102) is lowered into a vat (170) of material. Radiation is emitted against the bottom (171) of the vat (170) which is generally transparent to the radiation being used. In this way, a layer of material is cured in a manner corresponding to a cross section of the object being built between the build platform (102) and the bottom (171) of the vat (170). The spacing between the build platform (102) and the bottom (171) of the vat (170) determines the layer thickness. As the build platform (102) is translated upwards after imaging of a layer is completed, resin contained within the vat (170) fills the void between the build object and the bottom (171) of the vat (170). Thus, layer formation is now an intrinsic property of the apparatus, rather than an independent process.

Figure 20:
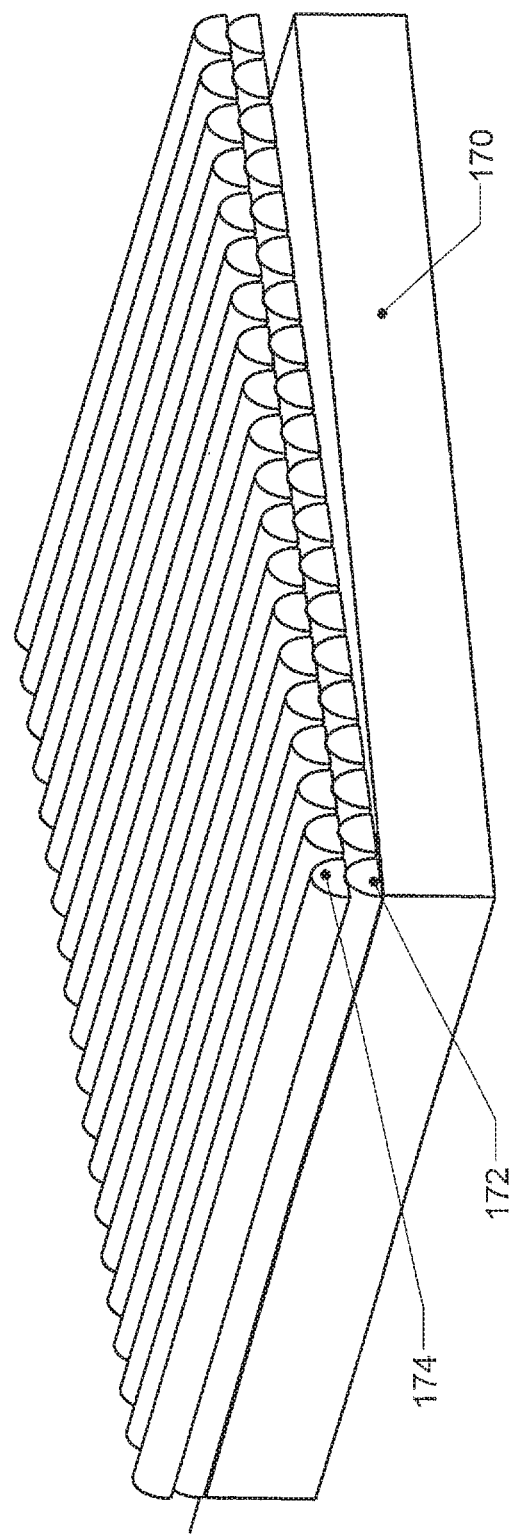
FIG. 20 is a perspective view of a raster cure pattern according to an embodiment of the presently disclosed subject matter.

One problem with this implementation is that each layer must be delaminated from the bottom surface of the vat (170) after curing, which typically involves moving the build platform (102) past where it will be located for the next layer (i.e., moving it a distance away from the bottom that is greater than the desired layer thickness), and then moving it back into position (i.e., distance from the bottom is substantially equal to the desired layer thickness) for the next layer. This movement acts as a layer formation process, but the delamination of the layer from the bottom surface and multi-step layer increment movement can put considerable stress on the object being built and requires a nontrivial amount of time. If the build platform (120) is continuously translated in a vertical direction, however, while prism raster modules (150) are actively curing resin in the vat (170), then the layer is progressively delaminated while being built rather than delaminating an entire layer at once, which optimizes build speed and minimizes stress on the object being built. For example, the spatial cure pattern achieved by such a process can be as shown in FIG. 20. Here, a section of the build surface (170) is shown with two layers of raster cure paths (172,174). It has been established that when a collimated source with Gaussian energy distribution is used to illuminate a photocurable substance, the cure volume is a parabolic prismatic shape, as shown here. The progressive delamination is represented in this example by the angle of the raster cure paths (172,174) with respect to the bottom surface of the vat (170) and by the fact that only a portion of one path of the lower set of raster paths (172) is in contact with the bottom surface of the vat (170). Even with this modified layer formation process, by switching the radiation source (154) on and off appropriately, an object can be built in a manner substantially similar to the methods discussed above.

Figure 21:
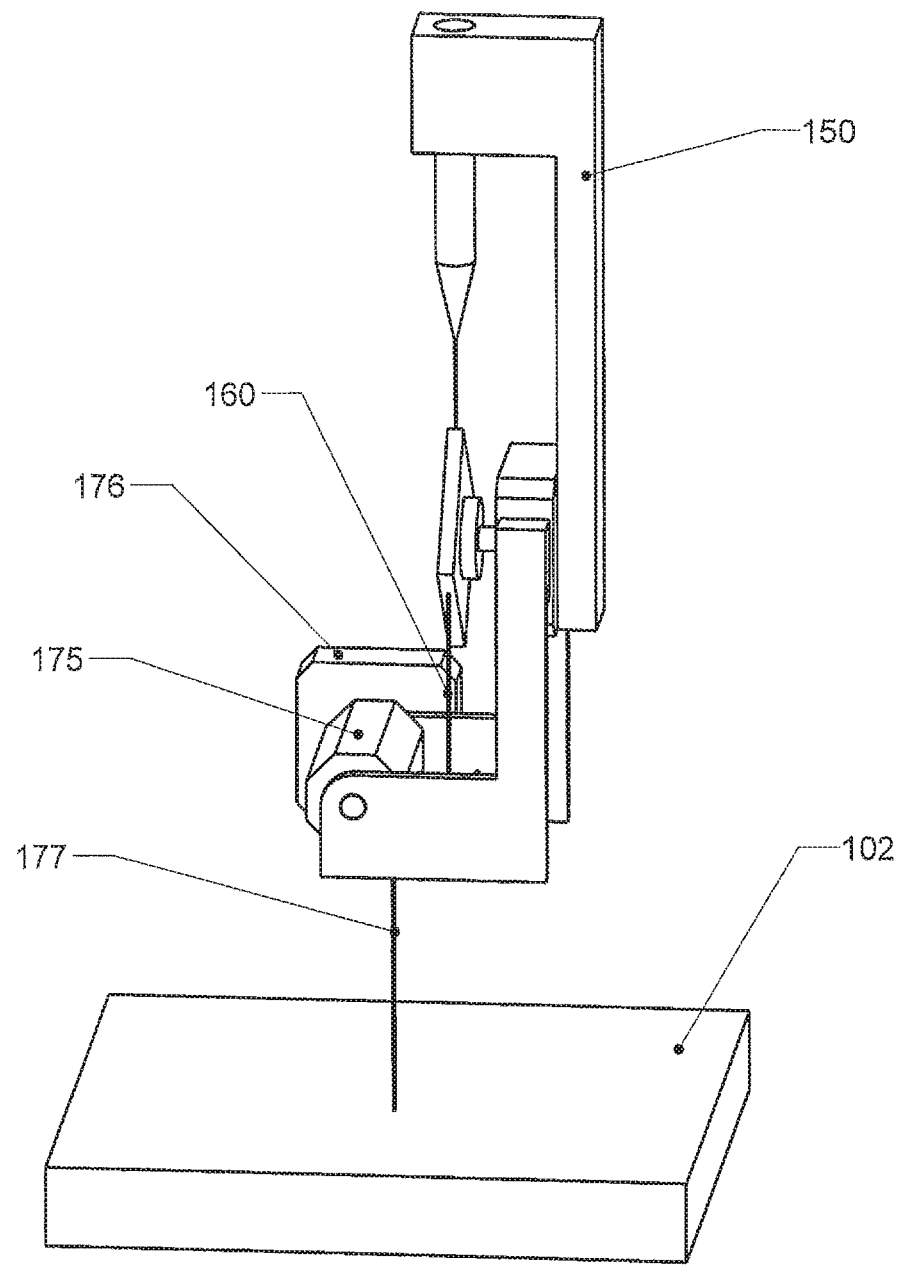
FIG. 21 is a right perspective view of an imaging unit for use with a SFF device according to an embodiment of the presently disclosed subject matter.
Figure 22:
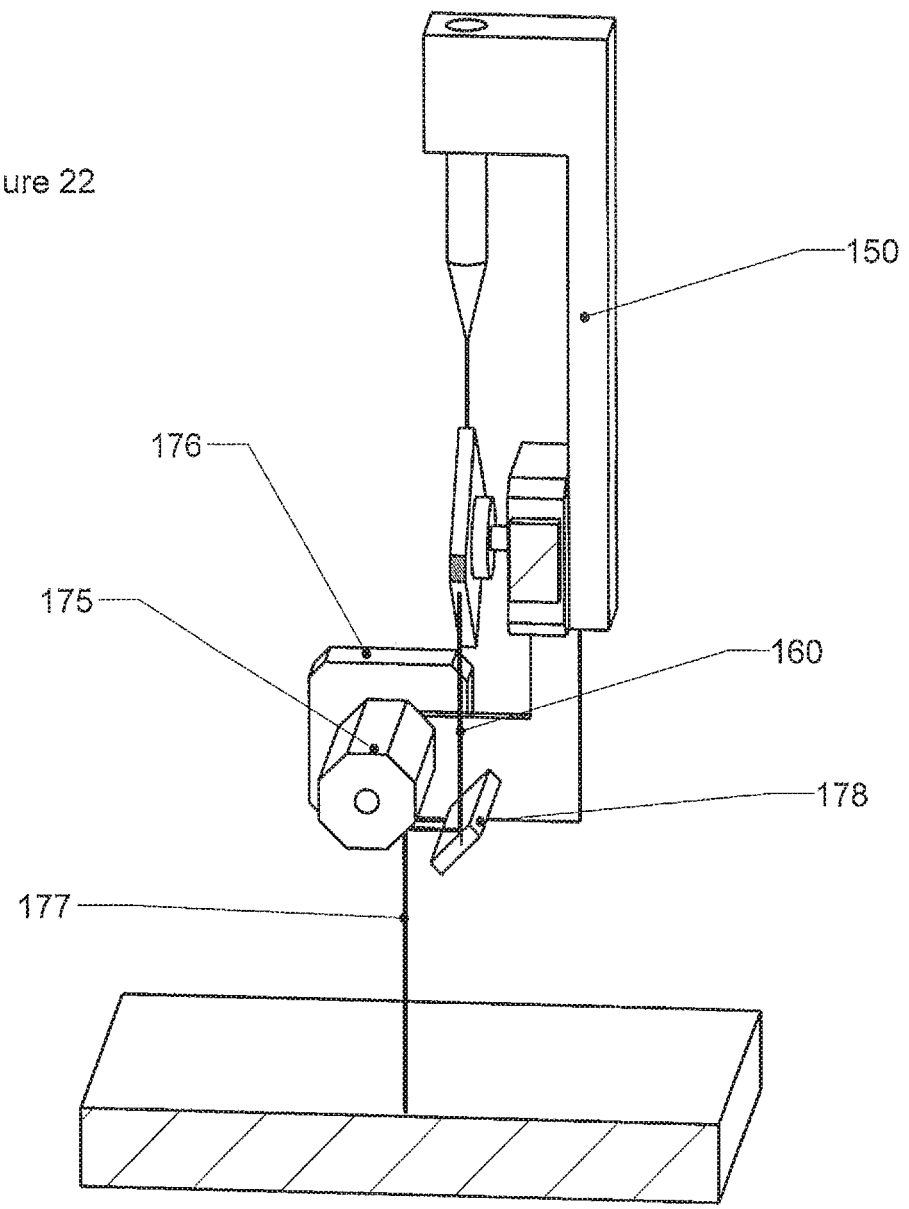
FIG. 22 is a right section view of the device in FIG. 21.
Figure 23:
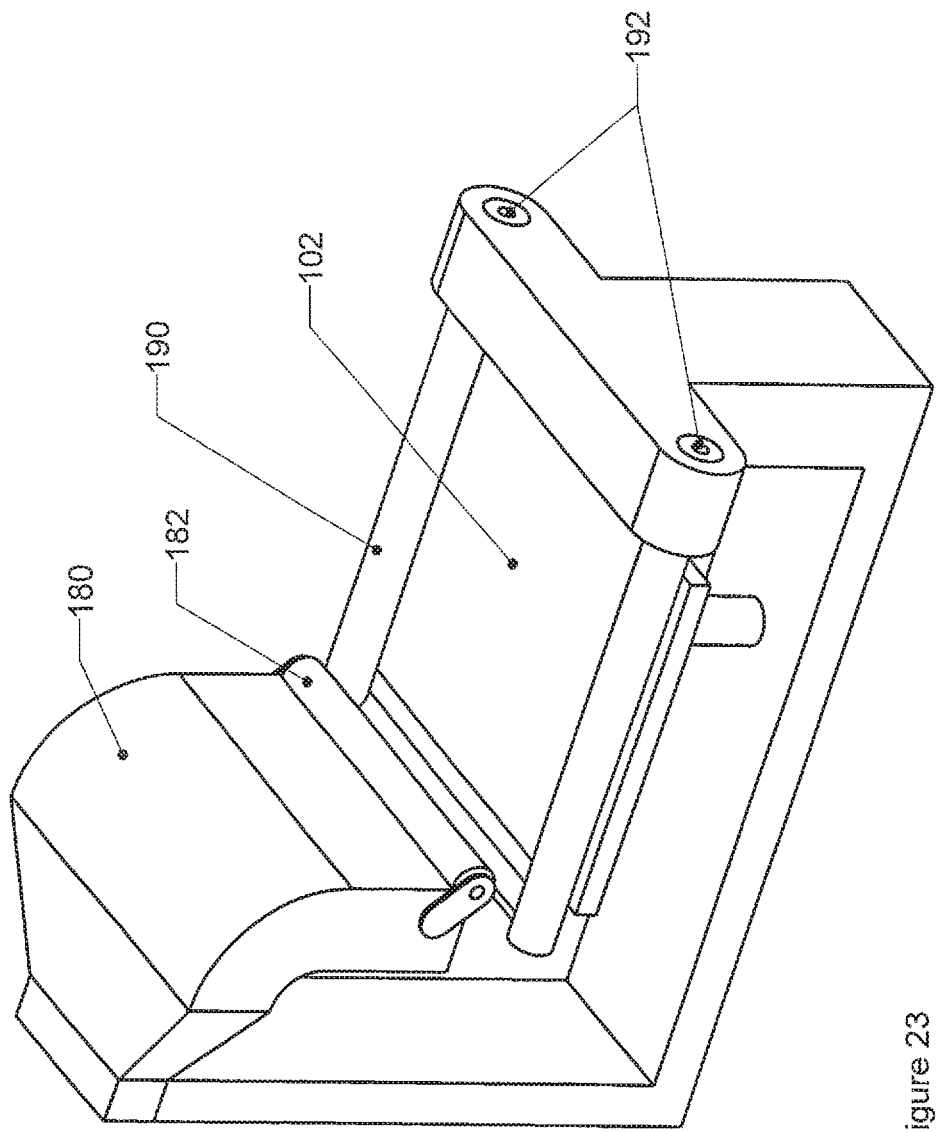
FIG. 23 is a left front perspective view of a layer deposition device for use in any embodiment of the presently disclosed subject matter.
Figure 25:
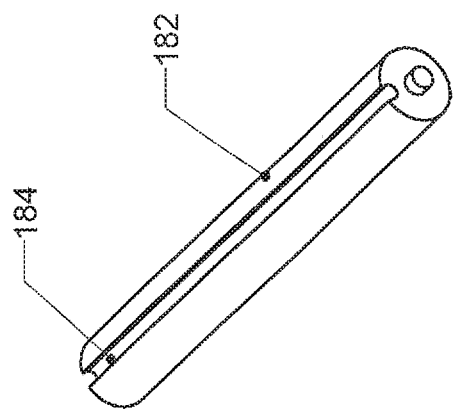
FIG. 25 is a perspective view of the powder dispenser of the device in FIG. 23.
Figure 24:
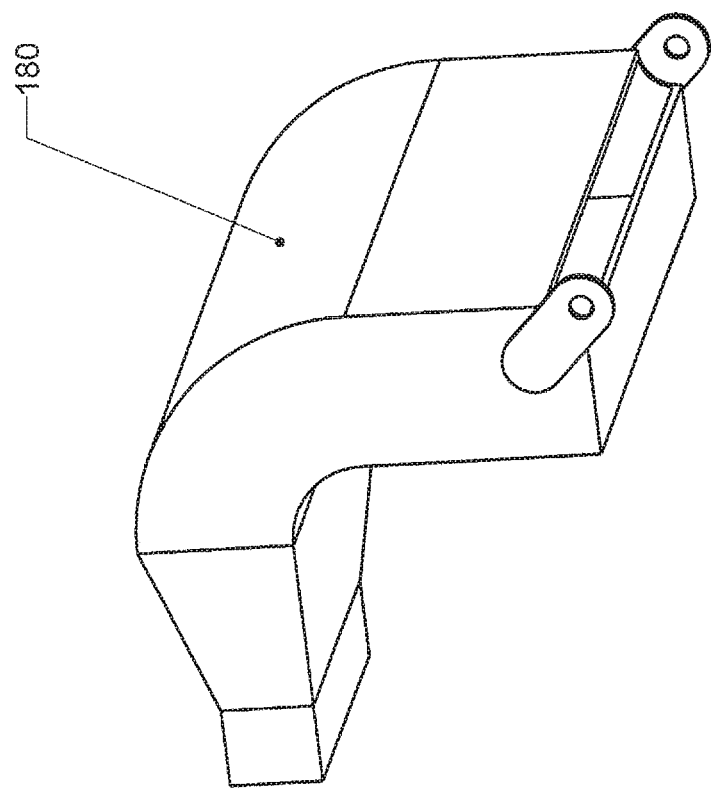
FIG. 24 is a left perspective view of the powder hopper of the device in FIG. 23.
Figure 26:
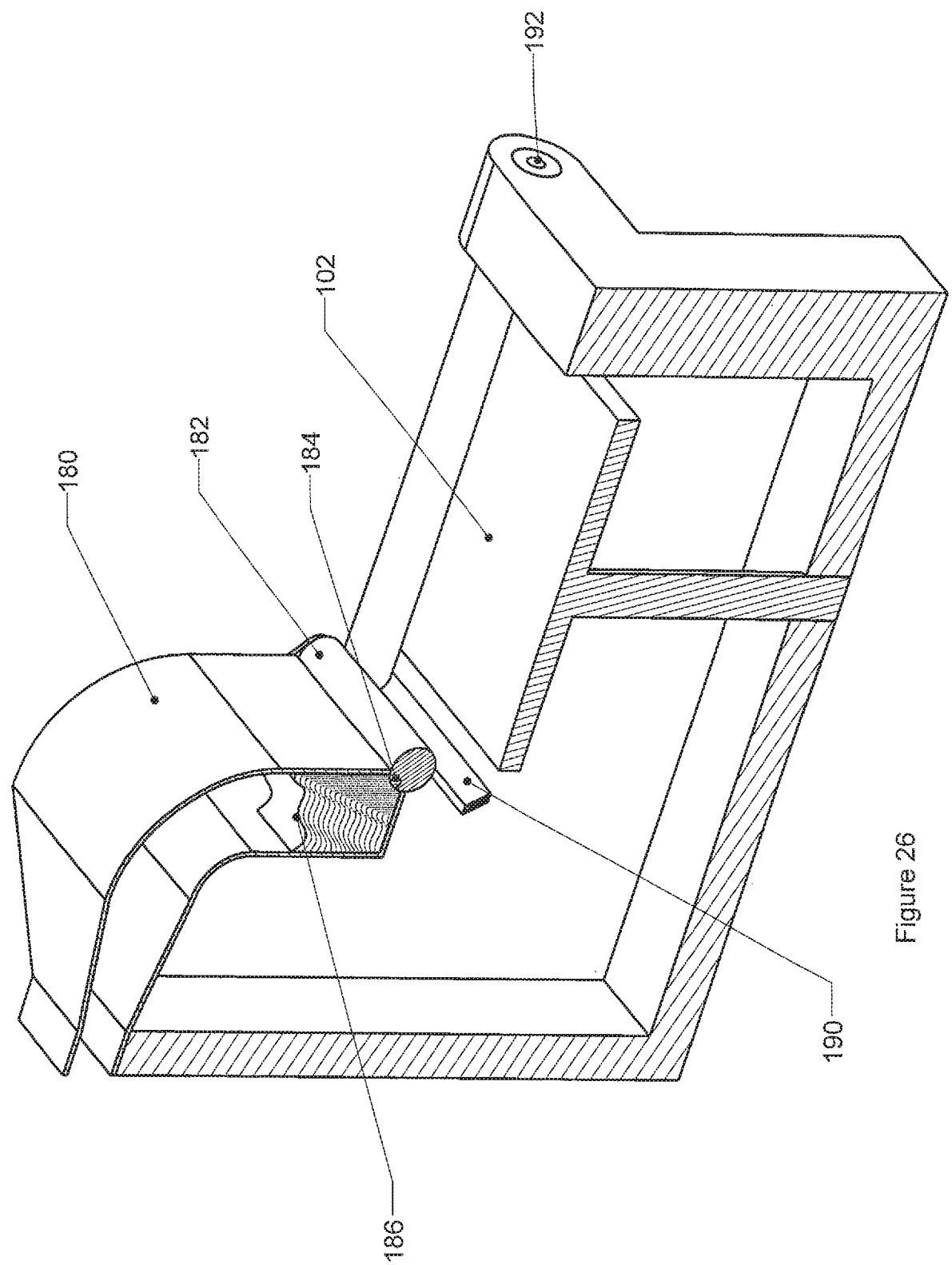
FIG. 26 is a left section view of the device in FIG. 23.
Figure 27:
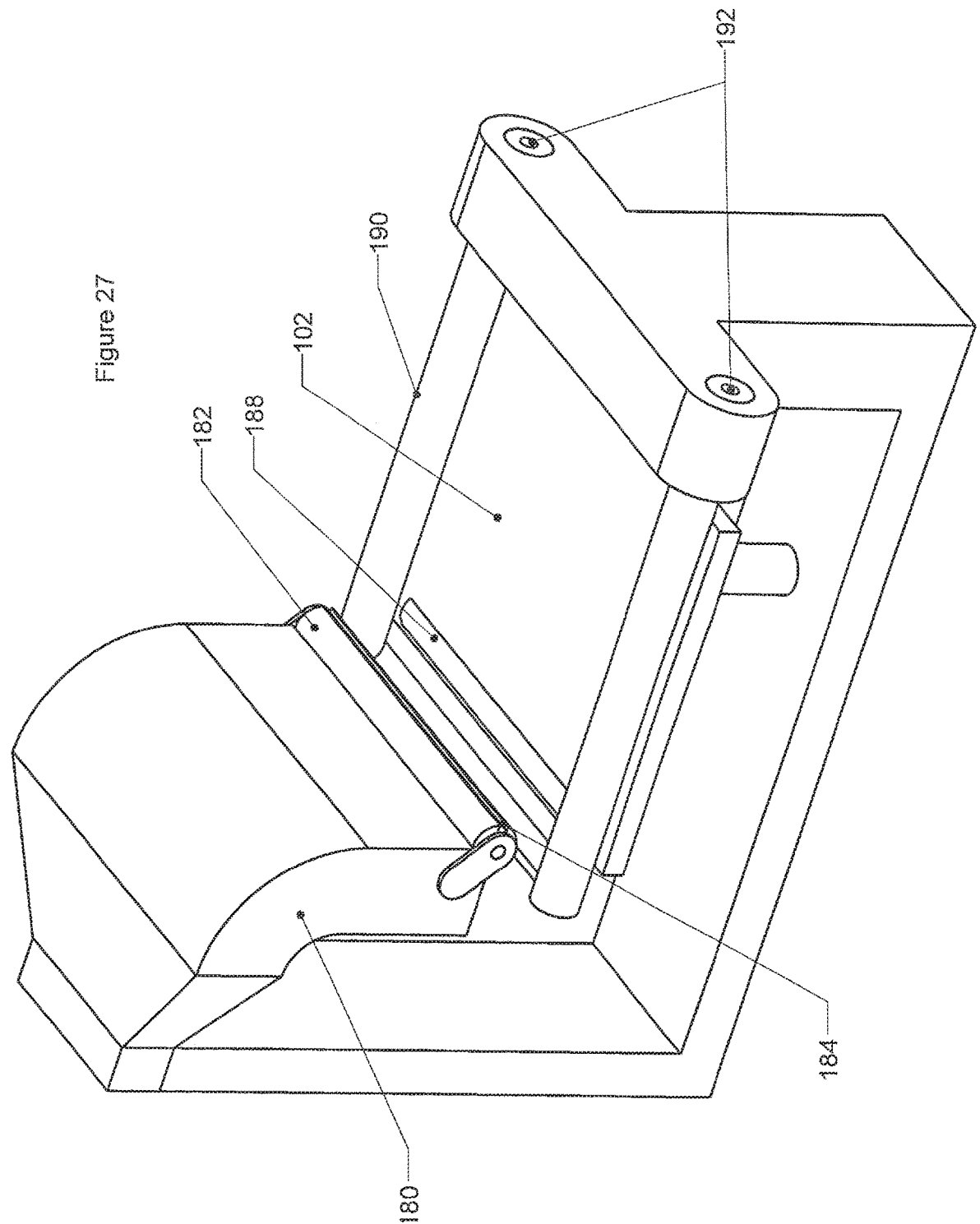
FIG. 27 is a left front perspective view of the device in FIG. 23 in a second position.
Figure 28:
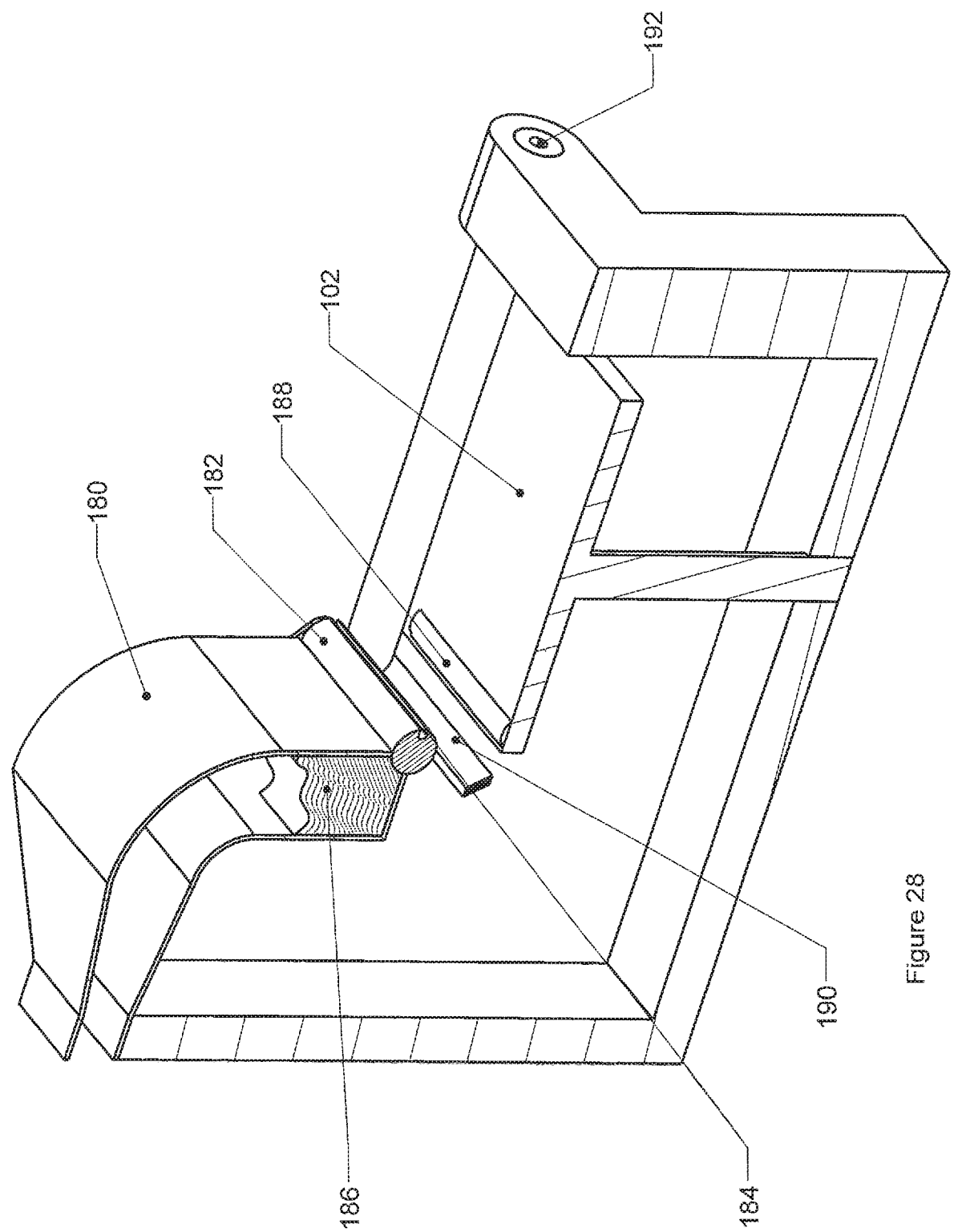
FIG. 28 is a left section view of the device in FIG. 27.
Figure 29:
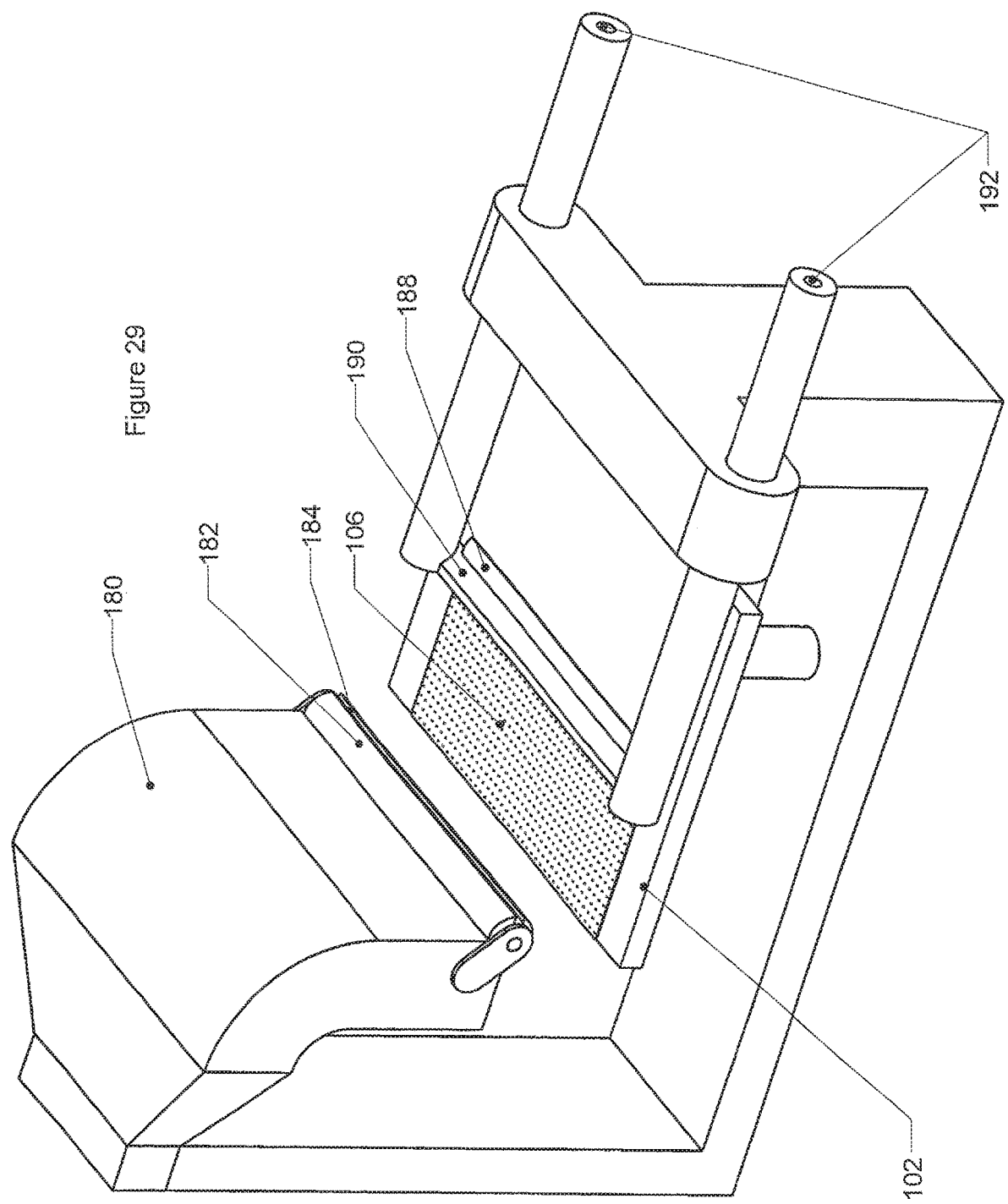
FIG. 29 is a left front perspective view of the device in FIG. 23 in a third position.
Figure 30:
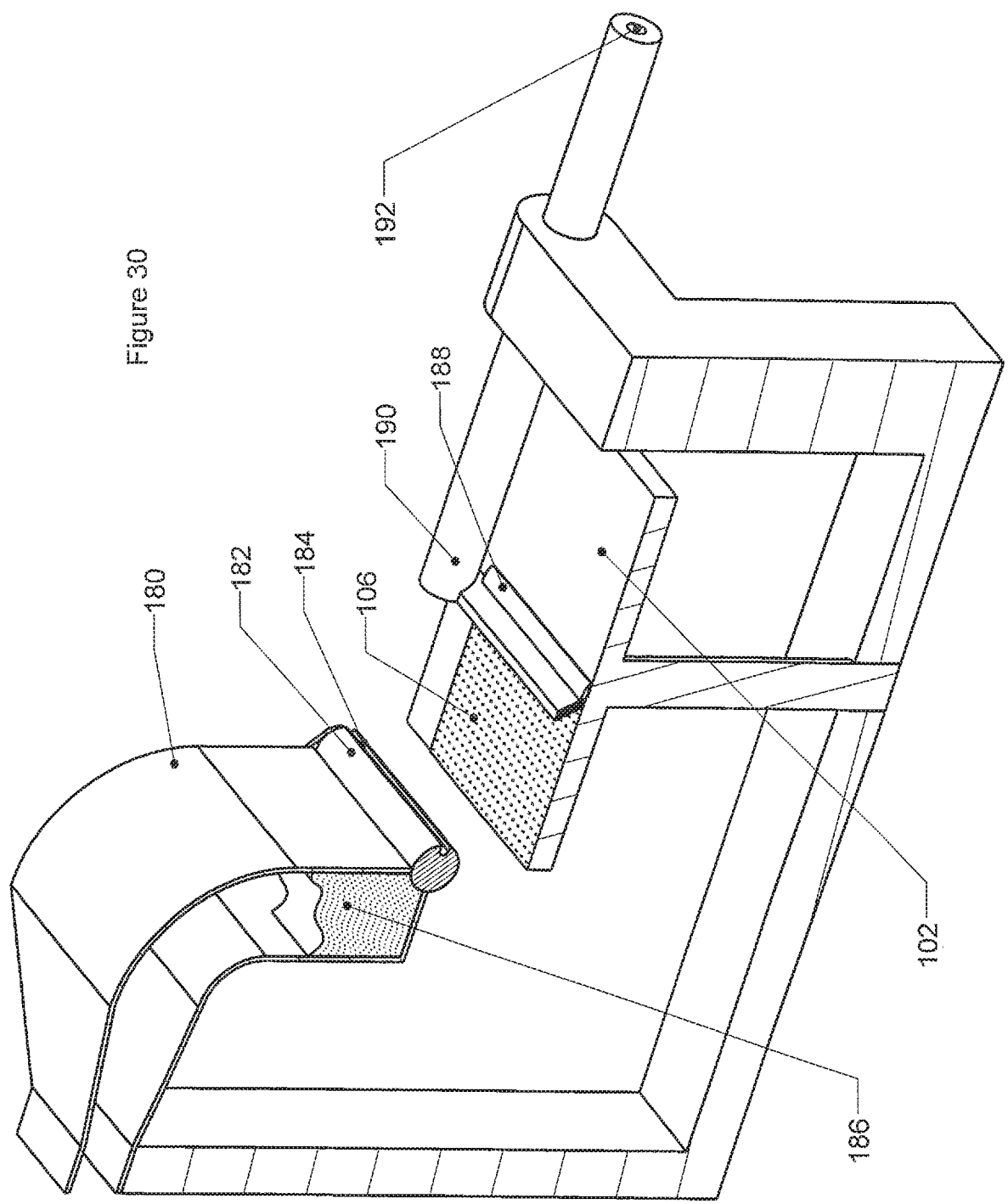
FIG. 30 is a left section view of the device in FIG. 29.
Figure 31:
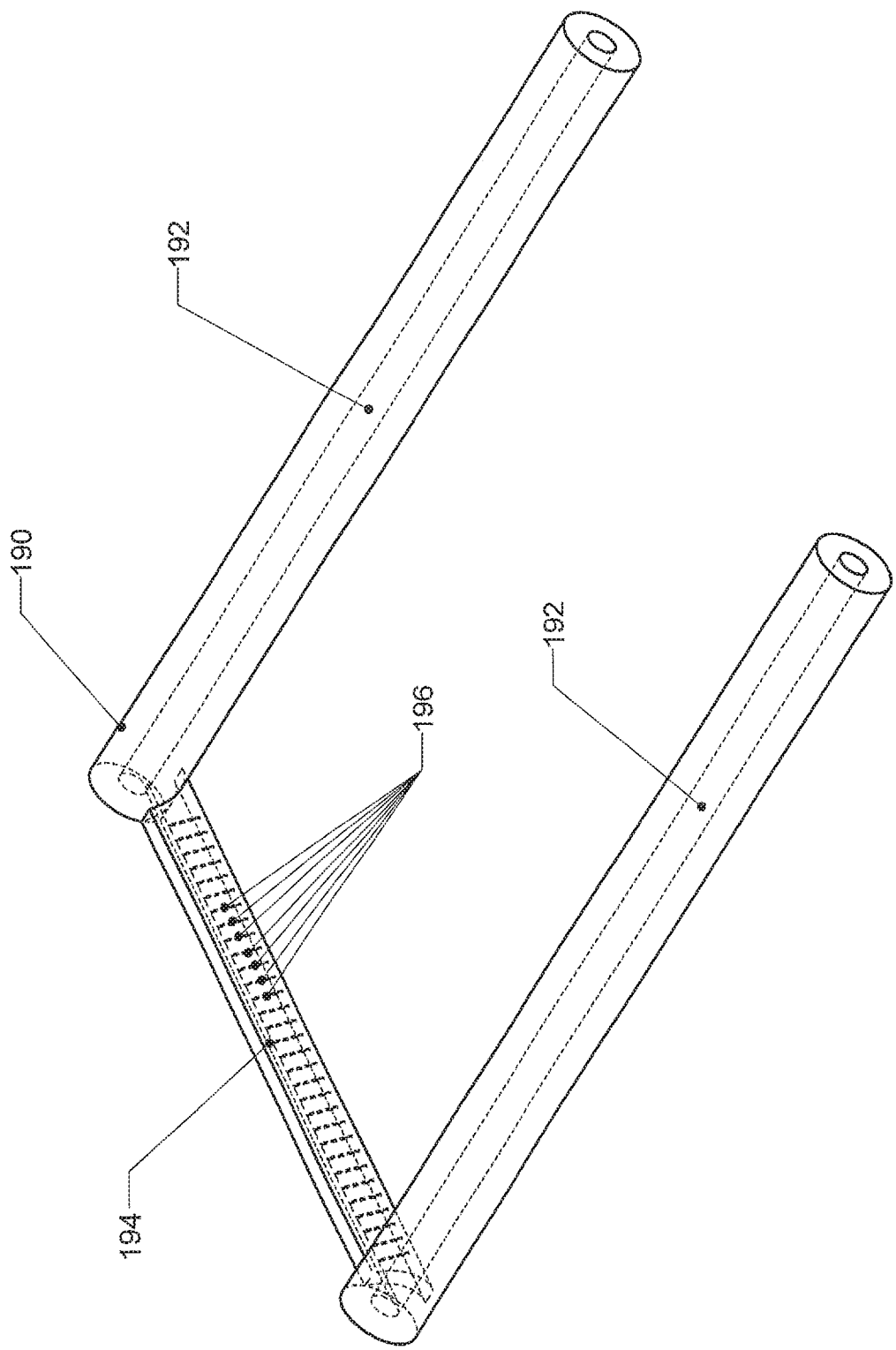
FIG. 31 is a perspective view of the powder sweeping and infusing blade of the device in FIG. 23.
Figure 32:
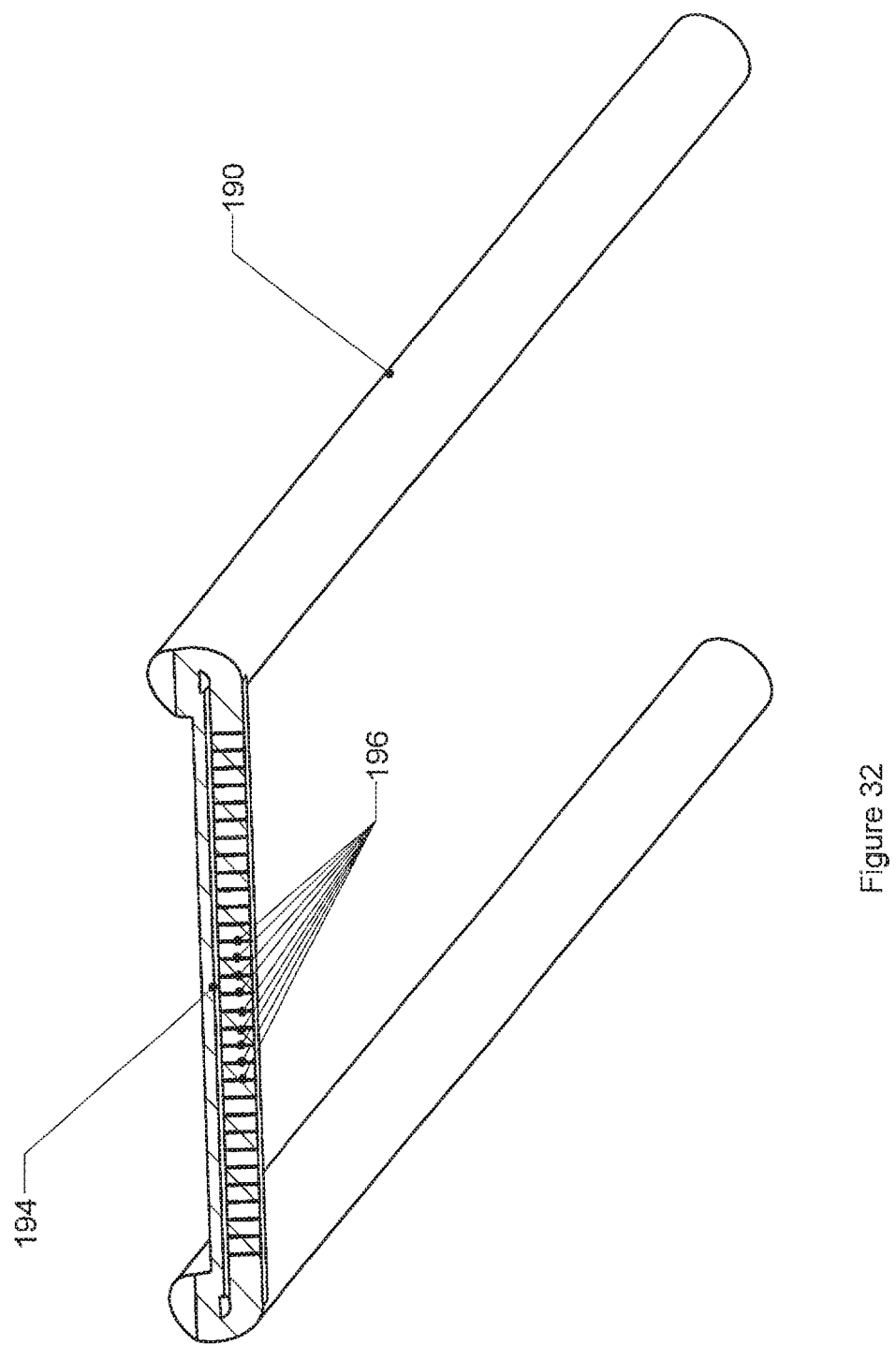
FIG. 32 is a section view of the component in FIG. 31.

FIGS. 21 and 22 show an alternate embodiment of the prism raster module (150) previously described. In contrast to the configurations discussed above in which the prism raster modules (150) were translated across the build surface (102), in this embodiment, the displaced beam of radiation (160) is reflected off of a stationary mirror (178) and onto a set of rotating mirrors (175) to scan the displaced beams (160) in a second dimension (e.g., different than the dimension across which the rotating prism (158) sweeps). The rotating mirrors (175) are controlled by an actuator (176). In the embodiment illustrated in FIGS. 21 and 22, the rotating mirrors (175) are presented in an elongate octagonal configuration, although those having ordinary skill in the art will appreciate that, in general, they may be provided in any of a variety of elongate polygonal configurations (e.g., pentagonal, hexagonal). Regardless of the particular configuration of rotating mirrors (175), the reflected beam (177) in this apparatus will follow a predetermined trace pattern (e.g., the path described in FIG. 14) as long as the rotating mirrors (175) are rotated at an appropriate speed relative to the raster speed of the imaging unit (150). Specifically, for example, the rotating mirrors (175) may be actuated such that as the beam (160) is displaced by the rotating prism (158), the angular displacement of the exigent beam (177) during the tracing of one raster line is approximately equal to the nominal diameter of the exigent beam (177). This will produce sequential, non-overlapping raster lines. The angular speed of the rotating mirrors (175) may be adjusted if overlapping lines are desired for a particular application. As one facet of the rotating mirrors (175) rotates past the incident beam (160), it will move to the next facet, repeating the pattern for the next layer. Thus, the full raster trace pattern will be carried out automatically with continuous rotation of the optical units, which may be conducted at high speed with minimal vibration. This is advantageous when compared to traditional SLA imaging units, which require mirrors to move back and forth to raster an imaged area. Inertial and vibrational effects are limiting factors in traditional devices when optimizing imaging speed.

As shown in FIGS. 21 and 22, the optical elements utilized to convert the linear rastering beam (160) of the imaging unit (150) into an area rastering pattern are a stationary mirror (178) and a set of rotating mirrors (175). In some embodiments, the mirrors are flat. Alternatively, one or more of the stationary mirror (178) and/or the rotating mirrors (175) may be curved to produce different optical effects. Specifically, for example, if the stationary mirror (178) is slightly convex, and the rotating mirrors (175) are correspondingly concave, then the width of the raster path achieved at the build surface (102) will be wider than the width of the raster path traced by the beam (160) emitted by the imaging unit (150). The convexity and concavity of the mirrors used may be chosen to maintain beam collimation while producing this effect, and may also be chosen to reduce raster path width rather than increase it. Additionally, other optical elements, such as lenses, may be inserted at various points along the optical path to achieve a similar effect.

Regardless of the particular configuration, the net result of combining a rotating prism apparatus imaging unit (150) for primary beam displacement and a rotating mirror set (175) for secondary beam displacement is a rapid rastering device for a particular target area. In general, this may be achieved with any combination of prisms and rotating mirror sets (e.g., two rotating prisms, two rotating sets of mirrors, or a set of rotating mirrors may be used for primary beam displacement while a rotating prism is used for secondary beam displacement). The benefits of using constant velocity rotating optical elements will largely be the same regardless of configuration, though particular choices may be made to optimize the system for a particular application.

The previously described imaging techniques may generally apply to any SFF device utilizing photocurable resin as a building material. They may also apply when so-called "hybrid resins" are used; this term is generally used to describe resins with particulate materials included in their composition. These resins typically contain dispersants which allow for particulate matter to remain suspended in the resin solution. The particle loading in these resins is limited in order to keep the viscosity of the suspension low enough to permit the creation of new layers of material in a SFF device; this particle loading can be a limiting feature in the hybrid resin's usability as a precursor for parts that will later be sintered. Collections of particles of either metallic or ceramic composition bound together with resin may be treated thermally and chemically to remove the binder and sinter the particulate matter together to form a solid part. In this manner, conventional SLA techniques may be used to produce ceramic and metallic parts. The limitations of viscosity and shelf life (due to particle agglomeration) pose challenges for the use of hybrid resins for advanced applications. The process of creating a layer of material from a mixture of photocurable resin and particulate material wherein the two materials remain separate until the layer creation process may be advantageous in many respects, given that it allows different combinations of particulate material and photocurable resin to be made without premixing, and may circumvent rheological limitations in layer production, as will be described hereinbelow.

FIGS. 23-32 depict apparati and components for the deposition of a composite layer of material for use in a SFF process. In the illustrated embodiments, a powder hopper (180) is positioned above an edge of a build surface (102). The powder hopper (180) has a powder dispenser (182) with a powder dispensing groove (184), the powder dispenser (182) being rotatable such that the powder dispensing groove (184) is selectively in communication with either the powder hopper (180) or the build surface (102). When the powder dispensing groove (184) is within the powder hopper (180), it can receive powder (186) therein. When the powder dispenser (182) rotates such that the powder dispensing groove (184) is facing towards the build platform (102), it can be configured to deposit a quantity of powder (188) onto the build platform (102). At this point, in some embodiments, a powder leveling blade (190) may move across the build platform (102), producing a layer of powder. Powder leveling blade (190) can further include one or more resin input ports (192) that are configured to receive resin from a resin supply. In some embodiments, for example, the resin input ports (192) together or individually supply resin to a primary resin channel (194) interior to the blade portion of the powder leveling blade (190), and one or more resin infusion channels (196) branch from the primary resin channel (194) and terminate at the edge of the powder leveling blade (190) such that as the blade (190) levels the powder (188), resin may be pumped in and blended with the resin to form a material layer (106). The process of depositing powder may also be done independently of the resin infusion process.

Figure 33:
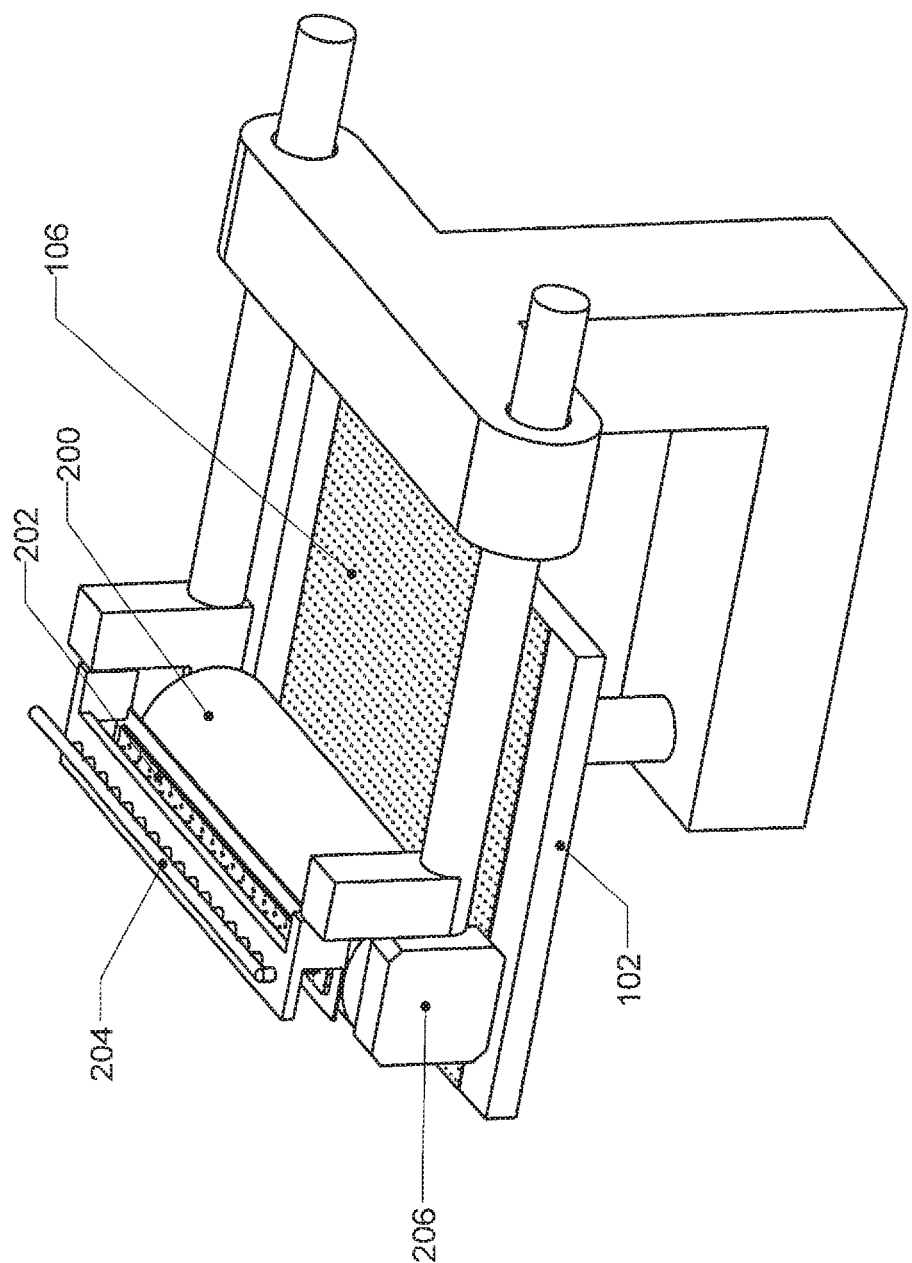
FIG. 33 is a left perspective view of a second embodiment of a layer deposition device for use in any embodiment of the presently disclosed subject matter.
Figure 34:
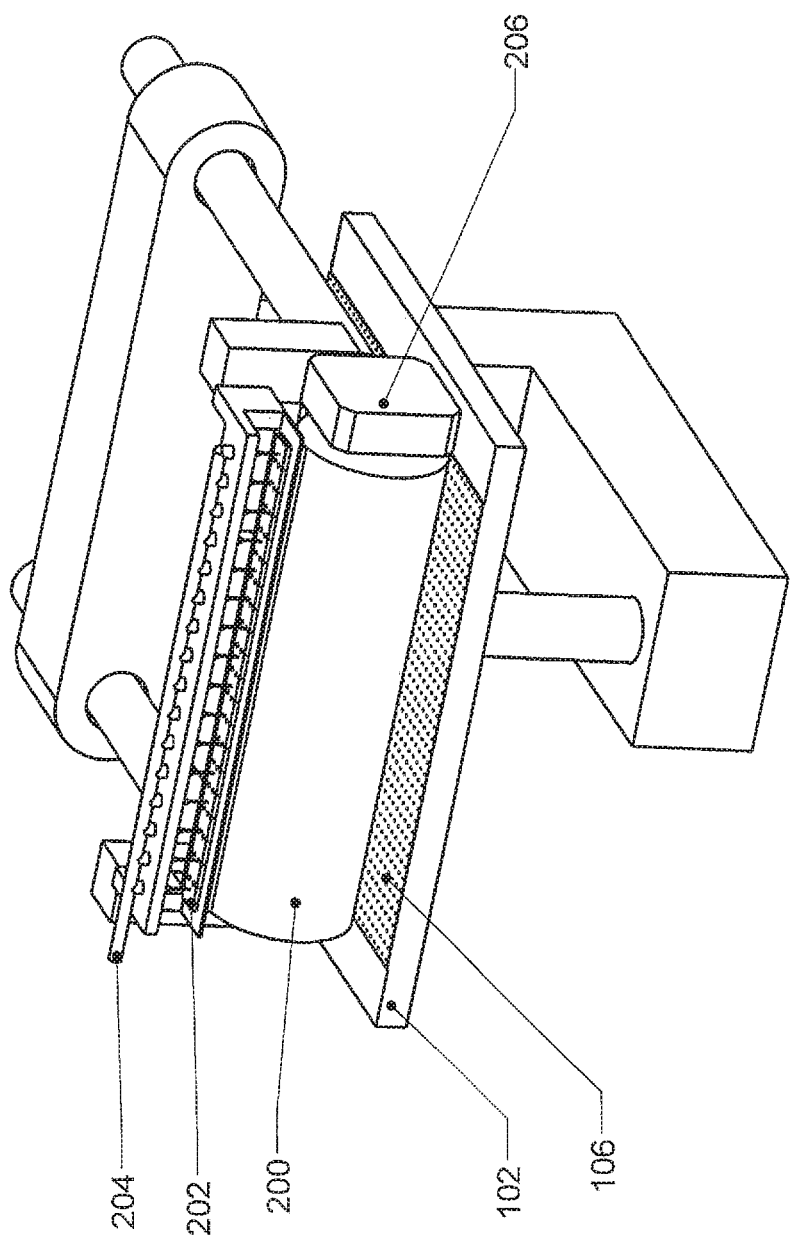
FIG. 34 is a left rear perspective view of the device in FIG. 33.
Figure 35:
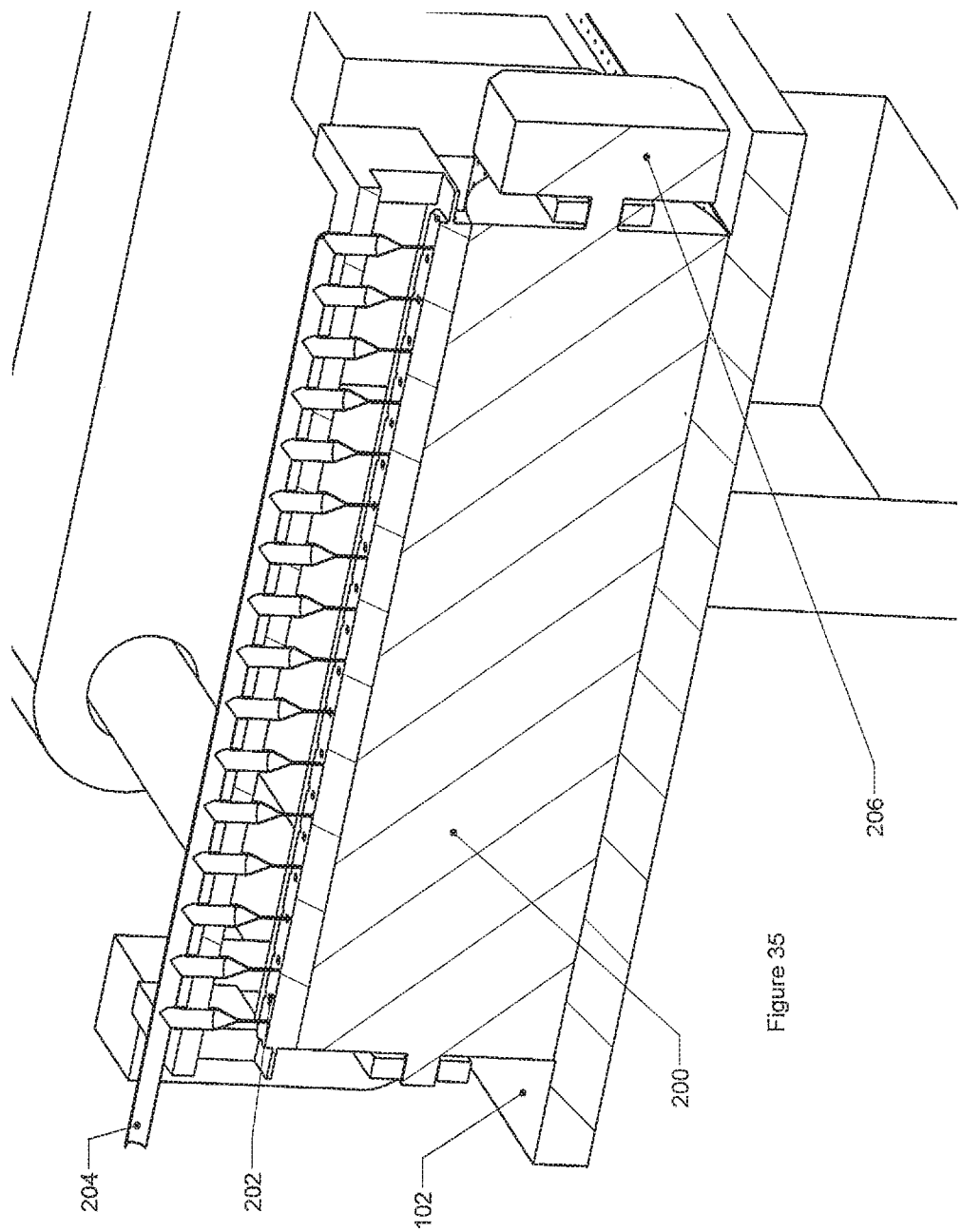
FIG. 35 is a rear section view of the device in FIG. 34.
Figure 36:
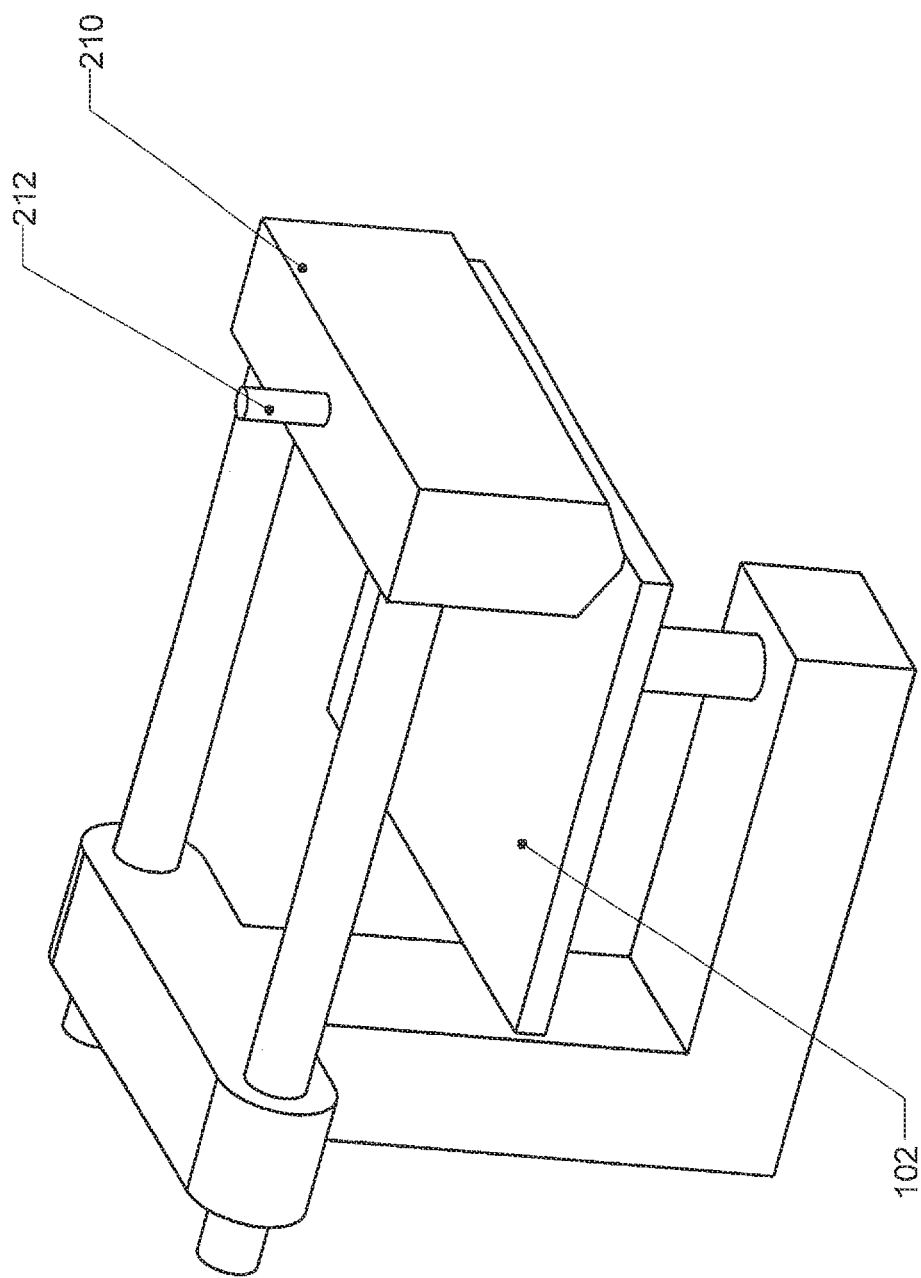
FIG. 36 is a left perspective view of an embodiment of a material deposition device for use in any embodiment of the presently disclosed subject matter.
Figure 37:
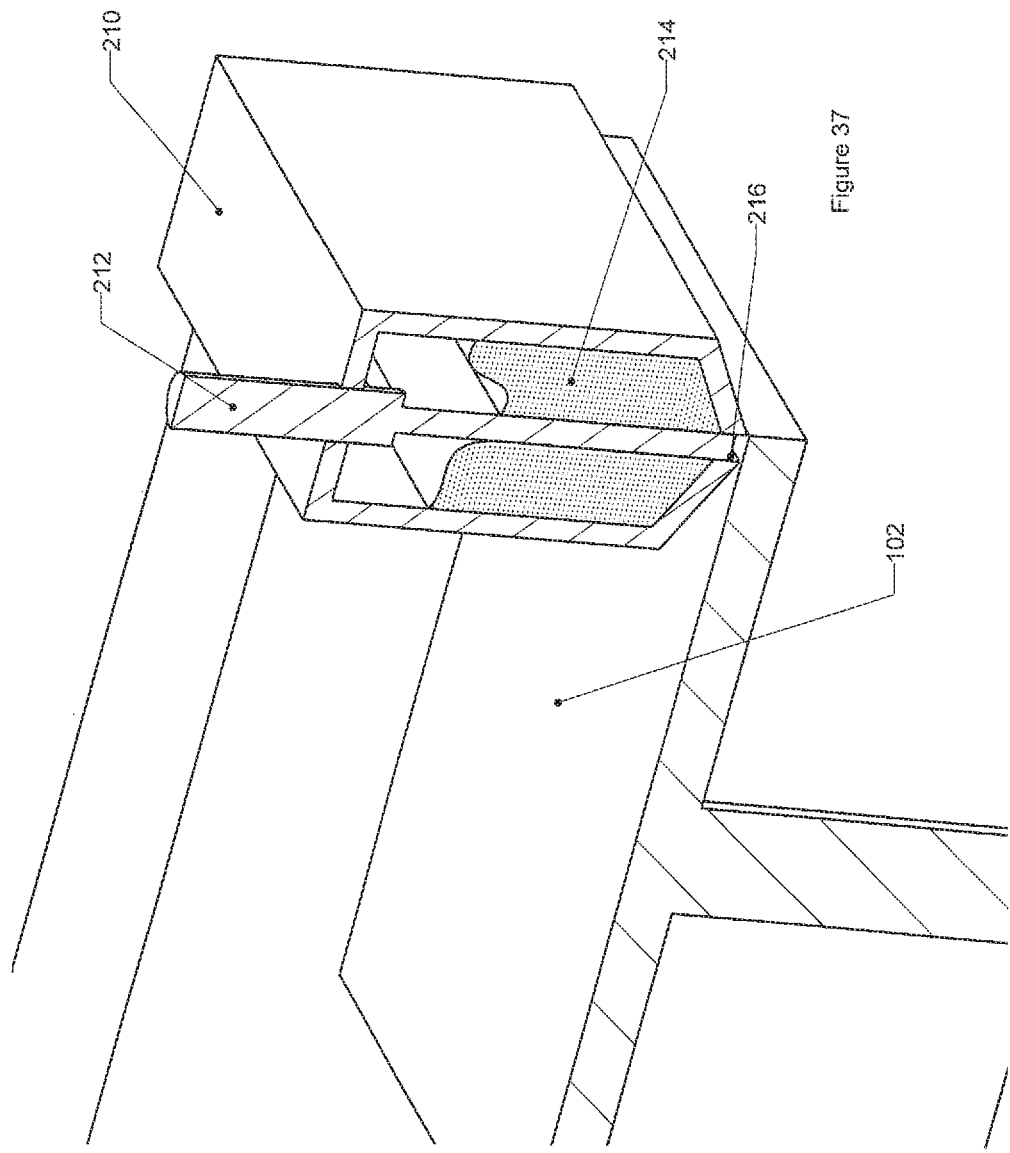
FIG. 37 is a left section view of the device in FIG. 36.
Figure 38:
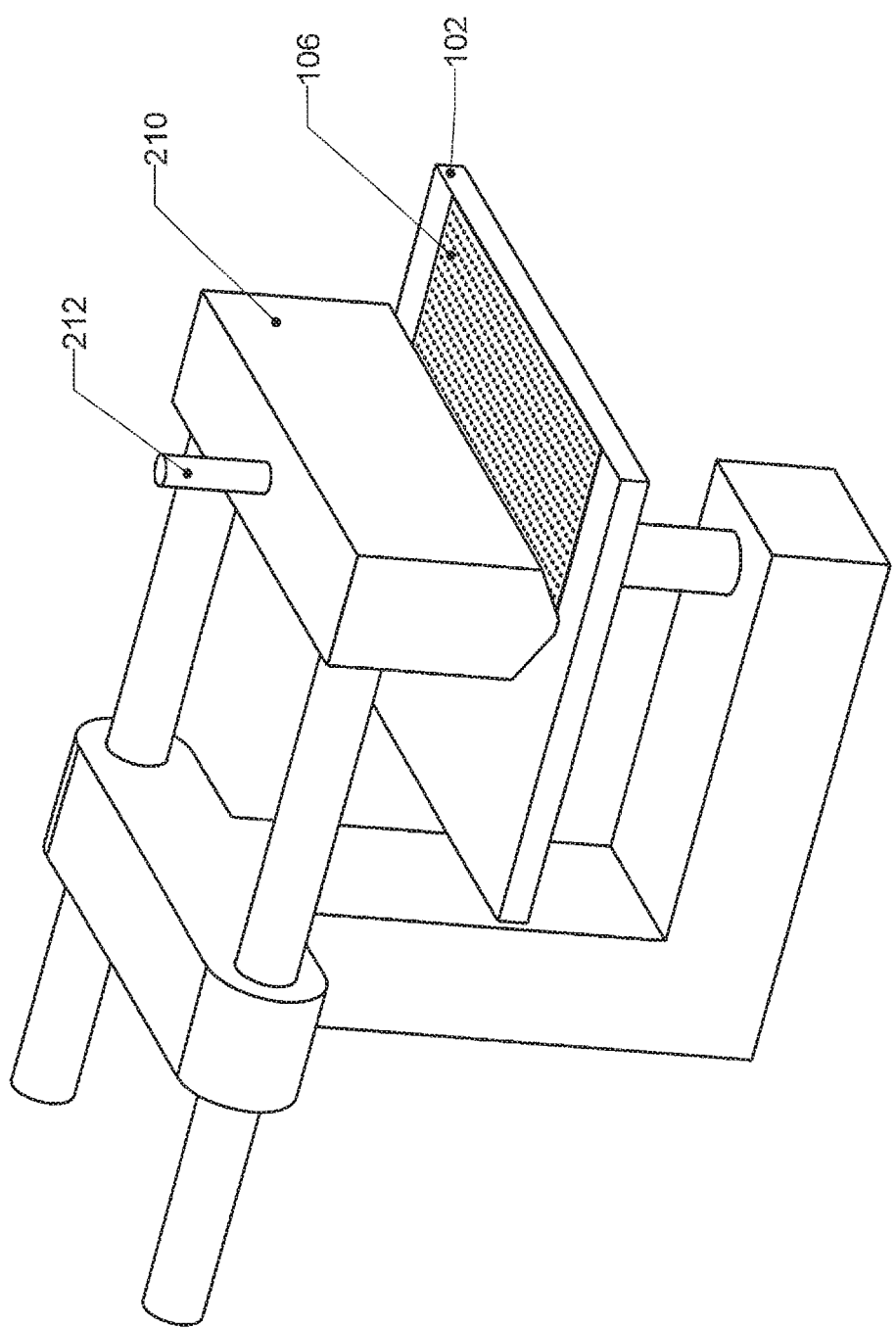
FIG. 38 is a left perspective view of the device in FIG. 36 in a second position.
Figure 39:
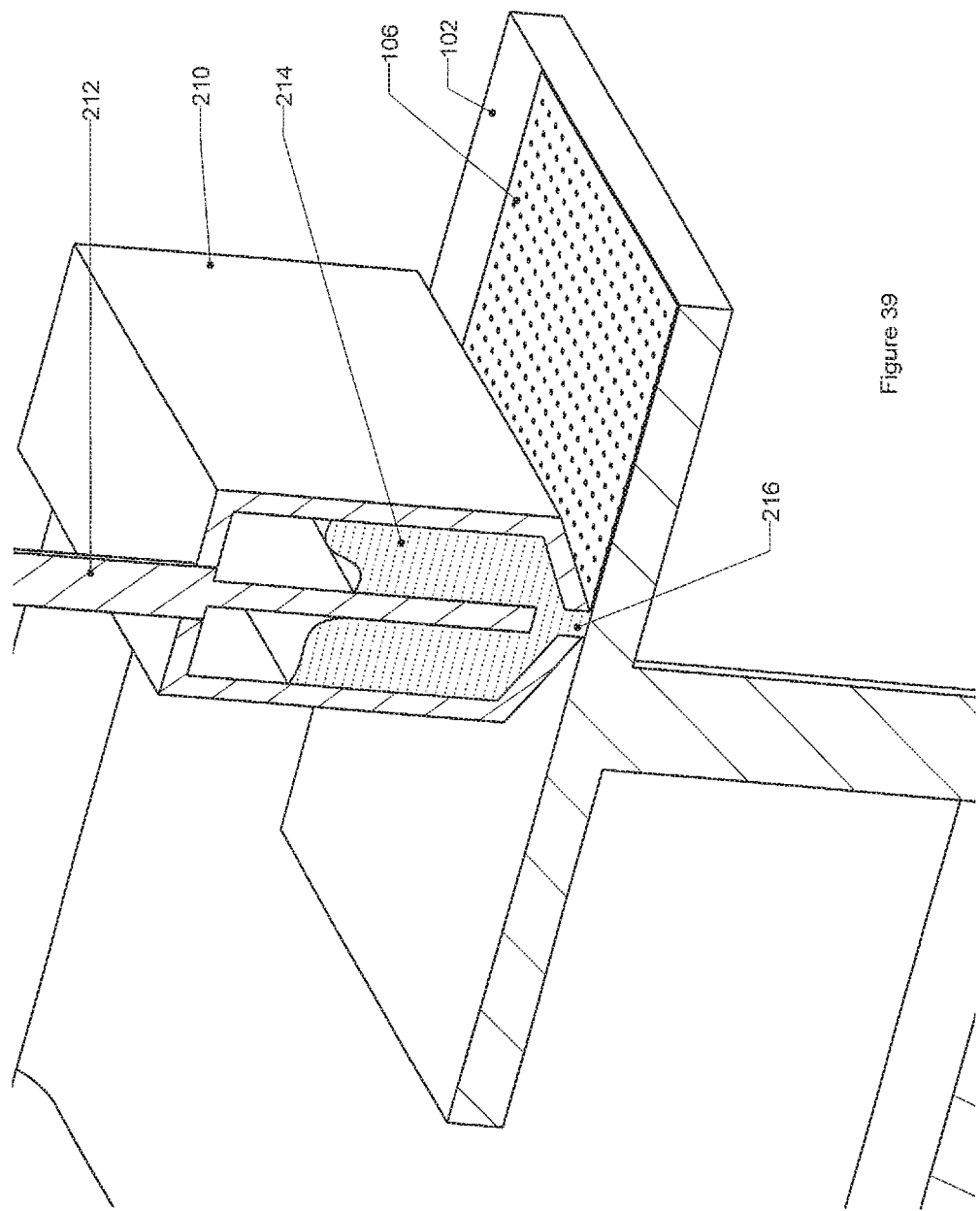
FIG. 39 is a left section view of the device in FIG. 38.
Figure 40:
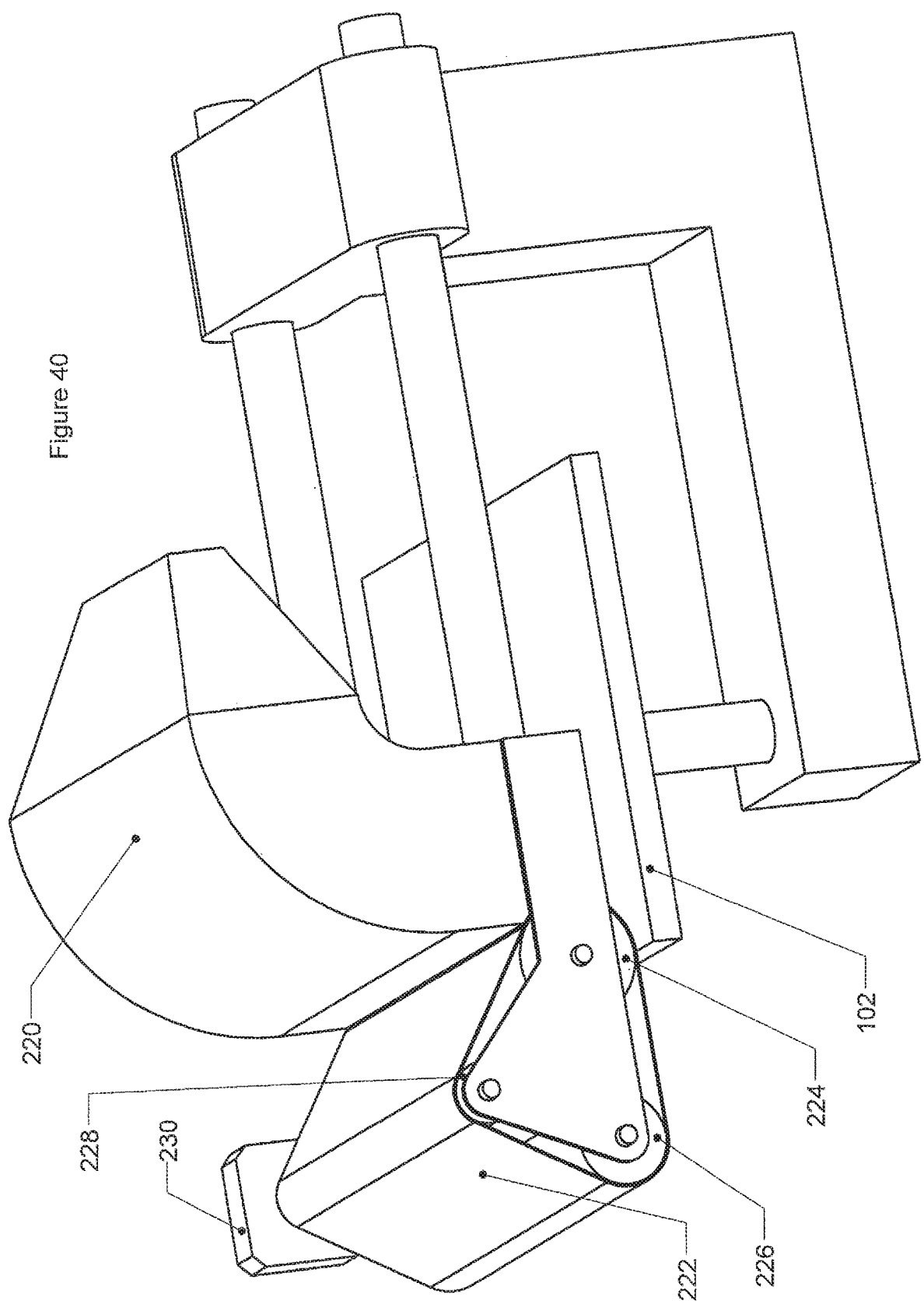
FIG. 40 is a right perspective view of a second embodiment of a material deposition device for use in any embodiment of the presently disclosed subject matter.
Figure 41:
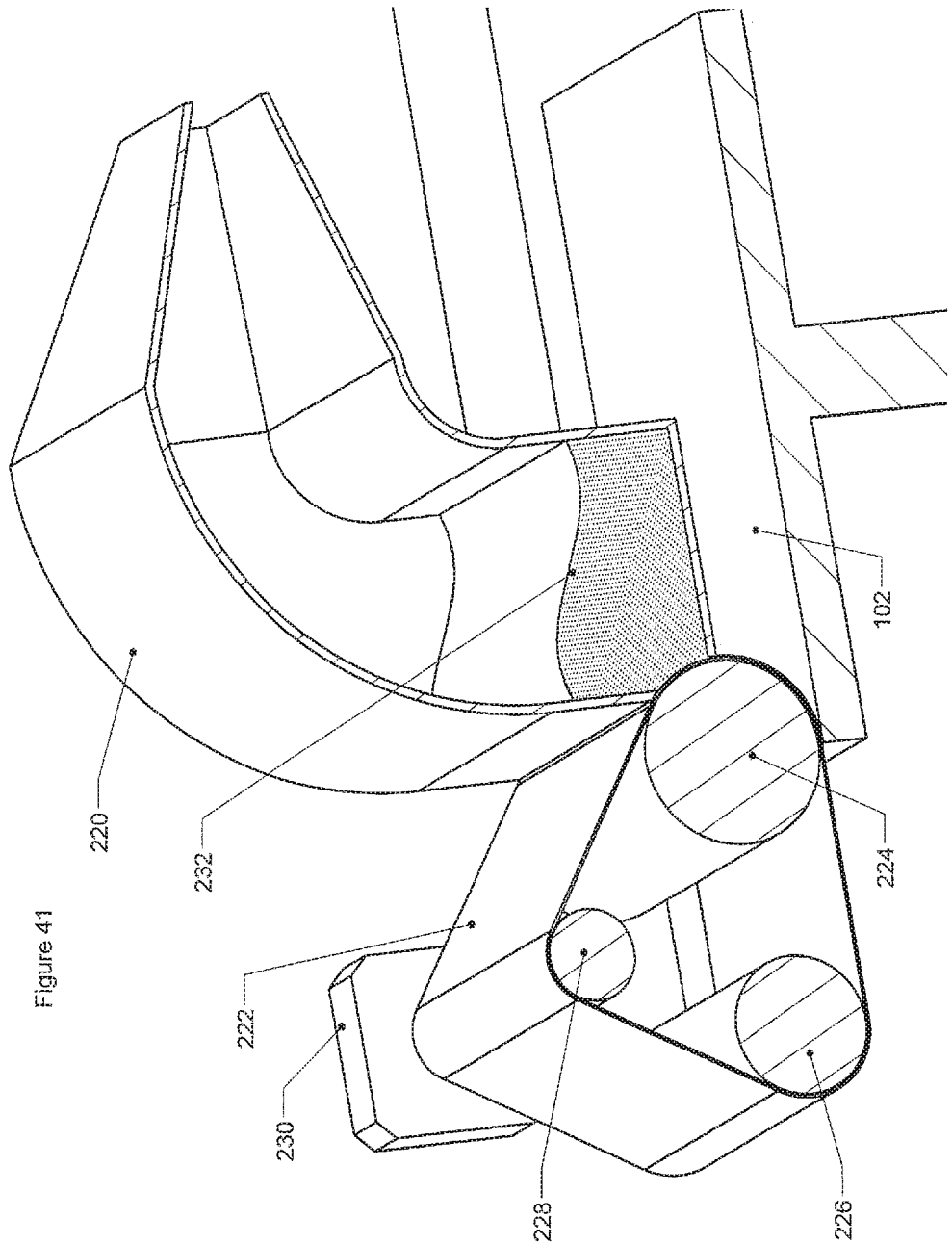
FIG. 41 is a right section view of the device in FIG. 40.
Figure 42:
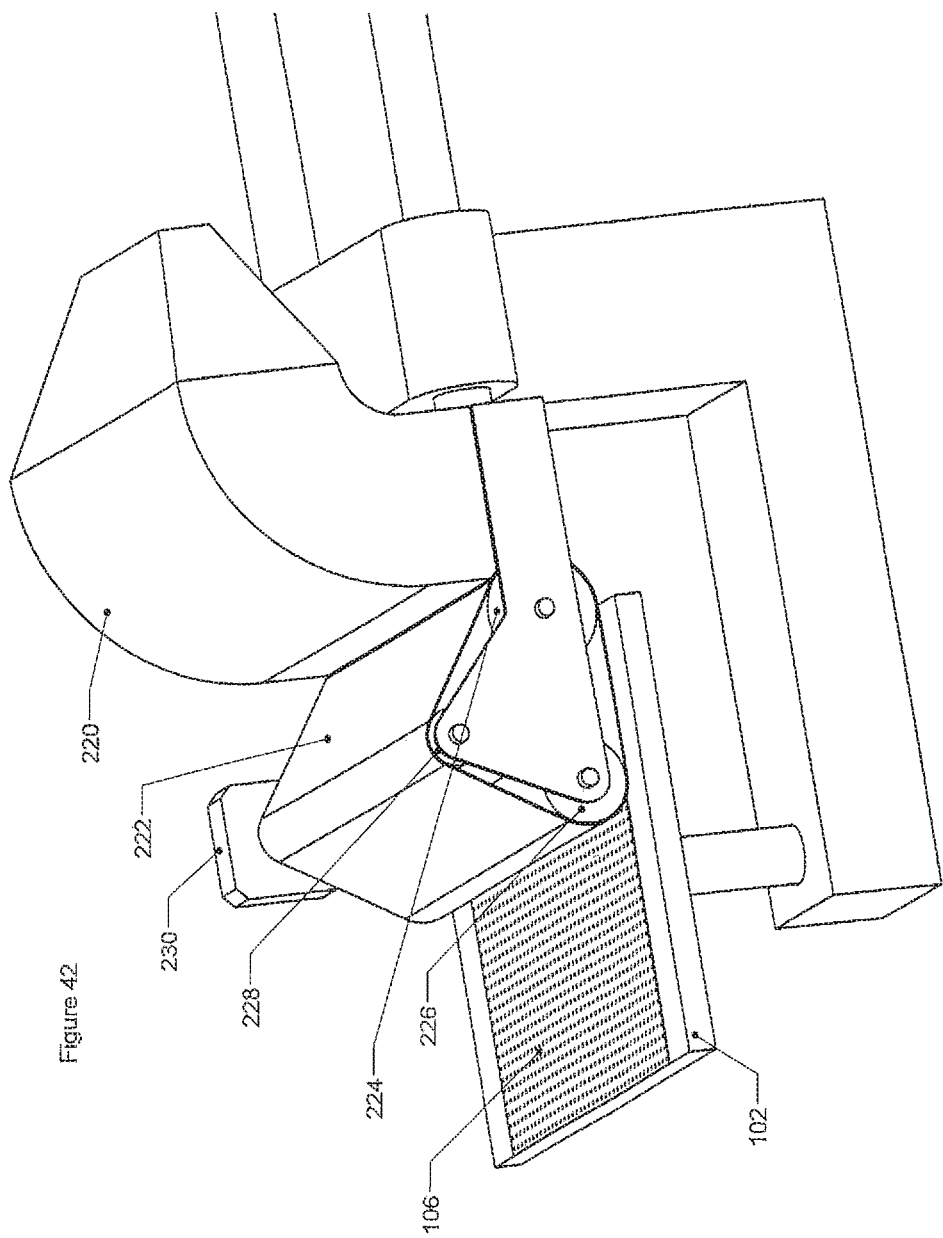
FIG. 42 is a right perspective view of the device in FIG. 40 in a second position.
Figure 43:
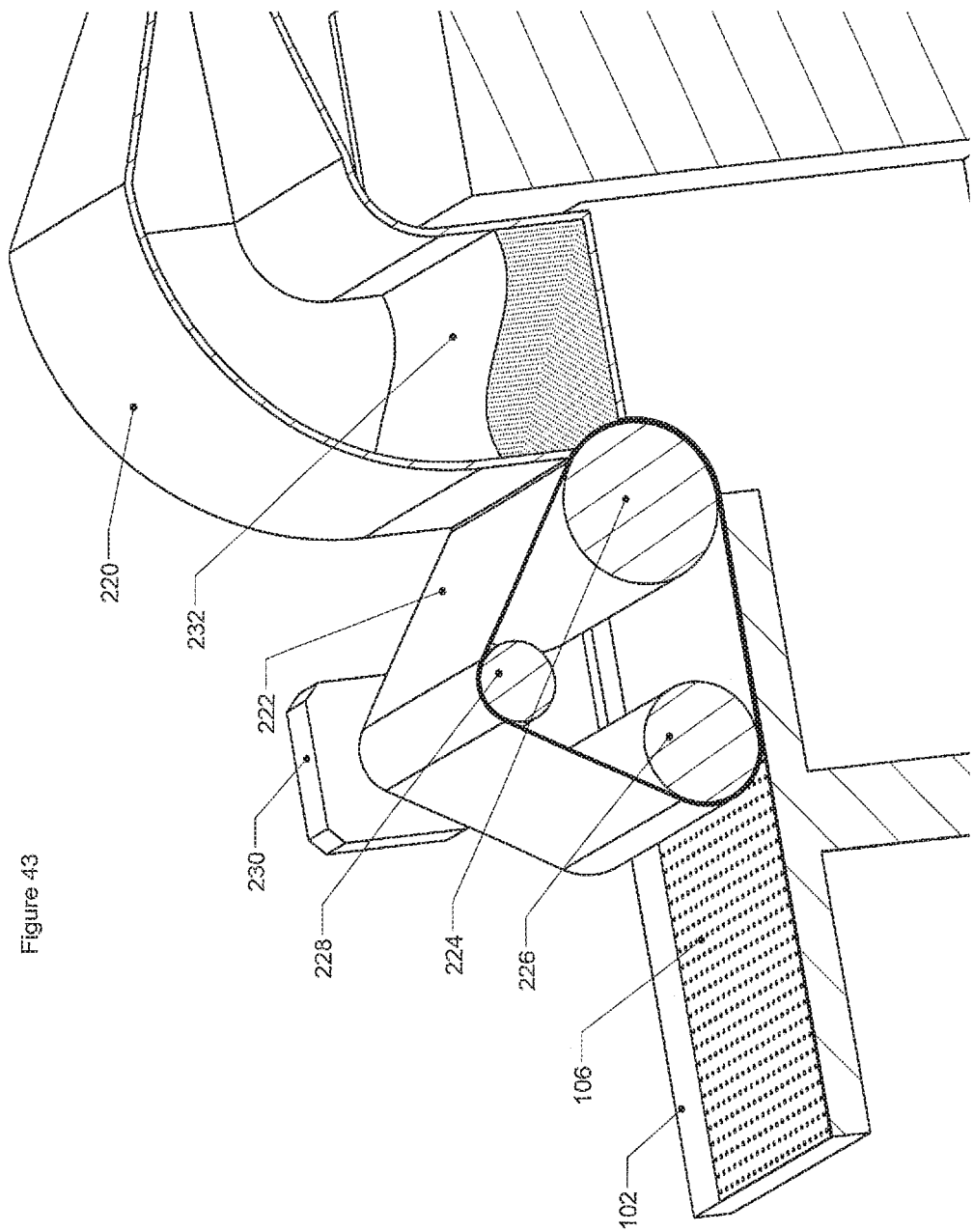
FIG. 43 is a right section view of the device in FIG. 42.
Figure 44:
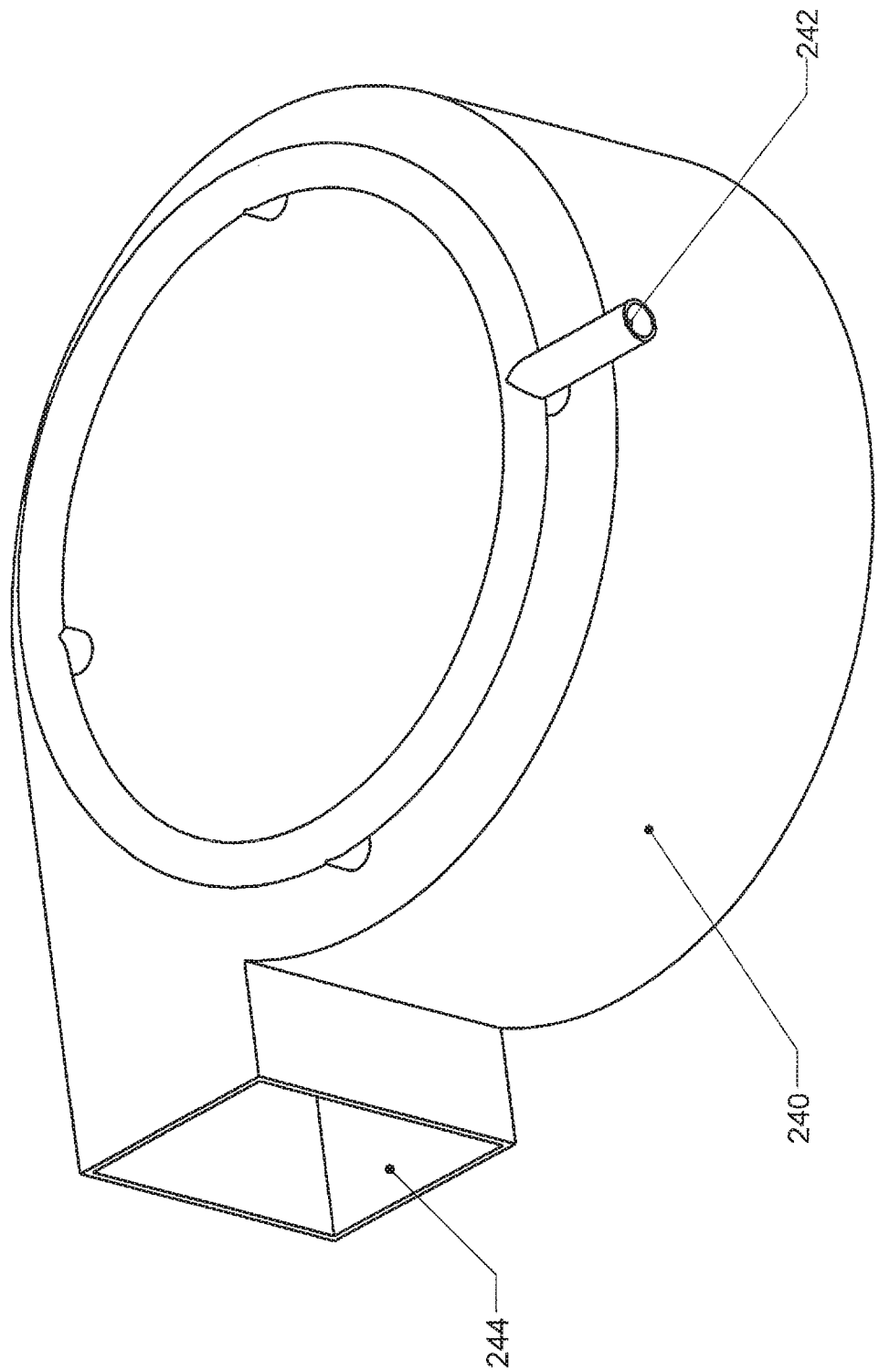
FIG. 44 is a right perspective view of an embodiment of a powder resupply device for use in any embodiment of the presently disclosed subject matter.
Figure 45:
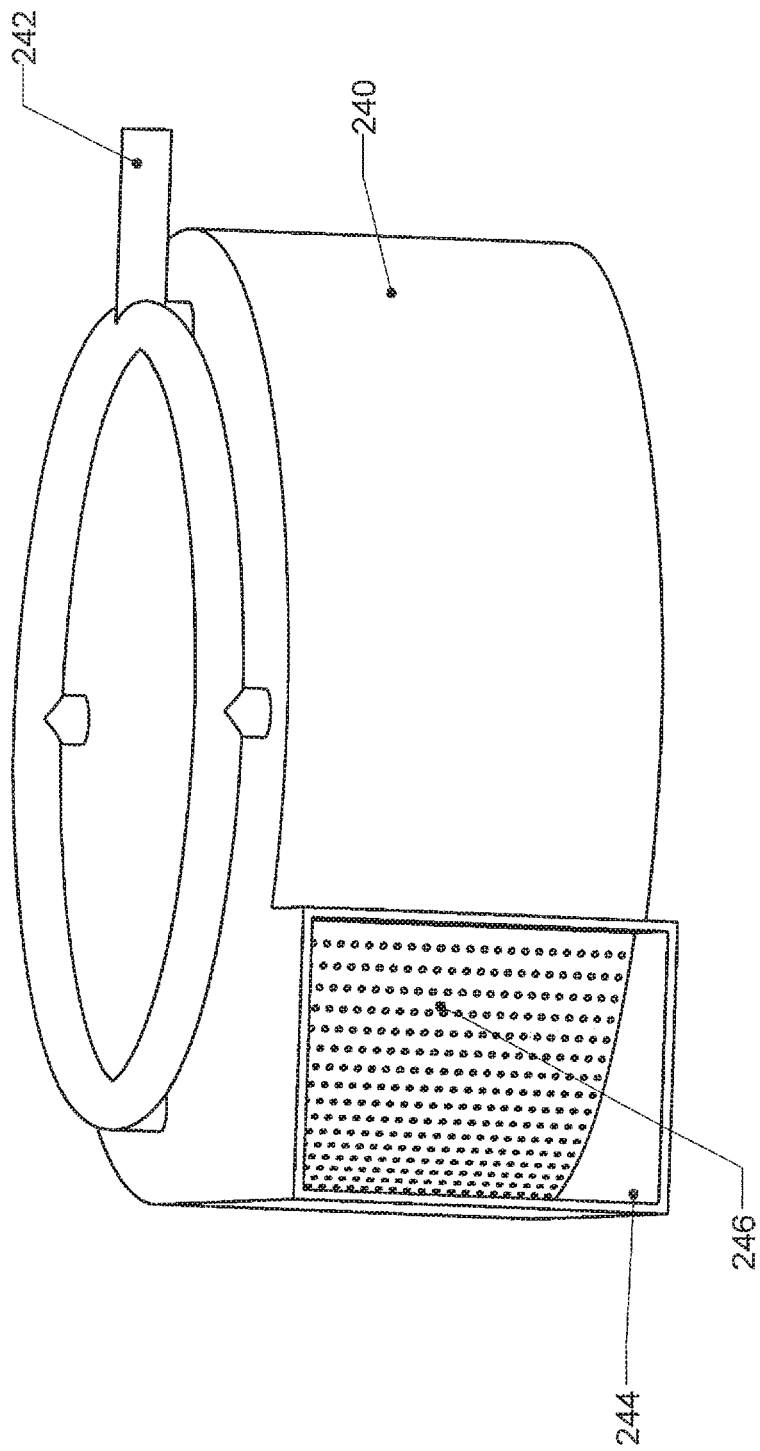
FIG. 45 is a front perspective view of the device in FIG. 44.
Figure 46:
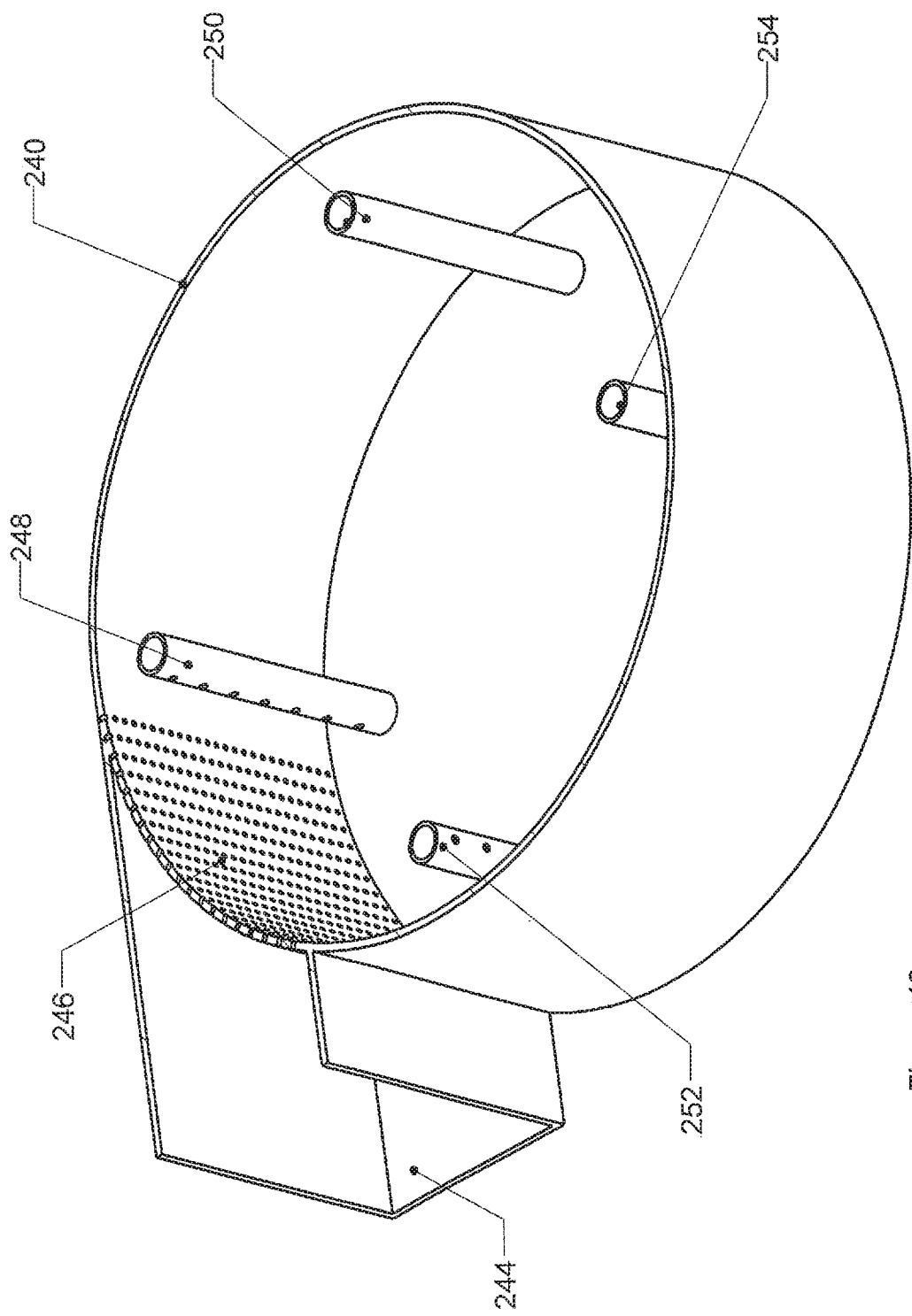
FIG. 46 is a right top section view of the device in FIG. 44.
Figure 47:
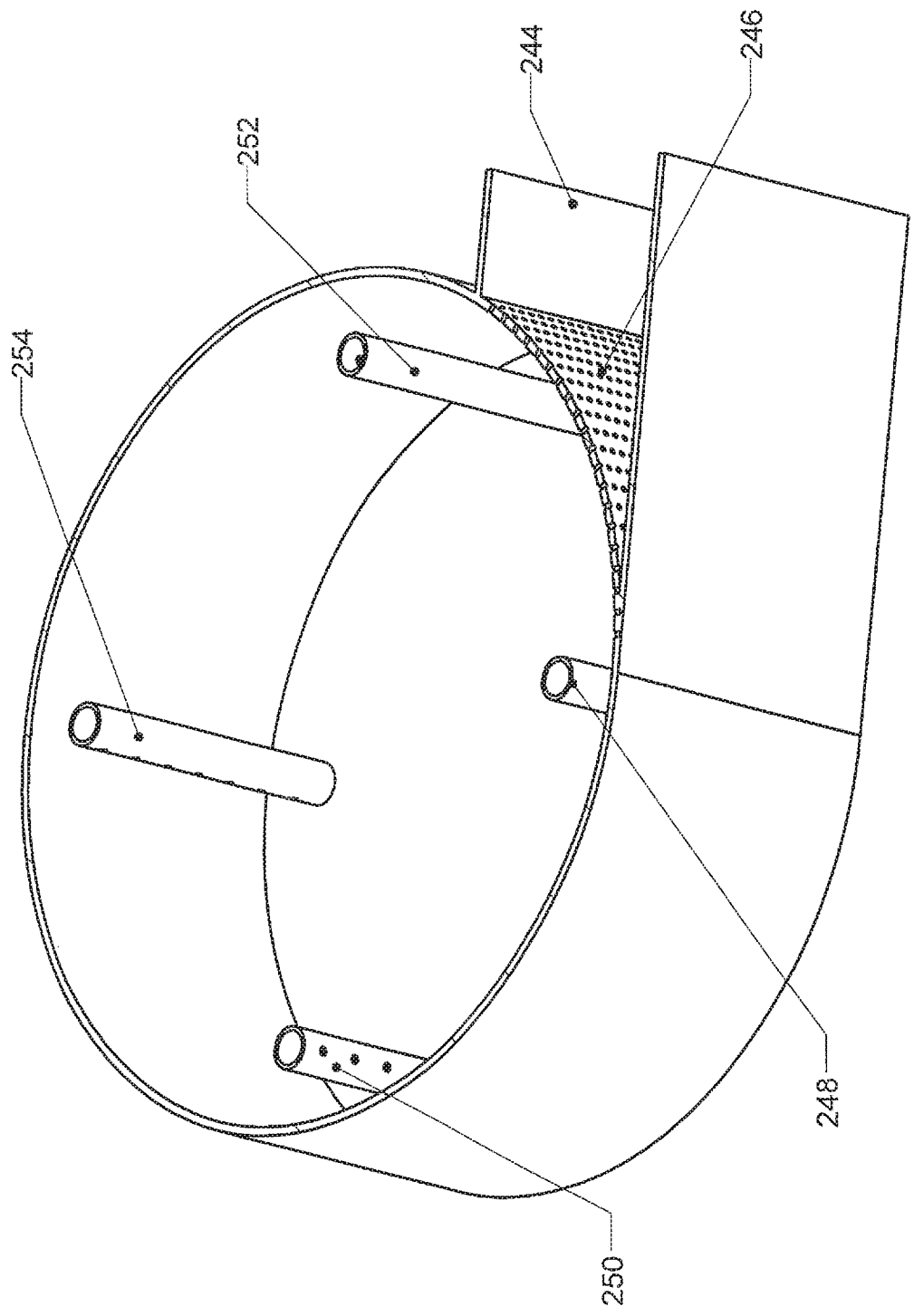
FIG. 47 is a left top section view of the device in FIG. 44.
Figure 49:
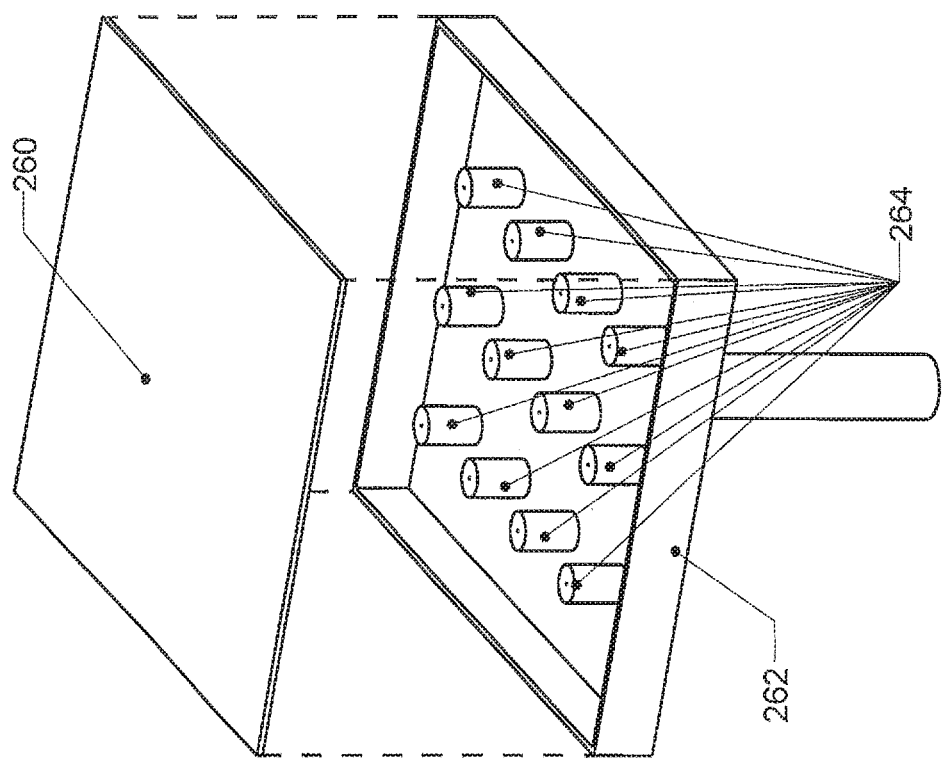
FIG. 49 is an exploded perspective view of the device in FIG. 48.
Figure 48:
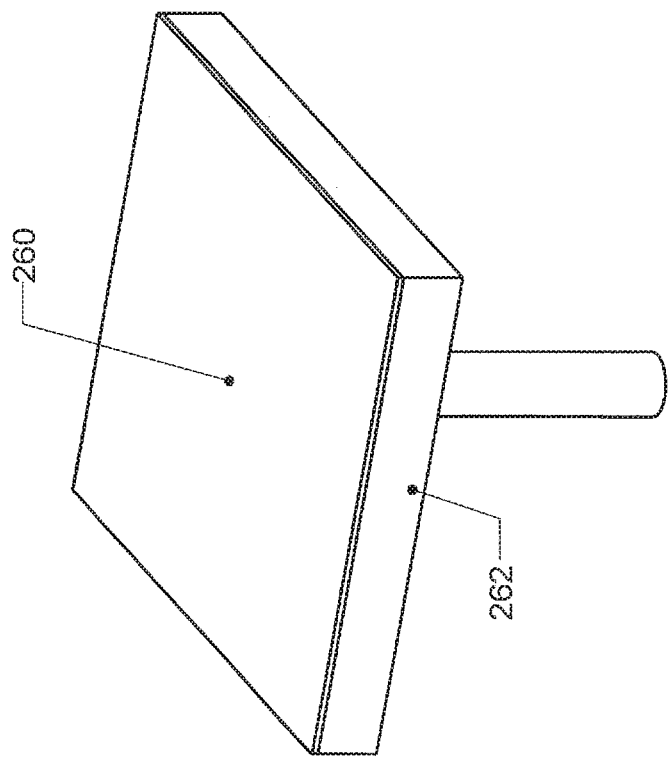
FIG. 48 is a perspective view of an embodiment of a build platform for use in any embodiment of the presently disclosed subject matter.
Figure 50:
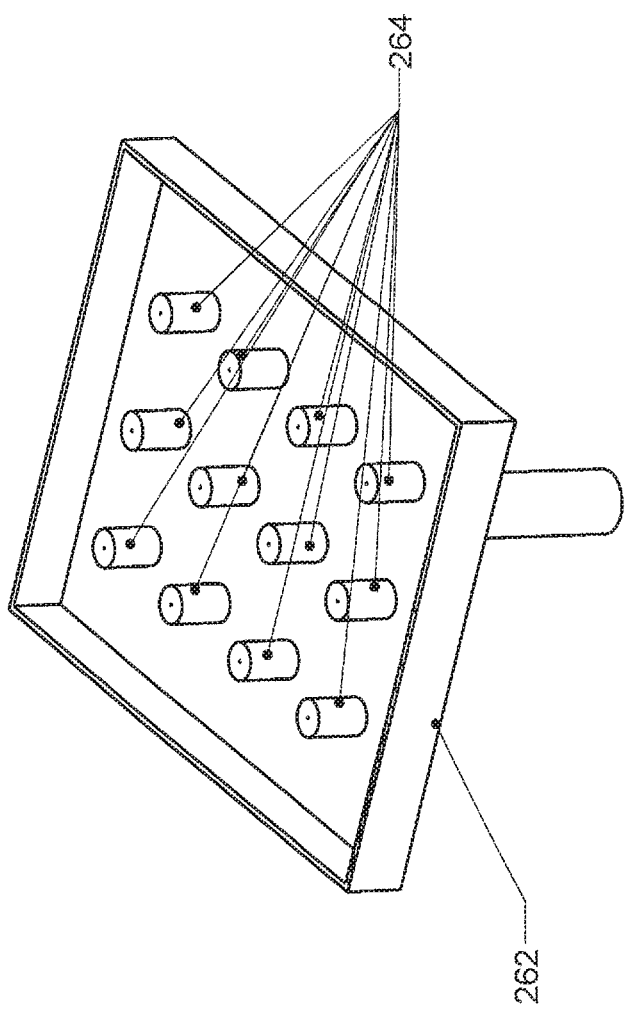
FIG. 50 is a perspective view of the sensor array of the device in FIG. 48.
Figure 51:
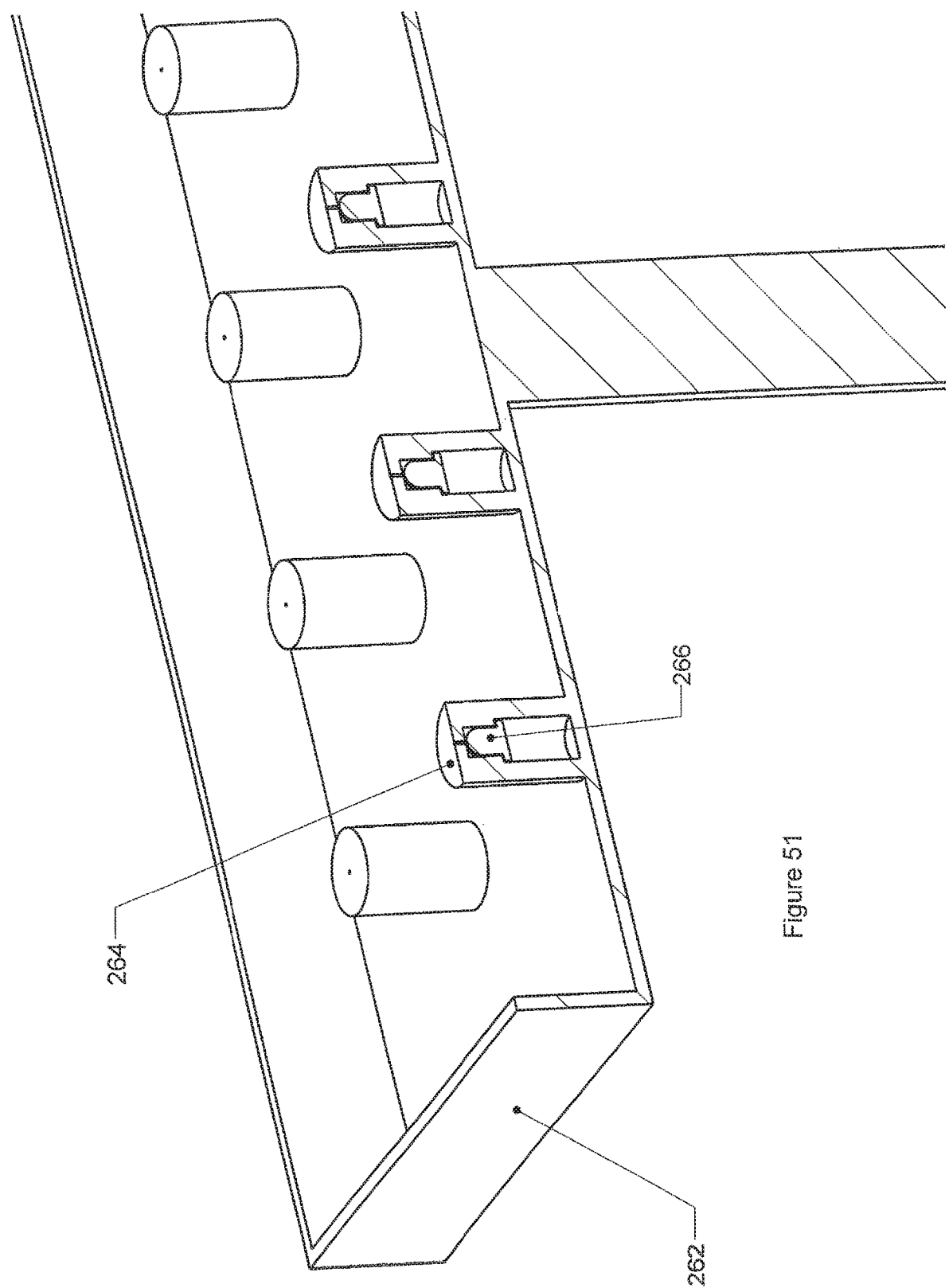
FIG. 51 is a section view of the sensor array in FIG. 50.

FIGS. 33-35 depict an alternative system for composite material layer production. As depicted, these figures presume the initial deposition of a layer of powder, but the order of material deposition may be arbitrary. The process of infusion, to create a material layer (106) involves pumping resin through a resin dispenser (204) containing many needles for dispensing resin into a diffusing material, such as a sponge (202). The diffused resin coats the outside of a roller (200) which rolls across a material layer (106), infusing it with resin. Rotation of the roller (200) is controlled by an actuator (206). Rotation of the roller (200) may be controlled such that tangential velocity is greater than, less than, or equal to translational velocity, in order to achieve desired infusion behavior.

FIGS. 36-39 depict a system for powder deposition for creating a composite material layer. A powder hopper (210) contains powder (214) held back by a powder retainer (212). When the powder retainer (212) is raised, powder (214) may exit the aperture (216) of the powder hopper (210). The spacing between the powder hopper (210) and the build platform (102) will control the thickness of the material layer (106) created as the hopper (210) moves across the platform (102).

FIGS. 40-43 depict another system for powder deposition for creating a composite material layer. A powder hopper (220) dispenses powder (232) onto a film (222) which passes around three rollers (224,226,228). The drive roller (228) is driven by an actuator (230) and causes the film (222) to move and actuate the other rollers (224,226). The primary layer roller (224) transfers powder (232) from the powder hopper (220) to the build surface (102). The secondary powder roller (226) controls the film (222) position relative to the build platform (102) and can apply added compression to the material layer (106). The powder hopper (220) may be resupplied from an external source, which may also apply an electrical charge to the powder, as in a powder coating gun. Standard industrial techniques exist for applying a static charge to powder; in this apparatus, the primary layer roller (224) may be grounded, and the applied electric charge may cause powder to cling to the film (222) as it is dispensed from the hopper (220), which may aid in maintaining consistency when dispensing material layers (106).

FIGS. 44-47 depict a powder resupply unit (240). The aforementioned powder hopper (220) or any other powder dispensing device previously described may be resupplied with powder from this unit (240) which may be located away from the build area (102). The powder resupply unit (240) has an exit port (244) from which aerated powder will flow and which can be connected to any vessel requiring a supply of powder. Air, or other gas, is pumped into the aerator inlet (242) and enters the unit (240) through four aeration tubes (248,250,252,254). Gas flow forces powder to be spun around in a vortex pattern within the resupply unit (240). While powder is not depicted in these images, the vortex flow behavior will occur regardless of the amount of powder held in reserve within the resupply unit (240) due to the arrays of holes on the aeration tubes (248,250,252,254). Centrifugal force causes powder to be forced through a filter (246) and out the exit port (244). Only particles of a desirable size can pass the filter (246), which adds an extra element of quality control to the powder management process.

Regardless of what kind of imaging devices and/or material delivery systems are used in the SFF devices discussed above, it is noted that when multiple imaging devices are used within a given SFF device, coordination between these imaging devices can be challenging. It is therefore useful to have feedback mechanisms that operate independently of any individual imaging device and provide feedback within a physical reference frame that is immediately applicable to the process of building an object within the SFF device. FIGS. 48-51 depict one embodiment of such a system. The modified build platform (262) has a removable build surface (260). Underneath the removable build surface (260) there is an array of sensor modules (264) which provide feedback to calibrate multiple imaging devices. Each sensor module (264) contains a shrouded sensor (266); the shroud may improve the precision of the feedback system.

Figure 52:
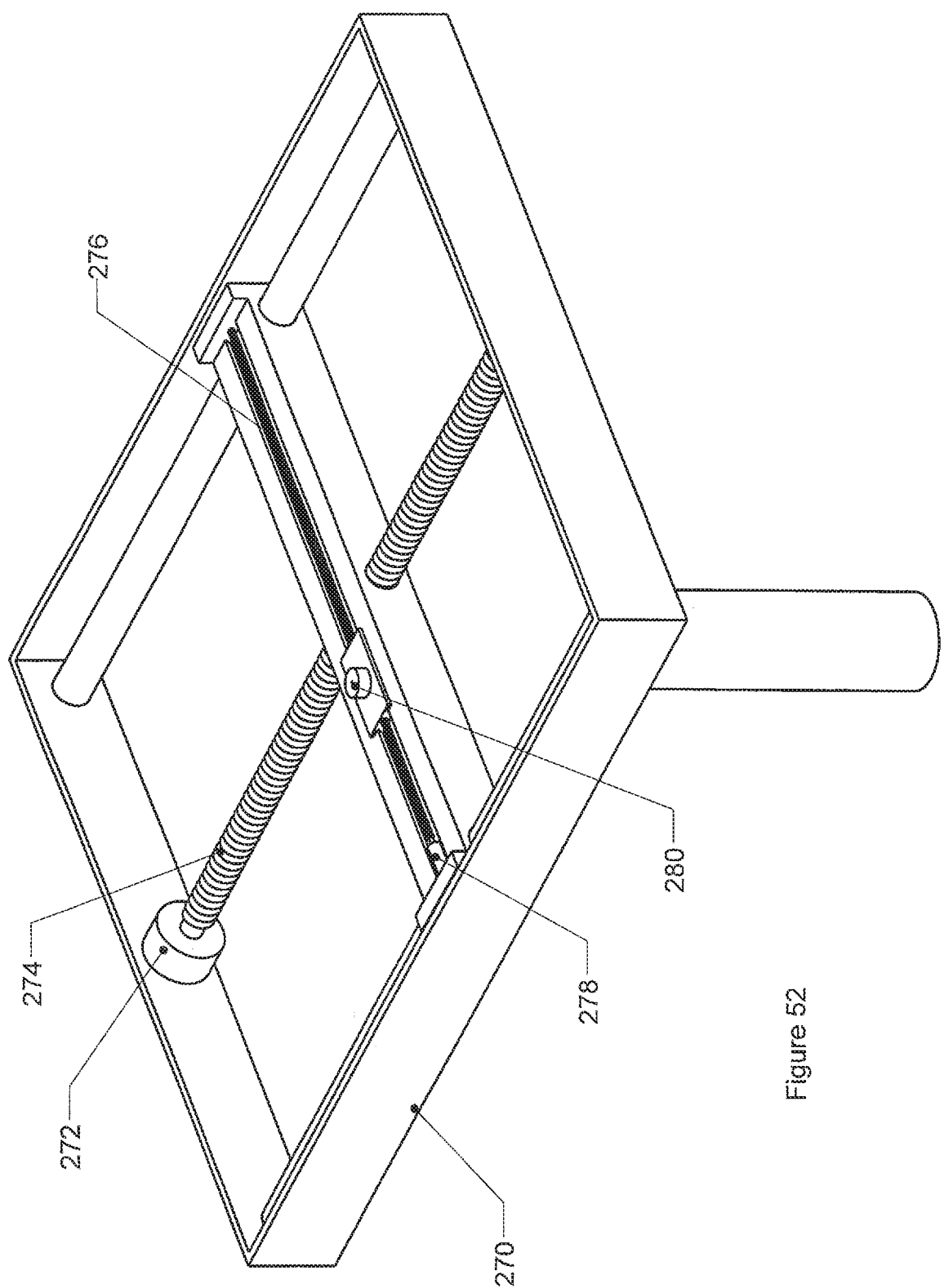
FIG. 52 is a perspective view of a second embodiment of the build platform in FIG. 48.

FIG. 52 depicts a second embodiment of a calibration feedback system. A sensor module (280) of a similar configuration to the previous sensor modules (264) is movable by a screw (276) controlled by an actuator (278) along a primary axis of motion. The entire primary axis assembly is movable by a secondary screw (274) controlled by a secondary actuator (272) along a secondary axis of motion. Through this system, the sensor module (280) may be moved to any point within the build area for a calibration process. Either of the modified build platforms (262,270) may have the build surface (260) removed for calibration, at which point the build platforms (262,270) may move into a position such that their sensor surfaces are in the same position as the initial position of the face of the build surface (260) that is used for building an object during a build process. Thus, sensor readings are an accurate reading of actual illumination patterns at an appropriate print position used during a build process.

Figure 53:
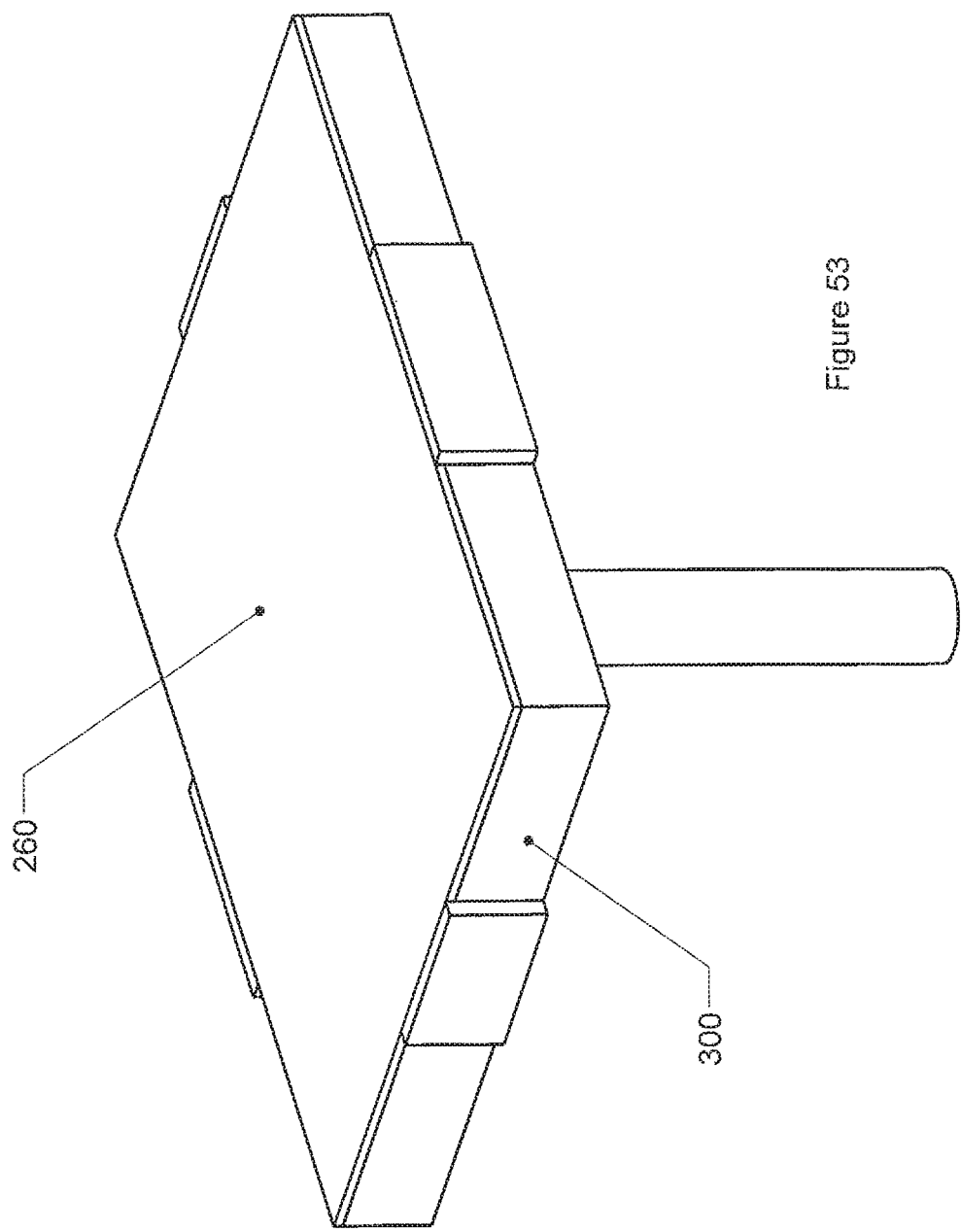
FIG. 53 is a perspective view of a third embodiment of the build platform in FIG. 48.
Figure 54:
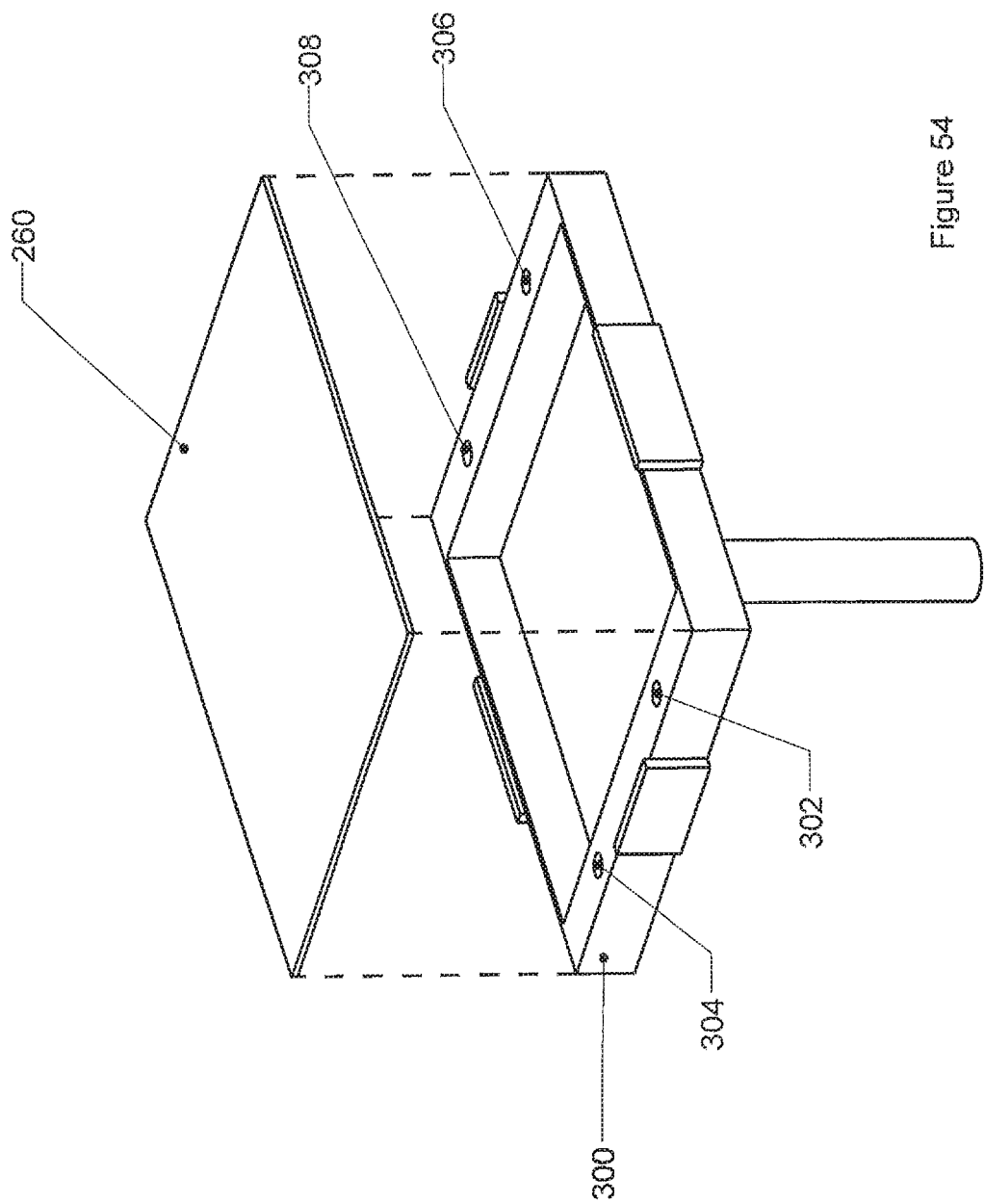
FIG. 54 is an exploded perspective view of the build platform in FIG. 53.
Figure 55:
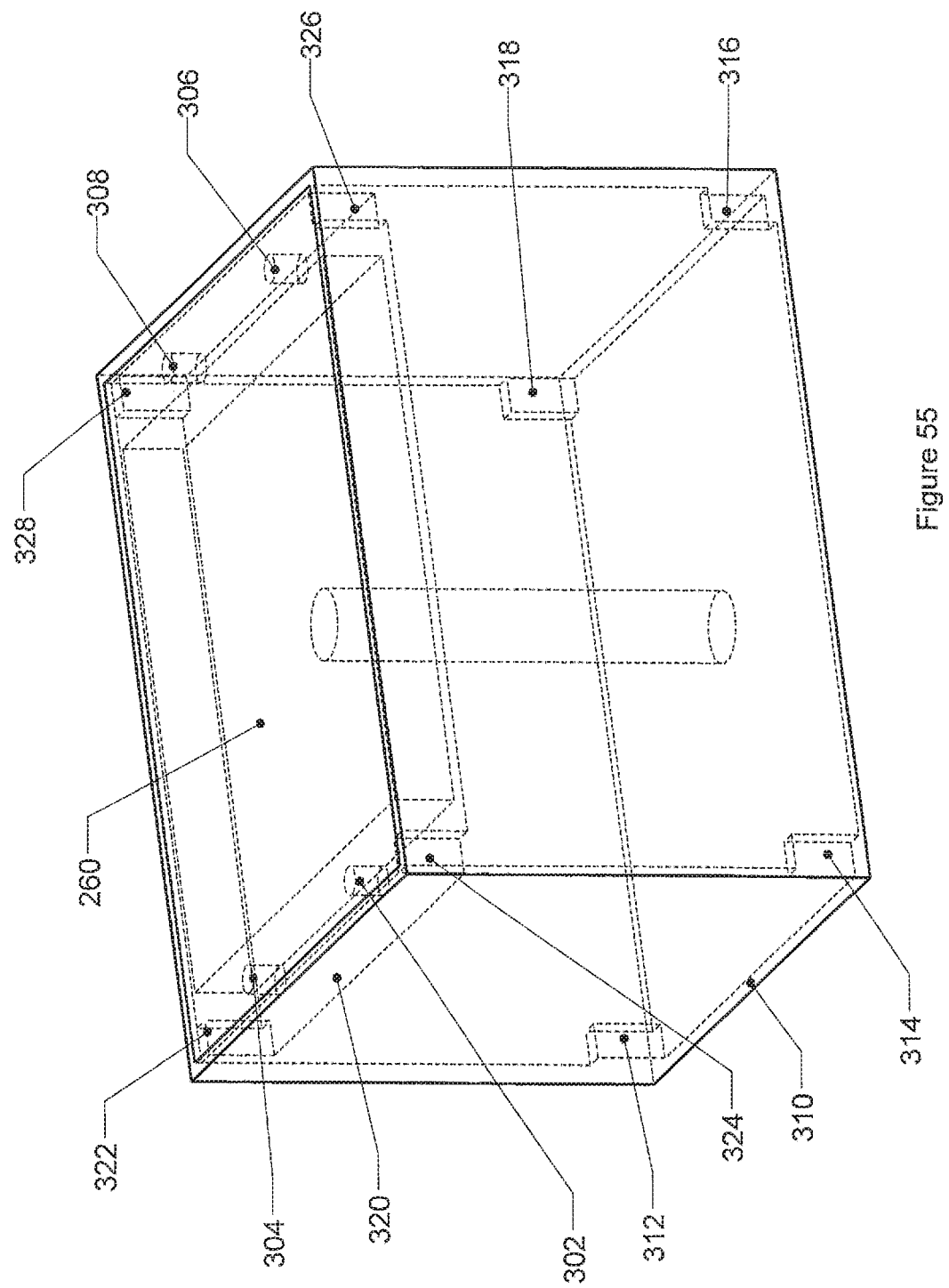
FIG. 55 is a perspective view of a fourth embodiment of the build platform in FIG. 48.
Figure 56:
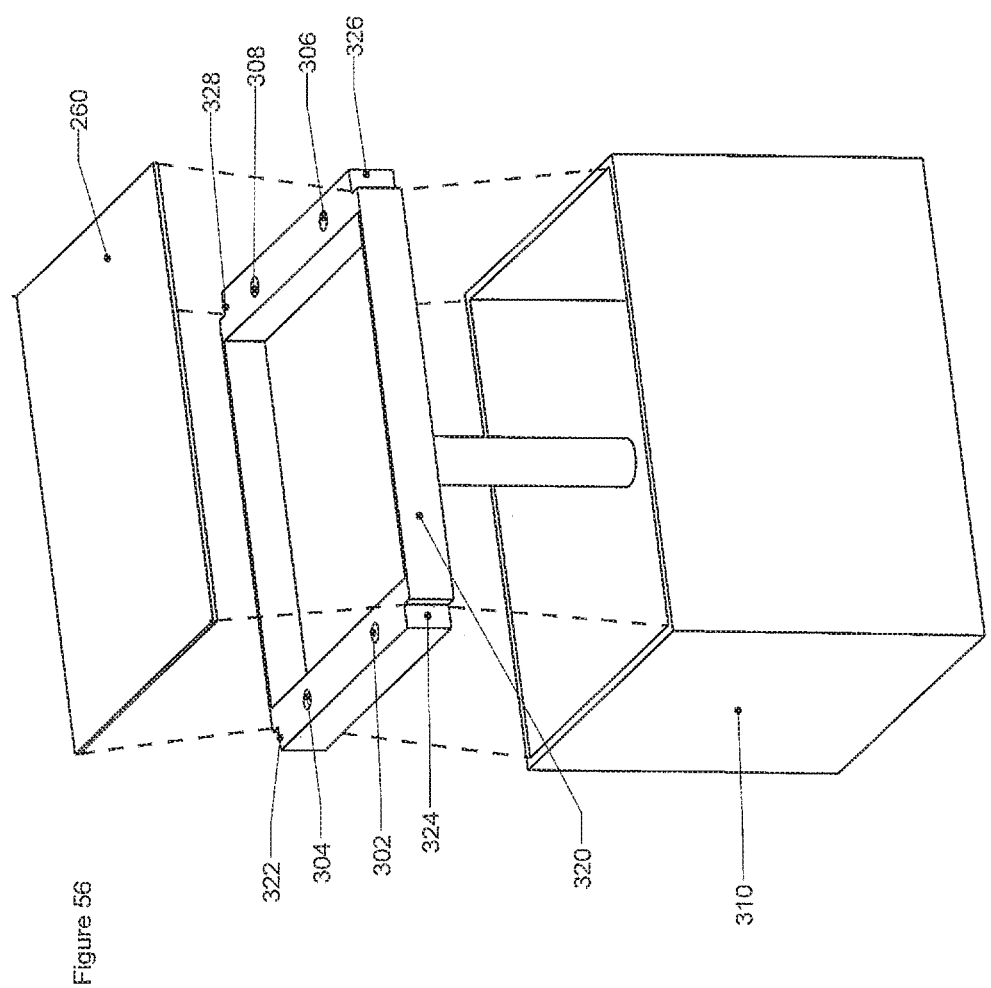
FIG. 56 is an exploded perspective view of the device in FIG. 55.
Figure 57:
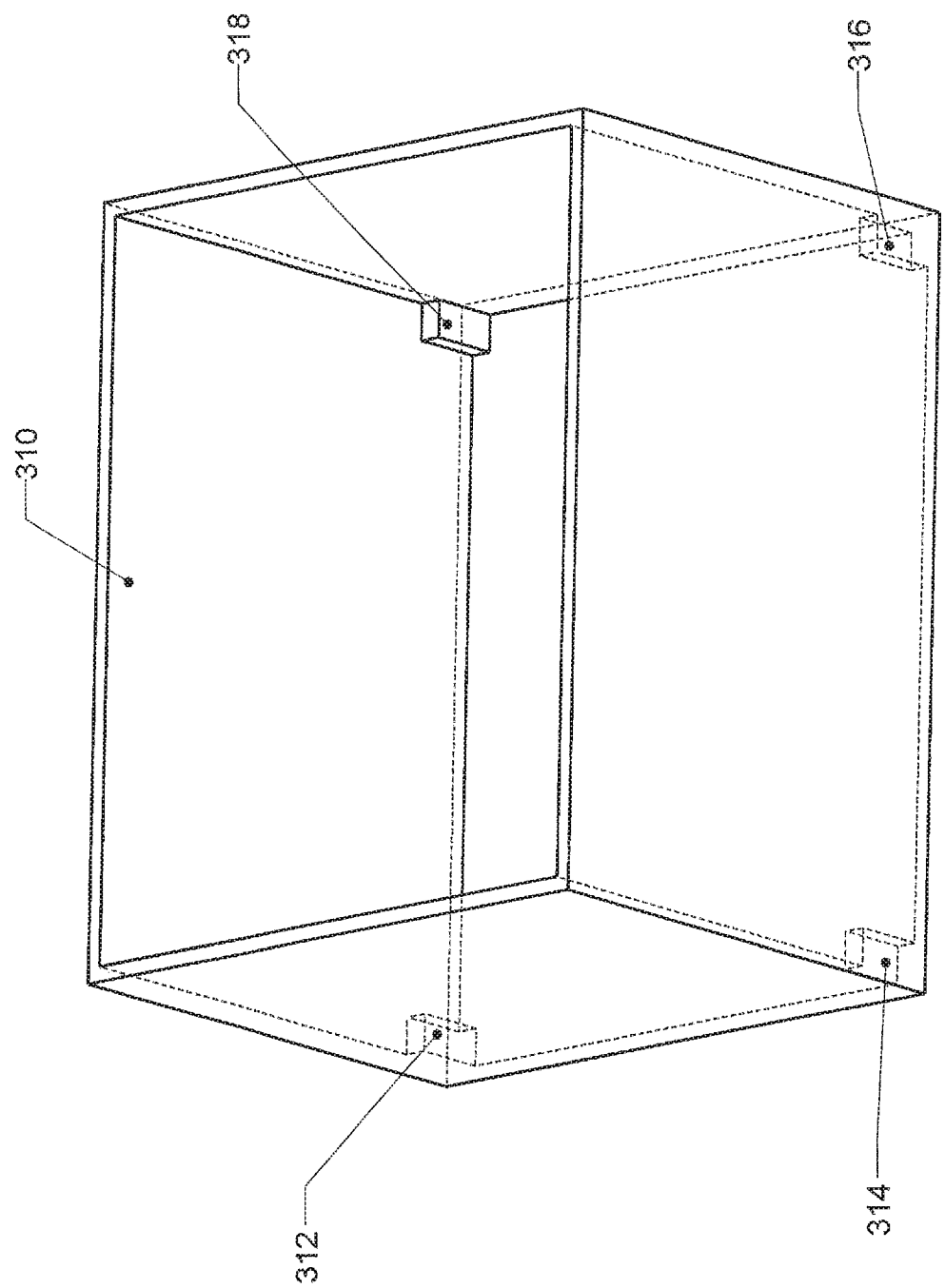
FIG. 57 is a perspective view of a material containment vessel of the device in FIG. 55.
Figure 58:
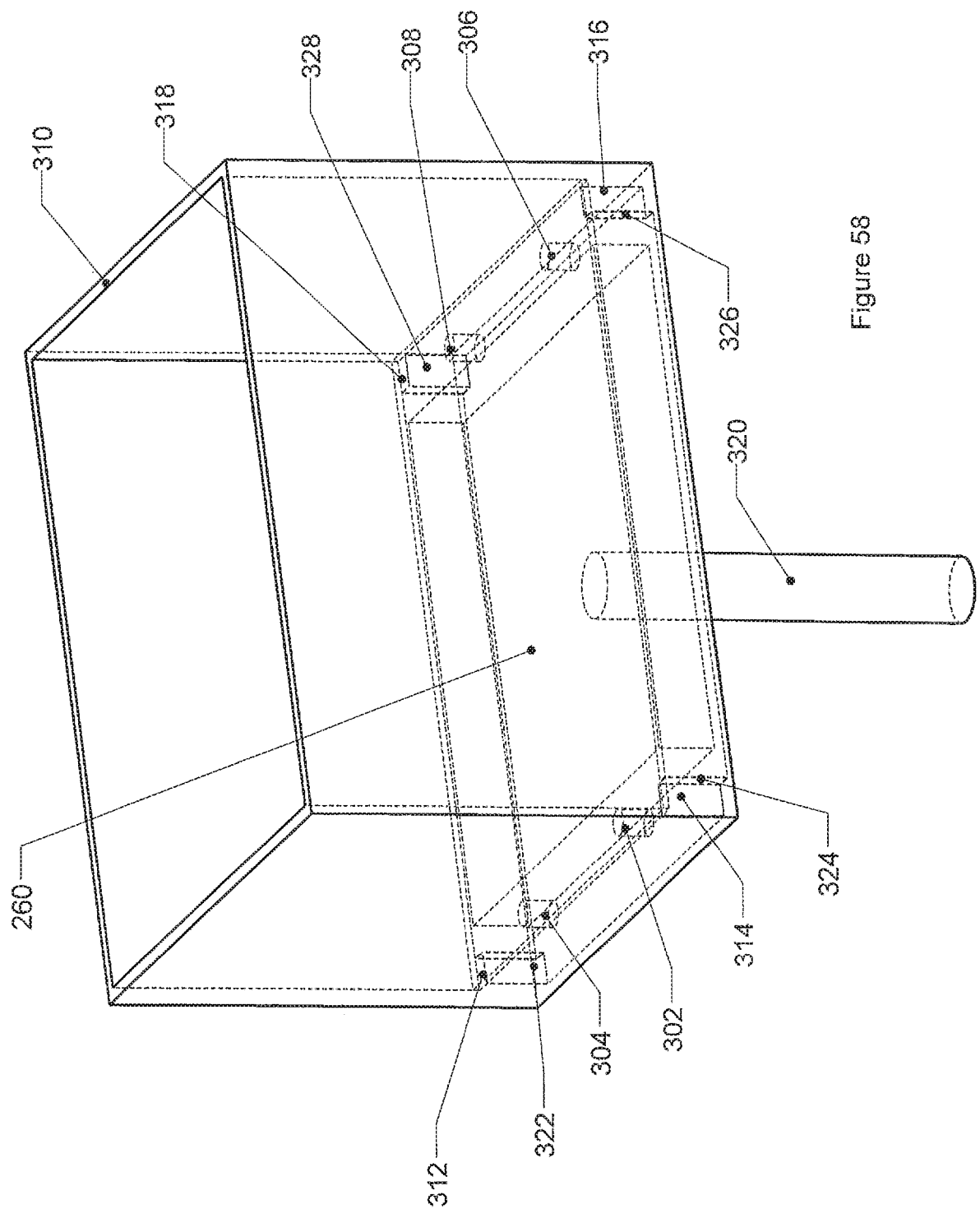
FIG. 58 is a perspective view of the device in FIG. 55 in a second position.
Figure 59:
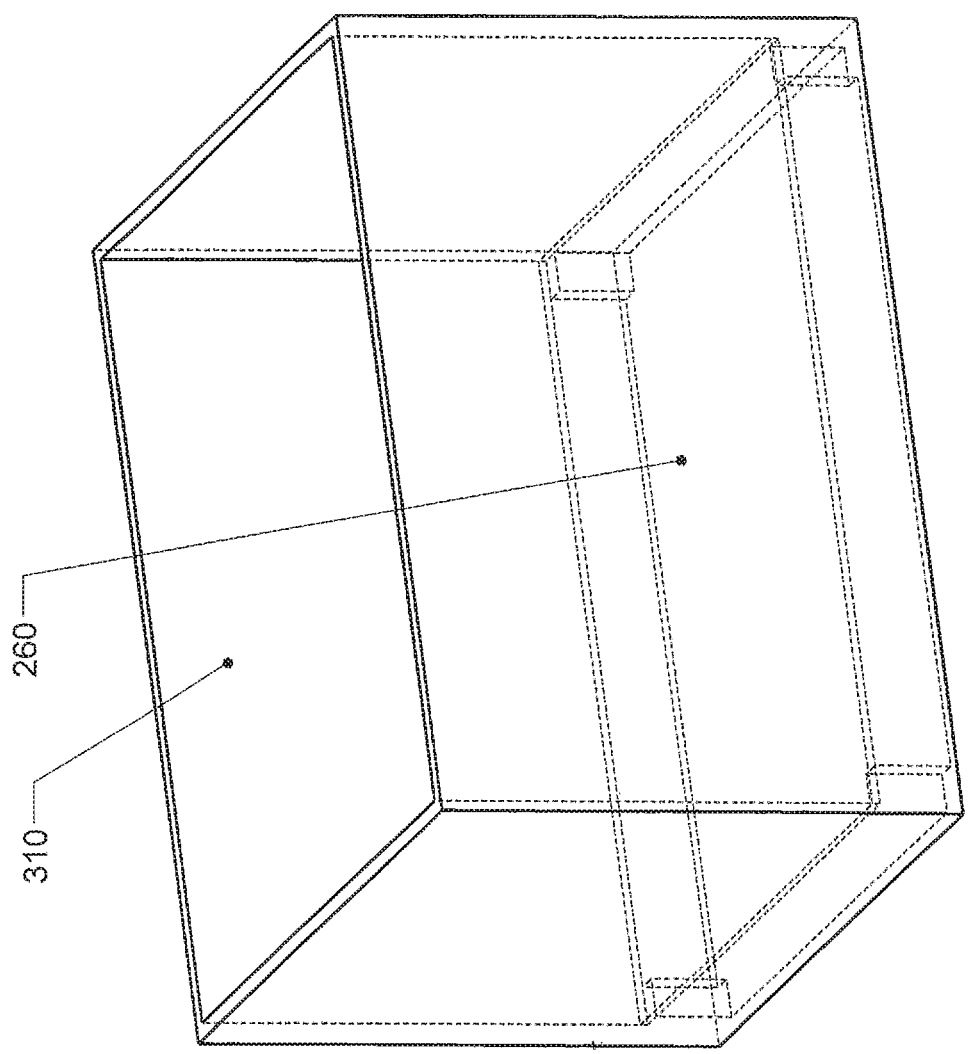
FIG. 59 is a perspective view of a material containment vessel and build surface of the device in FIG. 58.

As depicted previously, a removable build surface (260) can provide the advantage of allowing for a built in calibration system that assists in coordinating multiple imaging devices within an SFF device. While many SFF devices have removable build platforms, build trays, and other objects for containing a built part after the build process is completed, these all have proprietary, often complex designs. It may be advantageous to allow any substantially flat piece of rigid material to be a removable build surface (260), by decreasing the cost of replacement and simplifying the process of using such a surface. Accordingly, FIGS. 53 and 54 depict one embodiment of a build platform (300) with removable build surface (260). This removable build surface (260) may be held in place during a build process by attachment points (302,304,306,308) which may contain magnets, or may be ports capable of applying a vacuum to retain the removable build surface (260). Generally, the attachment points (302,304,306,308) may be any mechanism designed to apply a force to a substantially flat, substantially uniform removable build surface (260).

The advantage of any removable build platform is that in a commercial rapid prototyping setting, it allows post-processing to take place while another object is being built. A built object may be removed from the SFF device, cleaned, finished, and shipped to a customer, while another object is being built, which optimizes the throughput of the SFF device. Additionally, such removable components may assist in containing the built object and unused build material in order to regulate material use within a working environment. FIGS. 55-59 depict an alternate embodiment of a build platform (320) with removable build surface (260) which achieves this effect. This modified build platform (320) contains attachment points (302,304,306,308) as before, and also has indentations at its corners (322,324, 326,328). When the platform (320) is lowered to its bottom position, the indentations (322,324,326,328) move past protrusions (312,314,316,318) in a material containment vessel (310). The material containment vessel (310) thus engages the build surface (260) such that they can be moved together, while keeping the build object and any unused build material contained for later cleaning and other post-processing.

Support material is often used during SFF processes. Support material helps an object withstand forces from the application of new layers of material, and stabilizes certain part geometry such as overhanging features. Support material must be removed before an object is complete, which is often done in post-processing. A common technique for creating support material is to have large buttress-like support structures connected to an object at a plurality of small connection points to facilitate removal of the support material by breaking it at these connection points. These connection points must be sanded or otherwise finished to produce a smooth final object; any added finishing due to support material slows production time for parts produced by SFF, and it is therefore desirable that the effect of support material on surface finish be reduced.

Figure 60:
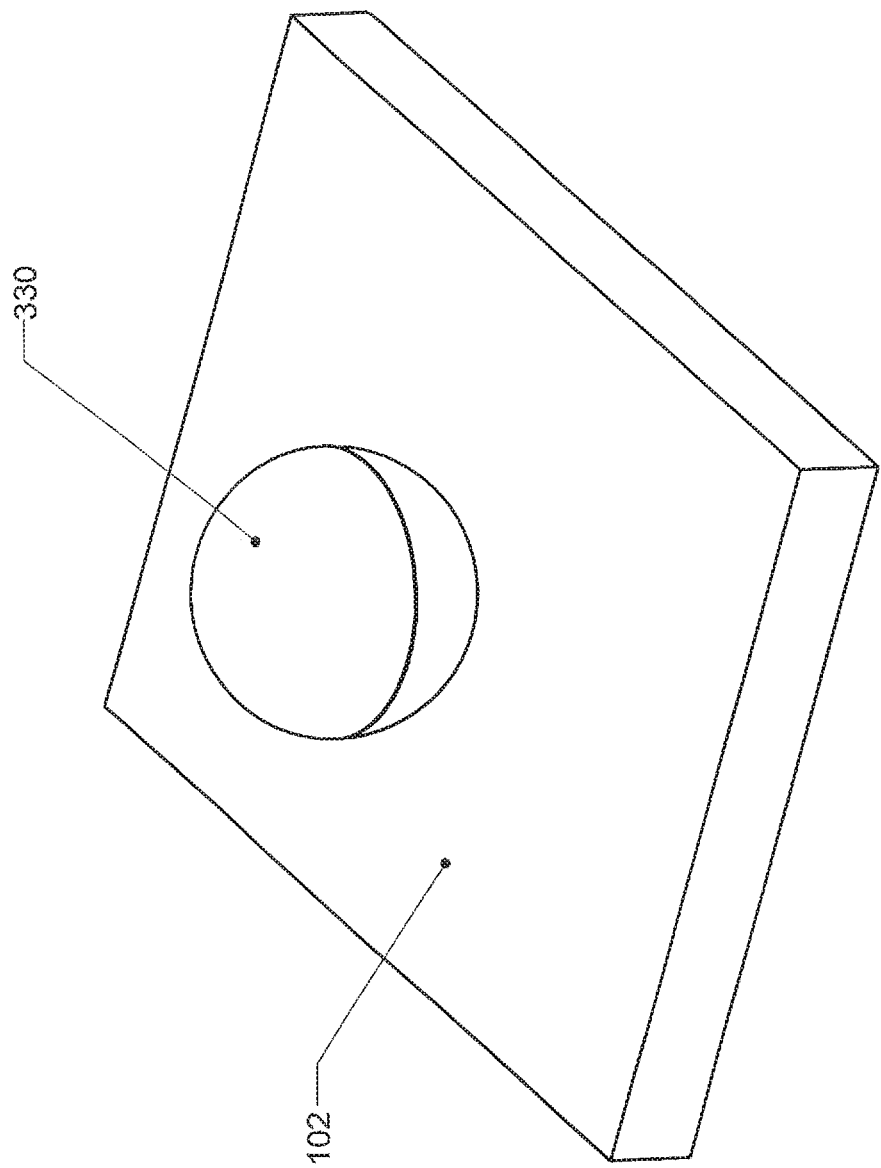
FIG. 60 is a perspective view of an object capable of being built by the presently disclosed subject matter.
Figure 61:
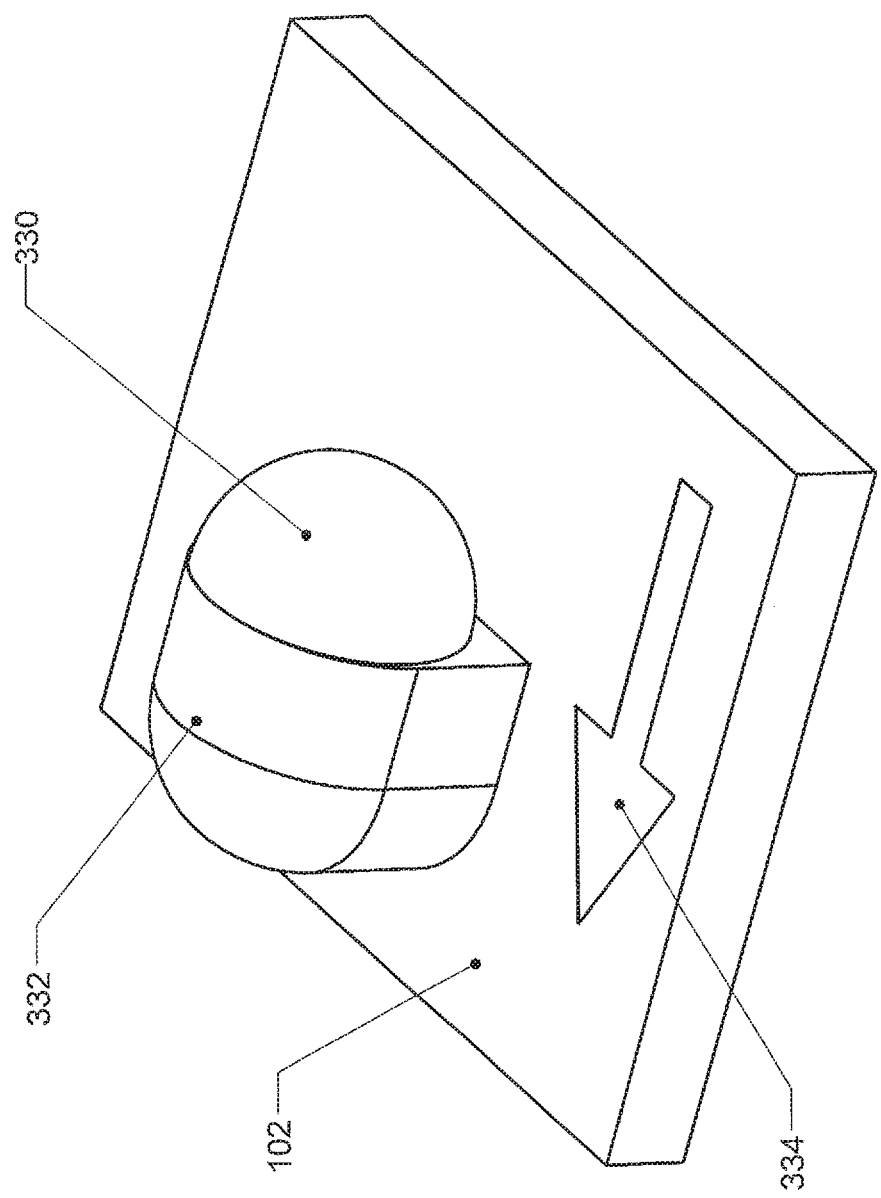
FIG. 61 is a perspective view of a possible support material arrangement for the object in FIG. 60.
Figure 62:
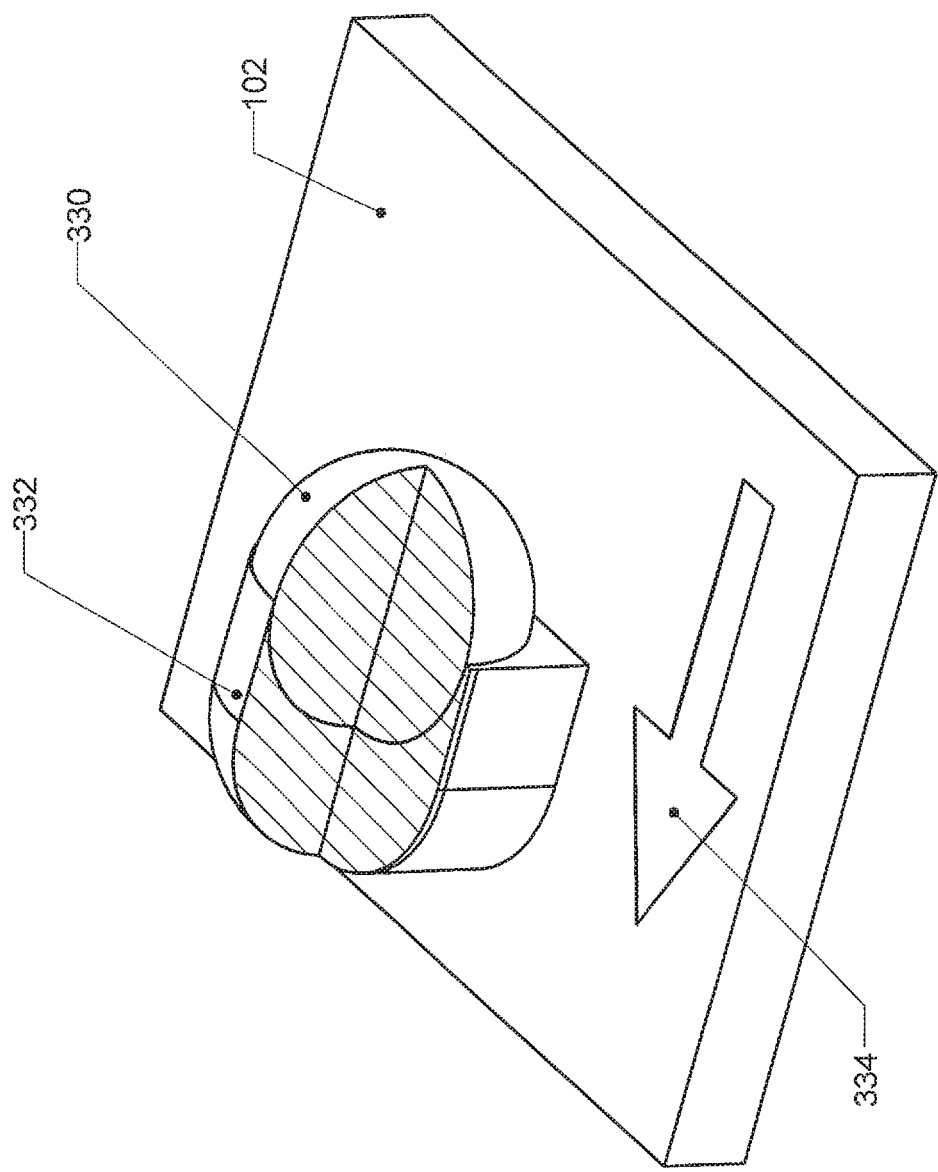
FIG. 62 is a section view of the support material arrangement in FIG. 61.

FIG. 60 depicts an object (330) to be built on a build surface (102). FIGS. 61 and 62 depict a possible support material arrangement for this object during the build process. Objects that are fabricated from a mixture of power and resin may have support material (332) that is shaped to take advantage of the semi-solid nature of this uncured material. The presence of powder in the uncured material gives it greater inherent resistance to the forces applied by the production of new layers of material. Support material (332) may be shaped such that it envelopes portions of an object (330) requiring stabilization without being in direct contact with the object (330). By leaving a thin layer of uncured material between the object (330) and the support material (332), shear forces applied in the direction shown (334) can be resisted, and the object stabilized, with minimal or no actual connection points between the support material (332) and the object. This will facilitate a higher overall production speed and higher quality surface finish for fabricated parts. This approach may generally be referred to as "encasement support," in contrast to the traditional "buttress support" methods used in many SFF devices.

Figure 63:
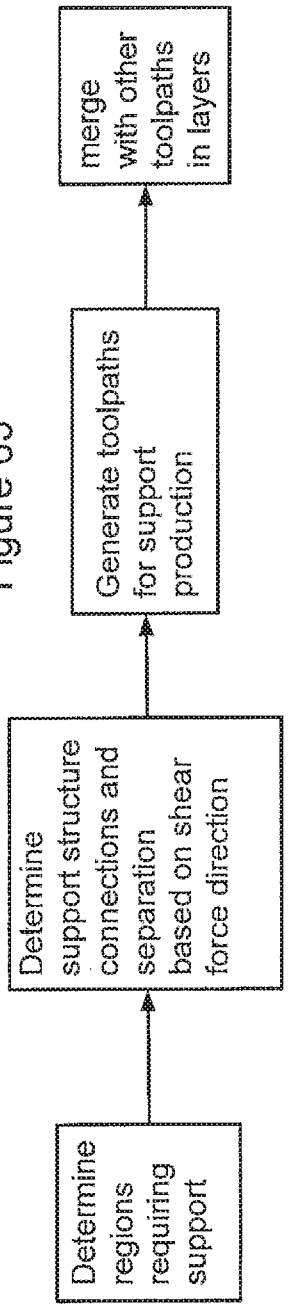
FIG. 63 is an algorithmic flow chart for the production of a support material arrangement for use in the construction of an object by SFF according to an embodiment of the presently disclosed subject matter.

The support technique described above may be depicted algorithmically as in FIG. 63. Rather than determining overhanging regions or other fragile regions requiring support, as in buttress support techniques, this process requires analyzing a model for surfaces that face in the direction of the shear force applied when a new layer of material is produced. Based on the fragility of a given region, connection points may or may not be used. Tool paths generated for the support structure will be merged with those for the build object such that they can be built concurrently within a given layer.

Figure 64:
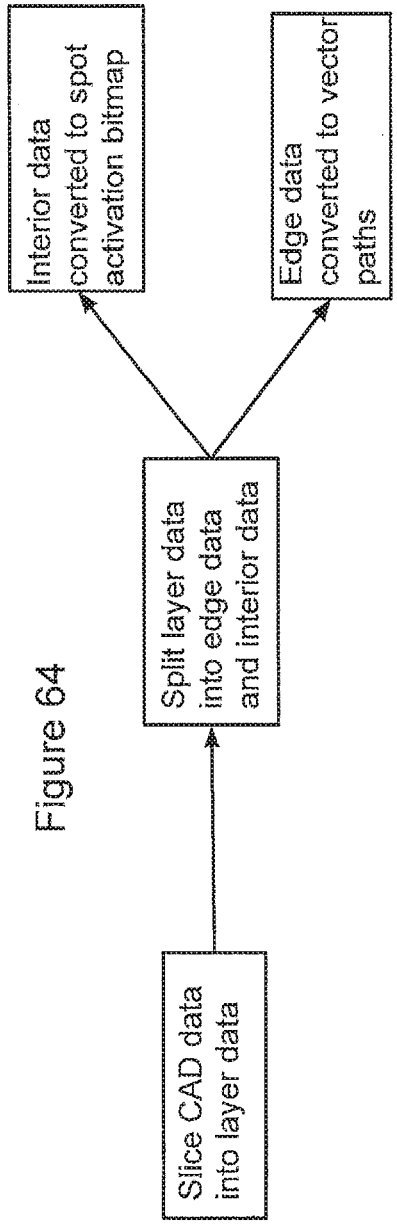
FIG. 64 is an algorithmic flow chart for imaging layers of objects produced by the presently disclosed subject matter.

As described previously, it may be advantageous to image border regions and interior regions separately. Border regions are here defined as the edge, or region representative of an edge, or region to be imaged which will serve as a boundary of an imaged region. Interior regions are here defined as regions to be imaged which are substantially confined within border regions. Interior regions generally do not require as high resolution as border regions. The precision of a built object as a whole is generally defined by the resolution of the border regions of its layers. As shown in FIG. 64, the standard process of slicing CAD data into layers may be further extended by differentiating between interior data and border data. Border data may substantially be stored as vector data, where the precise curvilinear nature of the border region may be preserved. Interior data may be substantially stored in a bitmap format, which does not preserve curvature but does allow for rapid data processing for an imaging device. The imaging of interior data may be undertaken by a variety of devices, such as those described above. Border data may be imaged by a collimated radiation beam source wherein radiation is directed along the border region in such a manner to preserve the precise curvilinear structure of the border region. Standard SFF file types often reduce the representation of an object to a collection of polygons; during this process, curvature information is reduced to a representation by many small segments. The user is left with the choice to either create a very large file to preserve detail, or save on file space and subsequent processing time by a SFF device by sacrificing precision. If other file types that preserve curvature can be interpreted to create border and interior data, both precision and file size may be optimized. The algorithm depicted in FIG. 64 is intended for any file type, such that superior precision may be maintained in the digital representation used within the SFF device to produce the final object.

Figure 65:
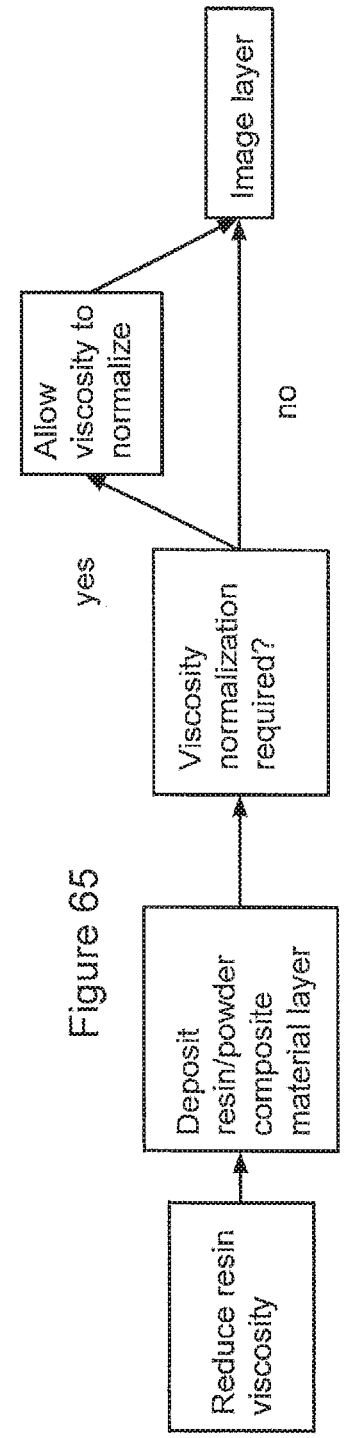
FIG. 65 is an algorithmic flow chart for improving print speed in the presently disclosed subject matter.

FIG. 65 represents a process by which layer production may be expedited, which applies to both inverted and standard SFF devices as described above. The process of layer production is limited by the viscosity of the resin being used; this is especially true with composite resin mixtures. Viscosity may be reduced by the introduction of solvents or other chemical agents, or by increasing the temperature of the resin material. In some cases, such as in the addition of chemical agents, it may be desirable to allow said agents to evaporate after a layer has been produced in order to normalize the fluid viscosity and stabilize the material layer. In some other instances, such as when the entire build chamber is at an elevated temperature, viscosity will not be normalized during the build, and in fact temperature will be maintained at an elevated level until the completion of a build process. This method generally improves the speed of a build process in multiple embodiments of the presently disclosed subject matter.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A fabrication device comprising:
a build platform for production of a 3-dimensional solid component;
a powder transfer system configured to deliver a layer of a powder material to the build platform;
a resin supply system configured to infuse a photocurable resin into a work area of the layer of the powder material; and
an imaging system configured to selectively irradiate the photocurable resin in the work area to at least partially solidify a layer of the 3-dimensional solid component,
wherein the resin supply system is configured to move across the build platform and infuse the photocurable resin to the powder material via a continuous flow such that the photocurable resin is in contact with both of the resin supply system and the powder material,
wherein the powder transfer system comprises a powder leveling blade configured to move across the build platform to produce the layer of the powder material, wherein:
the powder leveling blade is in communication with the resin supply system and configured to deliver the photocurable resin via an edge region of the powder leveling blade;
the powder transfer system is configured to deposit a quantity of the powder material onto an end region of the build platform; and
the powder leveling blade is configured to move once from the end region and across the build platform such that:
the edge region extends beneath a surface region of the quantity of the powder material; and
the edge region spreads the powder material to form the layer of the powder material and simultaneously delivers the photocurable resin into the work area of the layer of the powder material via the spreading.

2. The fabrication device of claim 1, wherein the powder transfer system comprises:
a powder hopper; and
a powder dispenser in communication with the powder hopper and configured to deliver the powder material from the powder hopper to the build platform.

3. The fabrication device of claim 2, wherein the powder transfer system is configured to control a thickness of the powder material on the build platform.

4. The fabrication device of claim 2, wherein the powder dispenser comprises at least one roller that is movable to transfer the powder material from the powder hopper to the build platform.

5. The fabrication device of claim 1, wherein the resin supply system includes one or more resin infusion channels in the powder leveling blade, wherein the one or more resin infusion channels are configured to infuse the photocurable resin into the powder material.

6. A method of producing a 3-dimensional solid component, the method comprising:
delivering a layer of a powder material to a build platform;
infusing a work area of the layer of the powder material with a photocurable resin; and
selectively irradiating the photocurable resin in the work area with an imaging system to at least partially solidify a layer of the 3-dimensional solid component,
wherein said infusing includes operating a resin supply system configured to move across the build platform and infuse the photocurable resin to the powder material via a continuous flow such that the photocurable resin is in contact with both of the resin supply system and the powder material,
wherein said delivering includes operating a powder transfer system comprising a powder leveling blade configured to move across the build platform to produce the layer of the powder material, wherein:
the powder leveling blade is in communication with the resin supply system and configured to deliver the photocurable resin via an edge region of the powder leveling blade;
the powder transfer system is configured to deposit a quantity of the powder material onto an end region of the build platform; and
the powder leveling blade is configured to move once from the end region and across the build platform such that:
the edge region extends beneath a surface region of the quantity of the powder material; and
the edge region spreads the powder material to form the layer of the powder material and simultaneously delivers the photocurable resin into the work area of the layer of the powder material via the spreading.

7. The method of claim 6, wherein said delivering comprises:
- dispensing a quantity of the powder material from a powder hopper; and
- depositing the quantity of the powder material on the build platform.

8. The method of claim 7, wherein said delivering comprises controlling a thickness of the powder material on the build platform.

9. The method of claim 7, wherein said delivering comprises rotating one or more rollers in communication with the powder hopper to transfer the powder material from the powder hopper to the build platform.

10. The method of claim 6, wherein said infusing comprises:
- delivering the photocurable resin to one or more resin infusion channels in the powder leveling blade; and
- infusing the photocurable resin into the powder material as the powder leveling blade moves across the build platform.

11. The fabrication device of claim 1, wherein the area of the work area is less than an entire area of the layer of the powder material.

12. The fabrication device of claim 1, wherein the area of the work area is substantially equal to an entire area of the layer of the powder material.

13. The fabrication device of claim 1, wherein the imaging system is configured to irradiate the photocurable resin in accordance with a cross section in a digital model of the 3-dimensional solid component, such that the layer of the 3-dimensional solid component is shaped based upon the cross section.

* * * * *